US012397485B2

(12) United States Patent
Tanaka et al.

(10) Patent No.: US 12,397,485 B2
(45) Date of Patent: Aug. 26, 2025

(54) CAMERA MODULE AND PHOTOSENSITIVE ASSEMBLY THEREOF

(71) Applicant: Ningbo Sunny Opotech Co., Ltd., Zhejiang (CN)

(72) Inventors: Takehiko Tanaka, Nara (JP); Zhen Huang, Zhejiang (CN); Bojie Zhao, Zhejiang (CN); Zhewen Mei, Zhejiang (CN)

(73) Assignee: NINGBO SUNNY OPOTECH CO., LTD, Zhejiang (CN)

( * ) Notice: Subject to any disclaimer, the term of this patent is extended or adjusted under 35 U.S.C. 154(b) by 420 days.

(21) Appl. No.: 17/877,391

(22) Filed: Jul. 29, 2022

(65) Prior Publication Data

US 2022/0362978 A1 Nov. 17, 2022

Related U.S. Application Data

(62) Division of application No. 16/645,537, filed as application No. PCT/CN2018/104915 on Sep. 11, 2018, now Pat. No. 11,433,584.

(30) Foreign Application Priority Data

Sep. 11, 2017 (CN) .......................... 201710810764.0
Sep. 11, 2017 (CN) .......................... 201721159970.1

(51) Int. Cl.
*H05K 1/18* (2006.01)
*B29C 45/14* (2006.01)
(Continued)

(52) U.S. Cl.
CPC ........ *B29C 45/26* (2013.01); *B29C 45/14655* (2013.01); *H01L 21/56* (2013.01);
(Continued)

(58) Field of Classification Search
CPC ................... H05K 1/0274; H05K 1/18; H05K 1/181–187; H05K 3/284; H05K 3/4691;
(Continued)

(56) References Cited

U.S. PATENT DOCUMENTS 7,166,907 B2 * 1/2007 Onishi ................... H04N 23/55
257/434
9,241,097 B1 * 1/2016 Tam .................. H01L 27/14618
(Continued)

FOREIGN PATENT DOCUMENTS

CN 205961279 2/2007
CN 103207502 7/2013
(Continued)

OTHER PUBLICATIONS

International Search Report issued Nov. 29, 2018 in International (PCT) Application No. PCT/CN2018/104915.

*Primary Examiner* — Tuan T Dinh
(74) *Attorney, Agent, or Firm* — Wenderoth, Lind & Ponack, L.L.P.

(57) ABSTRACT

A photosensitive assembly includes a circuit board and a photosensitive chip, as well as a molded base. The molded base is integrally formed on the circuit board and the photosensitive chip, and forms a light window for providing a light path for the photosensitive chip. For a portion of the molded base corresponding to a first end side of the molded base adjacent to a flexible region, a distance between outer and inner edges thereof is a; for a portion of the molded base corresponding to an opposite second end side of the molded base away from the flexible region, a distance between outer and inner edges thereof is c, wherein 0.2 mm≤a≤1 mm, and 0.2 mm≤c≤1.5a. The dimensions a and c enable a corresponding forming groove in a molding process to be filled with molding material.

19 Claims, 35 Drawing Sheets

(51) Int. Cl.
*B29C 45/26* (2006.01)
*H01L 21/56* (2006.01)
*H01R 43/24* (2006.01)
*H04N 23/55* (2023.01)
*H05K 1/02* (2006.01)
*H05K 3/28* (2006.01)
*H05K 3/46* (2006.01)
*H10F 39/12* (2025.01)
*H10H 20/80* (2025.01)

(52) U.S. Cl.
CPC ........... *H01L 21/561* (2013.01); *H01R 43/24* (2013.01); *H04N 23/55* (2023.01); *H05K 1/0274* (2013.01); *H05K 1/181* (2013.01); *H05K 3/284* (2013.01); *H05K 3/4691* (2013.01); *H10F 39/12* (2025.01); *H10H 20/80* (2025.01); *Y10T 428/31* (2015.01)

(58) Field of Classification Search
CPC ............. H04N 23/54–57; H04N 5/225; H04N 5/2252; H04N 5/2257–2258; H04N 5/232; H01L 21/56; H01L 21/561
USPC ................ 361/749–750, 782–784, 795, 803; 174/254, 260–263; 348/335, 340, 357, 348/373–376
See application file for complete search history.

(56) References Cited

U.S. PATENT DOCUMENTS

| | | | |
|---|---|---|---|
| 2004/0189862 A1 | 9/2004 | Gustavsson et al. | |
| 2006/0219885 A1 | 10/2006 | Kinoshita | |
| 2008/0252771 A1* | 10/2008 | Wu | H04N 23/55 348/E5.025 |
| 2015/0264290 A1* | 9/2015 | Happoya | H04N 23/54 29/832 |
| 2016/0150133 A1* | 5/2016 | Suzuki | H04N 23/51 348/376 |
| 2016/0191767 A1* | 6/2016 | Otani | H04N 23/54 29/832 |
| 2017/0244877 A1* | 8/2017 | Wang | G02B 3/0075 |

FOREIGN PATENT DOCUMENTS

| | | |
|---|---|---|
| CN | 105681637 | 6/2016 |
| CN | 105681640 | 6/2016 |
| CN | 105704354 | 6/2016 |
| CN | 105847645 | 8/2016 |
| CN | 206302476 | 7/2017 |
| CN | 207744032 | 8/2018 |

* cited by examiner

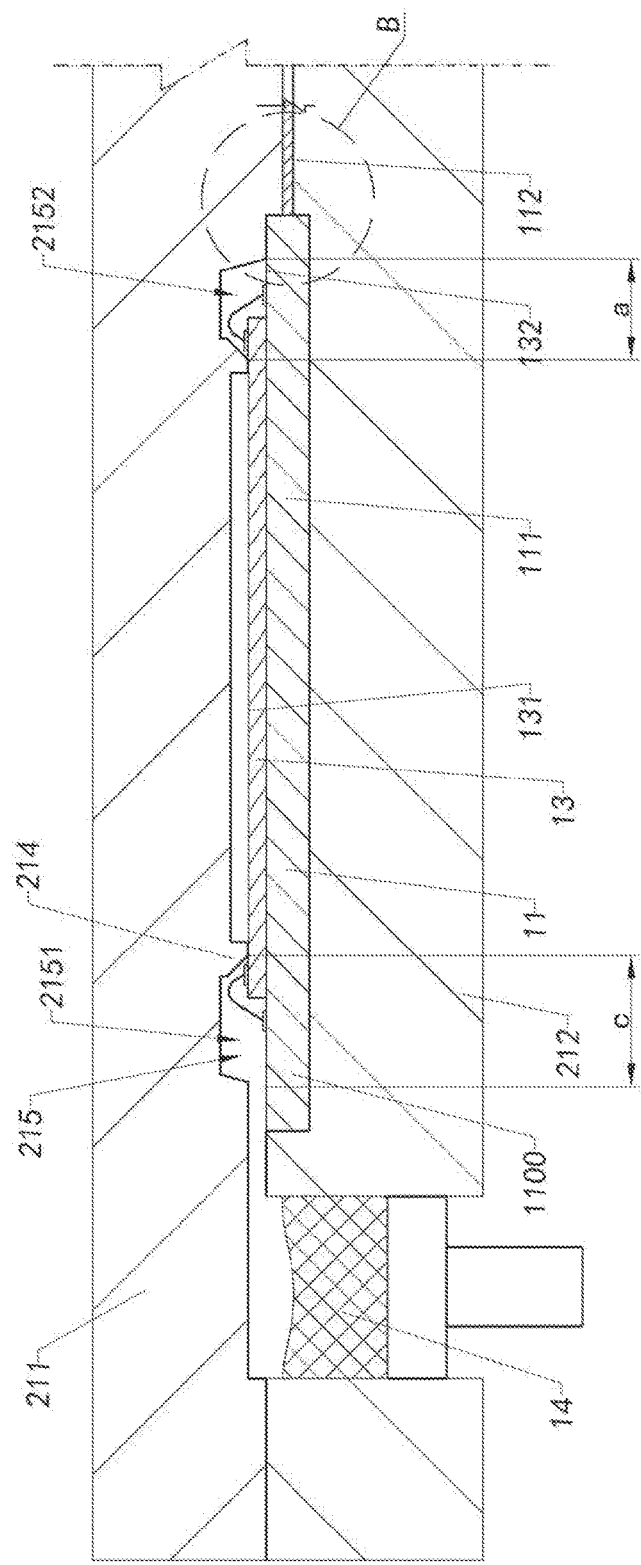
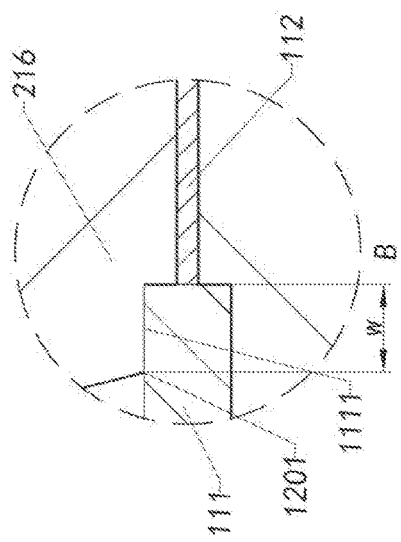
Figure 7A
Figure 7B

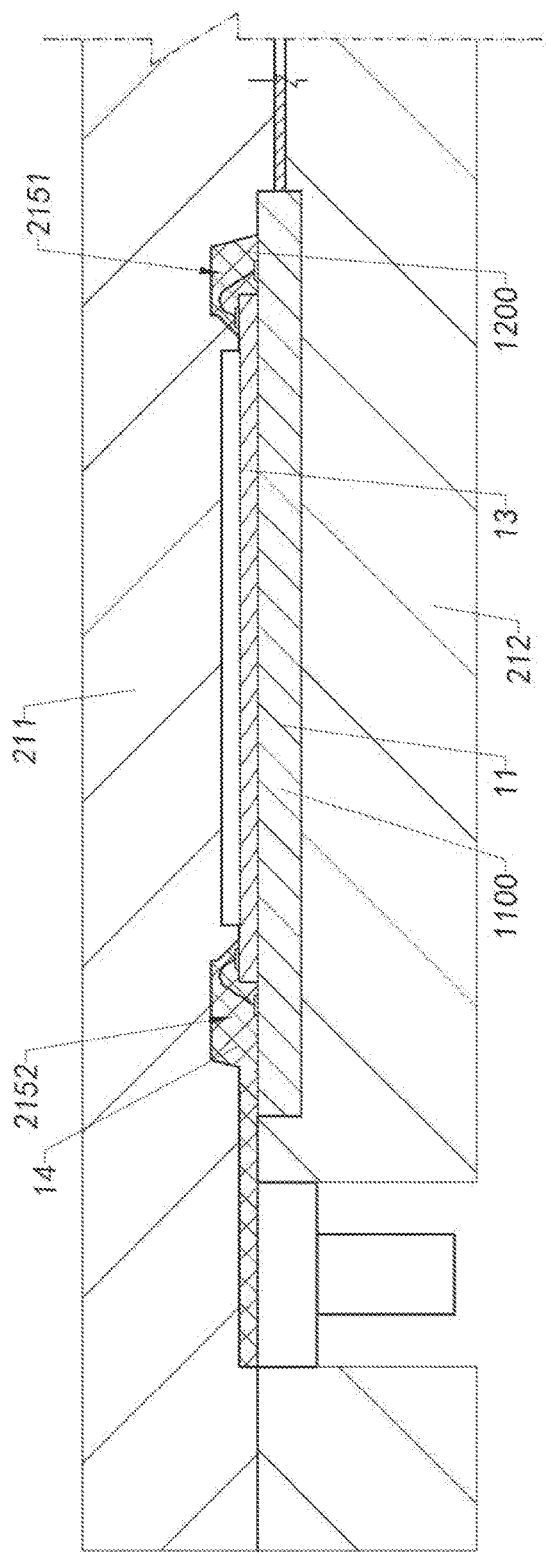
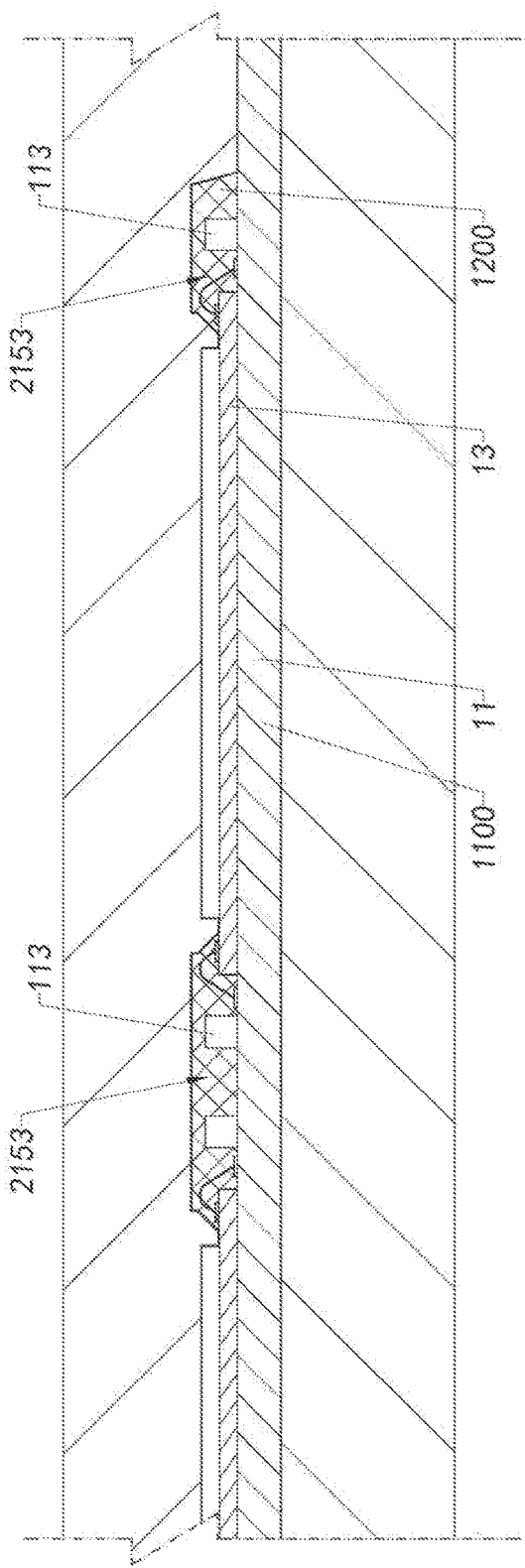

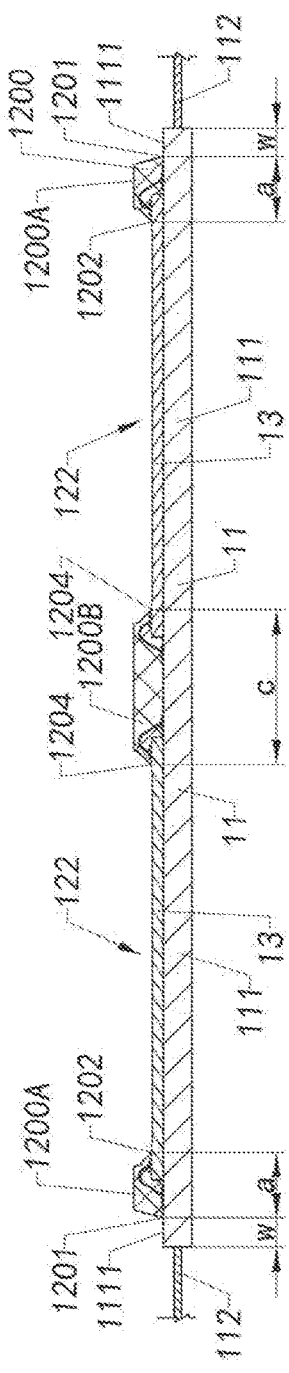
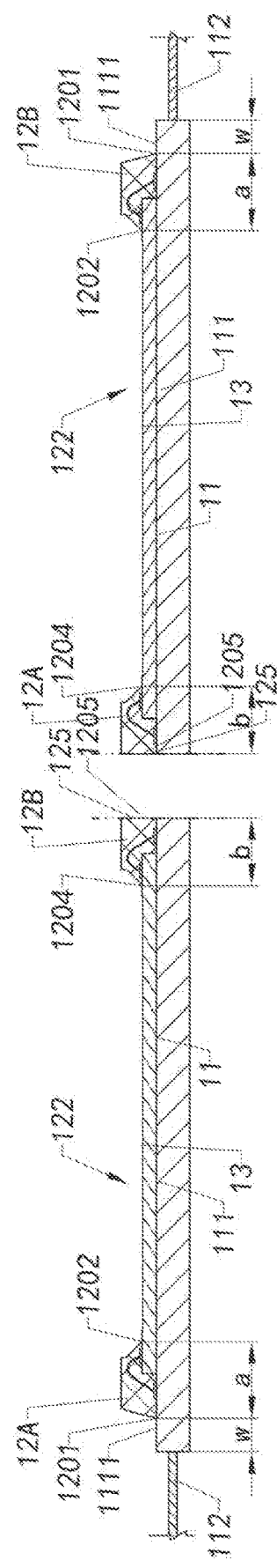

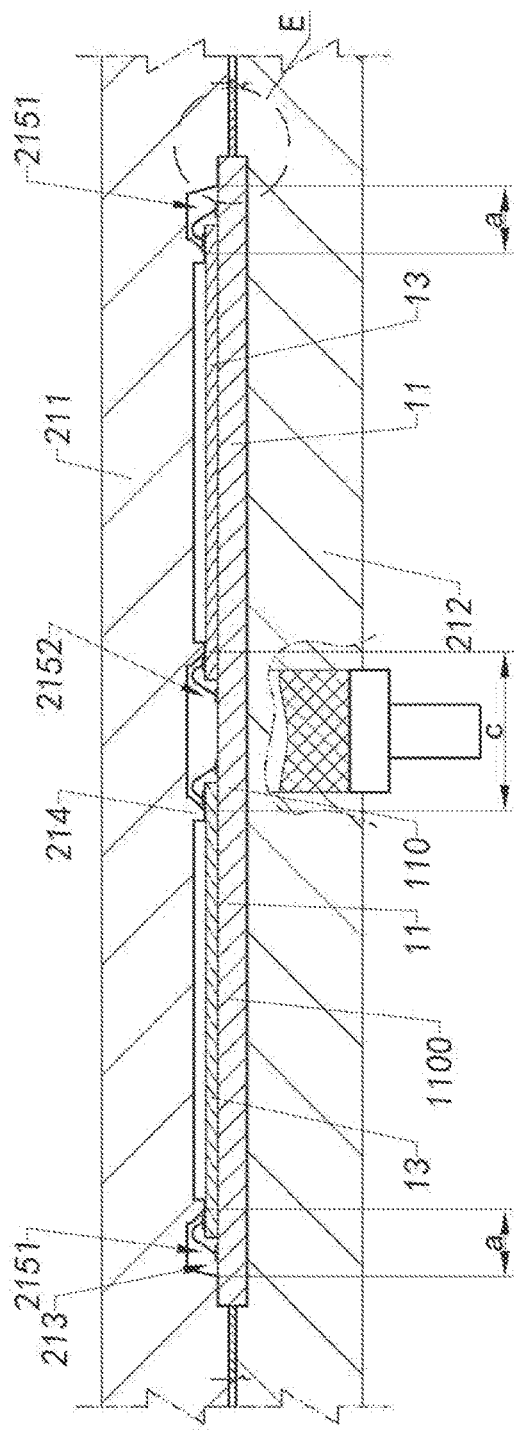
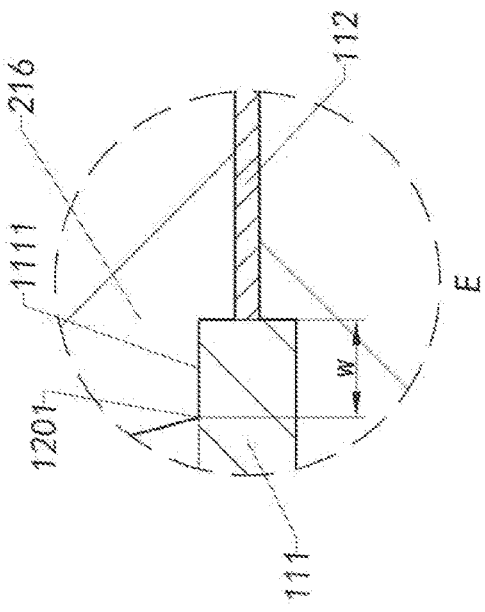
Figure 21A
Figure 21B

CAMERA MODULE AND PHOTOSENSITIVE ASSEMBLY THEREOF

FIELD OF THE INVENTION

The present application relates to field of camera modules, and further relates to a photosensitive assembly manufactured by a molding process and a manufacturing method thereof, and a camera module and an electronic apparatus having the photosensitive assembly, and a molding die thereof.

BACKGROUND OF THE INVENTION

The molding and packaging technology of a camera module is a newly developed packaging technology based on traditional COB packaging. As shown in FIGS. 1A to 1C, a circuit board is packaged by using an existing integrated packaging technology. In this structure, a packaging portion 1 is packaged to a circuit board 2 and a photosensitive chip 3 by an integrated packaging way to form an integrated packaging assembly, and the packaging portion 1 covers a plurality of electronic components 201 of the circuit board 2 and a series of leads 202 electrically connecting the photosensitive chip 3 and the circuit board 2, so as to enable the length, width, and thickness dimensions of the camera module to be reduced, and assembly tolerances to be reduced. A lens or a lens assembly above the integrated packaging assembly can be installed flat, and the problem that the dust attached to the electronic components affects imaging quality of the camera module can be solved.

More specifically, as shown in FIGS. 1A and 1B, in order to improve production efficiency, the integrated packaging assembly is generally produced by a jointed panel production way, that is, a plurality of the integrated packaging assemblies are produced at one time. More specifically, FIGS. 1A and 1B show a way of producing the integrated packaging assembly by using a molding die to perform jointed panel. Wherein, the molding die includes an upper die 101 and a lower die 102, wherein one of the circuit board jointed panels is placed in the lower die 102 of the molding die, the circuit board jointed panel includes a plurality of rows of circuit boards, each row of the circuit boards includes a plurality of circuit boards 2, and each of the circuit board 2 is operatively connected to the photosensitive chip 3. The upper die 101 and the lower die 102 are clamped to form a molding cavity, so that the upper die 101 is pressed against the circuit board jointed panel, corresponding to two end sides of the photosensitive chip 3 on each row of the circuit boards, two flow passages 103 and 104 are formed in the upper die, and the upper die 101 has a plurality of bumps 105, an intermediate flow passage 106 is formed between two adjacent bumps 105, so that the plurality of intermediate flow passages 106 extend between the two flow passages 103 and 104. In the molding process, fluid-like packaging material 4 flows forward along with the two flow passages 103 and 104, and fills into the intermediate flow passage 106 between two adjacent bumps 105, so that the region between two adjacent photosensitive chips 3 is also filled with the packaging material 4, thereby after the packaging material 4 is cured, the packaging portion 1 can be formed on the corresponding respective circuit boards 2 and respective photosensitive chips 3, a light window located in the middle of the packaging portion 1 is formed at a position corresponding to respective bumps 105, and these packaging portions 1 are integrally molded to form a one-piece structure, as shown in FIG. 1C.

Referring to FIG. 1F, thermosetting packaging material 4 has a curing time T in the molding process, as time passes, its viscosity decreases to the lowest point, and then gradually rises to the highest point to be completely cured. Ideally, when the packaging material 4 has a low viscosity, the packaging material 4 is to fill the flow passages 103, 104, and 106, while the packaging material 4 still flows forward when the viscosity is large, the friction of the lead 202 between the circuit board 2 and the photosensitive chip 3 is relatively large, which may easily cause deformation and damage of the lead 202.

In the above-mentioned molding process, the packaging material 4 is a thermosetting material, and after melting, enters the two flow passages 103 and 104, and is cured under the action of heating conditions. However, in actual production, it has been found that during the molding process, when the packaging material 4 flows forward along with the two flow passages 103 and 104, if the widths of the two flow passages 103 and 104 are not the same, the ratio of the width thereof is not within a reasonable range, it will cause the packaging material 4 to move inconsistently in the forward flow process.

More specifically, because the packaging material 4 is a fluid having a predetermined viscosity, the dimensions of the two flow passages 103 and 104 are relatively small and assuming that the flow passage 103 is a narrow flow passage, the flow rate in the flow passage 103 is relatively small, and the friction generated by the inner wall of the flow passage 103 on the fluid-like packaging material 4 in the flow passage 103 has a relatively large effect on flow velocity of the fluid-like packaging material 4, so the flow velocity of the packaging material 4 in the flow passage 103 is relatively slow. The flow passage 104 is a relatively wide flow passage, the flow rate therein is relatively large, and the friction generated by the inner wall of the flow passage 104 on the fluid-like packaging material 4 in the flow passage 104 has a relatively small effect on flow velocity of the fluid-like packaging material 4, so that the flow velocity of the packaging material 4 in the flow passage 104 is relatively fast. In this way, within the curing time T of the packaging material 4, the packaging material 4 in the flow passage 104 can flow from the feeding end to the terminal end, and at least portion of the intermediate flow passage 106 is filled with the packaging material 4. However, the packaging material 4 in the flow passage 103 may not be able to flow from the feeding end to the terminal end within the curing time T, so that the local position of the flow passage 103 cannot be filled, as the region S shown in FIG. 1D, thereby it is impossible to form a one-piece structure of the packaging portion 1 with a series of complete shapes between the upper die 101 and the lower die 102, at the position corresponding to the region S, the packaging portion 1 forms a gap, so that it is not possible to form an all-around closed light window.

In addition, if the flow velocity of the packaging material 4 in the above two flow passages 103 and 104 is not consistent, the flow velocity in the flow passage 104 is faster during this curing time T, and the flow passage 104 and the flow passage 106 can be separately filled with the packaging material 4 when the viscosity is low, and the packaging material 4 in the flow passage 103 flows too slowly forward, when the viscosity is relatively large, it still flows forward in the flow passage 103, resulting in the frictional force on the lead 202 through which the packaging material flow is large, so that the lead 202 is deflected forward with a large radius, thereby the lead 202 is easily deformed and damaged, and is easily detached from a bonding pad.

Another situation is that when the packaging material 4 reaches the region between the first photosensitive chip and the second photosensitive chip, more packaging material 4 is filled into the region through the flow passage 104, so that as the packaging material 4 flows forward along with the two flow passages 103 and 104, which will cause the ratio of the packaging material 4 of the flow passage 104 to be filled between the two adjacent photosensitive chips 3 to gradually increase. Eventually, the packaging material 4 of the flow passage 104 may flow to the flow passage 103 and prevented the packaging material 4 in the flow passage 103 from further flow forward. Thus, eventually, the packaging material 4 in the flow passage 103 may not flow to the terminal end of the flow passage 103 after the packaging material 4 is cured, so that the entire molding cavity cannot be filled with the packaging material 4, thereby a complete ring-shaped packaging portion 1 is not provided for each of the corresponding circuit boards 2 and the photosensitive chips 3. Moreover, the photosensitive chip 3 and the circuit board 2 are connected through the flexible lead 202, when the packaging material 4 flowing forward in the two flow passages 103 and 104 extends laterally to the intermediate flow passage 106 between two adjacent photosensitive chips, the packaging material 4 flowing from the two flow passages 103 and 104 is basically equivalent to converging in the intermediate flow passage 106 of the same dimension, so that the flow velocity is substantially the same, no turbulence is generated, and deformation and damage of the leads 202 for connecting the photosensitive chip 3 and the circuit board 2 between two adjacent photosensitive chips 3 are not caused. However, when the packaging material 4 in the wider flow passage 104 reaches the flow passage 103 from the intermediate flow passage 106, the packaging material 4 in the flow passage 103 will be prevented from continuing to flow forward, and because the different dimensions of the flow passage 104 and the flow passage 103, the turbulence is formed by collision generated between the two fluids at the confluence, such turbulence can easily cause deformation of the lead 202, or even cause the lead 202 to break, thereby forming a defective product.

More specifically, when the fluid of the flow passage 104 flows into the flow passage 103 and flows reversely toward the feeding end, as shown in FIG. 1E, when the packaging material 4 in the two flow passages 103 and 104 flows face to face in opposite directions and produce turbulence, there is a pressure difference between the two fluids, causing the leads 202 through which the two fluids flow to swing in different directions, so friction between adjacent leads 202 may cause damage to the lead 202.

In addition, when the width dimensions of the two flow passages 103 and 104 are sufficiently large, within the curing time T, the packaging material 4 can fill the flow passages 103, 104, and 106, but this will result in a larger dimension of the packaging portion 1 finally formed corresponding to each circuit board 2, so that it does not meet the requirements of some miniaturized camera modules.

SUMMARY OF THE INVENTION

An object of the present application is to provide a camera module, a photosensitive assembly thereof and a manufacturing method, wherein in a method for manufacturing a jointed panel of a photosensitive assembly, a molding material can fill a base jointed panel molding guide groove in a molding die in a molding process to avoid occurrence of defective products of the photosensitive assembly.

An object of the present application is to provide a camera module, a photosensitive assembly thereof and a manufacturing method, wherein in a molding process, the molding material can form a one-piece molding base on a circuit board assembly, and the one-piece molding base can form an all-round closed light window at positions corresponding to each photosensitive assembly, so that after the formed one-piece jointed panel of the photosensitive assembly is cut, a molding base having the light window is formed on each circuit board and the corresponding photosensitive assembly to prevent a portion of the molding base from forming an opening to connect the light window to outside of the molding base.

An object of the present application is to provide a camera module, a photosensitive assembly thereof, and a manufacturing method, wherein the base jointed panel molding guide groove is used to form the one-piece molding base on a row of circuit boards, which has two diversion grooves of two sides, and a plurality of filling grooves extending laterally between the two diversion grooves, the molding material flows and is cured in the diversion grooves and the filling grooves, wherein a dimension ratio between two diversion grooves is within a preset range, so that the molding material can flow forward from feeding ends of the two diversion grooves and fill the entire diversion groove and filling groove of the base jointed panel molding guide grooves.

An object of the present application is to provide a camera module, a photosensitive assembly thereof, and a manufacturing method, wherein the base jointed panel molding guide groove is used to form the one-piece molding base on two rows of adjacent circuit boards integrated in a rigid region, and has two first diversion grooves on both sides, and a second diversion groove in the middle, and a plurality of filling grooves located between the two first diversion grooves and the second diversion groove, the molding material flows and is cured in the diversion groove and the filling groove, wherein a dimension ratio between the two first diversion grooves and the second diversion groove is in a preset range, so that the molding material can flow forward from feeding ends of the two diversion grooves and fill the entire diversion groove and filling groove of the base jointed panel molding guide groove.

An object of the present application is to provide a camera module, a photosensitive assembly thereof, and a manufacturing method, wherein when the dimension of the diversion groove is small to form a miniaturized photosensitive assembly, by selecting a dimension ratio relationship between these diversion grooves, the diversion groove with a small dimension is made to still fill the entire base jointed panel molding guide groove during the molding process.

An object of the present application is to provide a camera module, a photosensitive assembly thereof, and a manufacturing method, wherein before viscosity of the molding material reaches a high value and the molding material is cured, the molding material can fill the base jointed panel molding guide groove, thereby preventing connecting wire between the circuit board and the photosensitive assembly from being damaged by a high-viscosity molding material flowing forward.

An object of the present application is to provide a camera module, a photosensitive assembly thereof, and a manufacturing method, wherein the dimension and ratio of the diversion groove are within a preset range, so that the molding material can reaches from the feeding end to the terminal end of each of the above-mentioned diversion grooves in a molding process to prevent the molding material in one diversion groove from flowing to the other diversion groove and obstructing the molding material in the other diversion groove from flowing forward.

An object of the present application is to provide a camera module, a photosensitive assembly thereof, and a manufacturing method, wherein the molding material flowing forward through the diversion grooves converges substantially at the filling grooves in the middle to prevent the molding material in a certain diversion groove from filling the filling groove and further flowing to the other diversion groove to generate a violent collision turbulence, which results in deformation and damage of the connecting wire connecting the circuit board and the photosensitive assembly.

An object of the present application is to provide a camera module, a photosensitive assembly thereof, and a manufacturing method, wherein the molding material flows forward in the diversion groove, thereby preventing the molding material in a certain guide groove form flowing through the filling groove and further flowing to another conducting fluid and flowing backward toward the feeding end, thereby affecting the filling efficiency of the fluid-like molding material, and causing adjacent connecting wires to deflect close to each other, which results in occurrence of friction and damage of the connecting wire.

An object of the present application is to provide a camera module, a photosensitive assembly thereof and a manufacturing method, wherein the molding material can be selected from a material with a relatively high viscosity range, thereby avoiding at the time of selecting a material with a relatively small viscosity range, the molding material easily entering into the photosensitive region of the photosensitive assembly during the molding process to form a flash, and at the same time, to avoid, for preventing the flash, increasing the pressure exerted by the light window molding portion on the photosensitive assembly to crush the photosensitive assembly.

An object of the present application is to provide a camera module, a photosensitive assembly thereof and a manufacturing method, wherein the molding process can form the one-piece molding base on a row of circuit boards having a plurality of circuit boards and a row of photosensitive assemblies at one time, so that a row of multiple photosensitive assemblies are formed by a jointed panel process, such as preferably 2-12 photosensitive assemblies.

In order to achieve at least one of the above objects of the present application, the present application provides a method for manufacturing a photosensitive assembly of a camera module, comprising the following steps:

(a) fixing a circuit board jointed panel to a second die of a molding die, wherein the circuit board jointed panel includes one or more rows of circuit boards, and each row of circuit boards includes one or more circuit boards arranged side by side, each of the circuit boards includes a combined rigid region and flexible region, and each of the circuit boards is operatively connected with a photosensitive chip;

(b) clamping the second die and a first die and filling molten molding material in a base jointed panel molding guide groove in the molding die, wherein a position corresponding to a light window molding portion is prevented from being filled with the molding material; and (c) curing the molding material in the base jointed panel molding guide groove to form a one-piece molding base at a position corresponding to the base jointed panel molding guide groove, wherein the one-piece molding base is integrally molded on corresponding each row of the circuit boards and each row of the photosensitive chips to form a photosensitive assembly jointed panel and form a light window for providing a light path for each of the photosensitive chips at a position corresponding to the light window molding portion, wherein the base jointed panel molding guide groove has a first diversion groove corresponding to a first end side of the one-piece molding base adjacent to the flexible region and a second diversion groove corresponding to the one-piece molding base away from the flexible region, and a plurality of filling grooves extending between the first diversion groove and the second diversion groove, wherein each of the light window molding portions is located between two adjacent filling grooves, wherein a width of a bottom end of the first diversion groove is a, and a width of a bottom end of the second diversion groove is c, wherein the width a corresponds to a distance between an outer edge and an inner edge of a portion of the one-piece molding base of the first end side of the one-piece molding base adjacent to the flexible region; wherein the width c corresponds to a distance between an outer edge and an inner edge of a portion of the one-piece molding base of an opposite second end side of the one-piece molding base away from the flexible region, wherein 0.2 mm≤a≤1 mm, 0.2 mm≤c≤1.5a.

In the above method for manufacturing the photosensitive assembly of the camera module, further including a step of cutting the photosensitive assembly jointed panel to obtain a plurality of photosensitive assemblies, wherein each of the photosensitive assemblies includes the circuit board, the photosensitive chip, and the molding base, wherein the molding base is integrally molded on the circuit board and the photosensitive chip and forms the light window for providing the light path for the photosensitive chip.

In the above method for manufacturing the photosensitive assembly of the camera module, there is 0.7a≤c≤1.3a.

In the above method for manufacturing the photosensitive assembly of the camera module, further including a step of cutting a portion of the photosensitive assembly corresponding to the opposite second end side of the molding base away from the flexible region, so that a distance between an outer edge and an inner edge of the remaining part of the molding base is b, wherein 0.2 mm≤b≤1.5a-0.2 mm.

In the above method for manufacturing the photosensitive assembly of the camera module, the rigid region of each of the circuit boards has a pressing distance W for a pressing block of the first die in the molding process to facilitate pressing on the first end side adjacent to the flexible region, and the pressing distance W has a value ranging from 0.1~1 mm.

In the above method for manufacturing the photosensitive assembly of the camera module, the rigid regions of each row of the circuit boards are integrally molded to form an integral rigid region jointed panel.

According to another aspect of the present application, the present application provides a method for manufacturing a photosensitive assembly of a camera module, comprising the following steps:

(a) fixing a circuit board jointed panel to a second die of a molding die, wherein the circuit board jointed panel includes a plurality of rows of circuit boards, and each row of circuit boards includes one or more circuit boards arranged side by side, each of the circuit boards includes a combined rigid region and flexible region, and each of the circuit boards is operatively connected with a photosensitive chip;

(b) clamping the second die and a first die and filling molten molding material in a base jointed panel molding guide groove in the molding die, wherein a position corresponding to a light window molding portion is prevented from being filled with the molding material; and (c) curing the molding material in the base jointed panel molding guide groove to form a one-piece molding base at a position corresponding to the base jointed panel molding guide groove, wherein the one-piece molding base is integrally molded on two adjacent rows of the circuit boards and two adjacent rows of the photosensitive assemblies to form a photosensitive assembly jointed panel and form a light window for providing a light path for each of the photosensitive chips at a position corresponding to the light window molding portion, wherein the two adjacent rows of the circuit boards are arranged such that their flexible regions are away from each other and their rigid regions are adjacent to each other, wherein the base jointed panel molding guide groove has two first diversion grooves corresponding to two end sides of the one-piece molding base adjacent to the flexible region and a second guide groove corresponding to a region between the two adjacent rows of photosensitive chips, and a plurality of filling grooves extending between the first diversion groove and the second diversion groove, wherein each of the light window molding portions is located between two adjacent filling grooves, wherein a width of a bottom end of the first diversion groove is a, and a width of a bottom end of the second diversion groove is c, wherein the width a corresponds to a distance between an outer edge and an inner edge of a portion of the one-piece molding base of the each end side of the one-piece molding base adjacent to the flexible region; wherein the width c corresponds to a distance between two inner edges of a portion of the one-piece molding base extending between the two adjacent rows of the photosensitive chips, wherein 0.2 mm≤a≤1 mm, 0.2 mm≤c≤1.5a.

In the above method for manufacturing the photosensitive assembly of the camera module, further including a step of cutting the photosensitive assembly jointed panel to obtain a plurality of photosensitive assemblies, wherein each of the photosensitive assemblies includes the circuit board, the photosensitive chip, and the molding base, wherein the molding base is integrally molded on the circuit board and the photosensitive chip and forms the light window for providing a light path for the photosensitive chip.

In the above method for manufacturing the photosensitive assembly of the camera module, there is 0.7a≤c≤1.3a.

In the above method for manufacturing the photosensitive assembly of the camera module, further including a step of cutting a portion of the photosensitive assembly located between the two adjacent rows of the photosensitive assemblies to obtain a portion of the molding base corresponding to the opposite another end side of the molding base away from the flexible region, and having a distance between the outer edge and the inner edge thereof as b, where 0.2 mm≤b≤1.5a-0.2 mm.

In the above method for manufacturing the photosensitive assembly of the camera module, the rigid region of each of the circuit boards has a pressing distance W for a pressing block of the first die in the molding process to facilitate pressing on the first end side adjacent to the flexible region, and the pressing distance W has a value ranging from 0.1~1 mm.

In the above method for manufacturing the photosensitive assembly of the camera module, the rigid regions of the two adjacent rows of the circuit boards are integrally molded to form an integral rigid region jointed panel.

According to still another aspect of the present application, the present application provides a photosensitive assembly of a camera module, comprising:

a circuit board, including a combined rigid region and flexible region;

a photosensitive chip; and a molding base, wherein the molding base is integrally molded on the circuit board and the photosensitive chip and forms a light window for providing a light path for the photosensitive chip;

wherein a distance between an outer edge and an inner edge of a portion of the molding base corresponding to a first end side of the molding base adjacent to the flexible region is a; a distance between an outer edge and an inner edge of the portion of the molding base corresponding to an opposite second end side of the molding base away from the flexible region is c, wherein 0.2 mm≤a≤1 mm, 0.2 mm≤c≤1.5a.

In the above photosensitive assembly of the camera module, there is 0.7a≤c≤1.3a.

In the above photosensitive assembly of the camera module, a portion of the photosensitive assembly away from the opposite second end side of the flexible region is adapted to be cut, so that a distance between an outer edge and an inner edge of the remaining part of the molding base after being cut is b, wherein 0.2 mm≤b≤1.5a-0.2 mm.

In the above photosensitive assembly of the camera module, the circuit board further includes a plurality of electronic components, and wherein the plurality of electronic components are provided at at least one wing side on both sides of the photosensitive assembly on the rigid region except for both end sides being adjacent to the flexible region and away from the flexible region, and the molding base integrally embeds the electronic component.

In the above photosensitive assembly of the camera module, at the first end side of the molding base adjacent to the flexible region, a pressing distance W for a pressing block of the molding die in the molding process to facilitate pressing on the rigid region is between the outer edge of the molding base and the outer edge of the rigid region, and the pressing distance W has a value ranging from 0.1~1 mm.

In the above photosensitive assembly of the camera module, further including a filter assembly and a filter assembly lens holder, wherein the filter assembly is assembled to the filter assembly lens holder, and the filter assembly lens holder is assembled on a top side of the molding base.

In the above photosensitive assembly of the camera module, further including a protective frame provided on the photosensitive chip, and the molding base is integrally molded on the circuit board, the photosensitive chip and the protective frame.

According to still another aspect of the present application, the present application provides a photosensitive assembly of a camera module, comprising:

a circuit board, including a combined rigid region and flexible region;

a photosensitive chip; and a molding base, wherein the molding base is integrally molded on the circuit board and the photosensitive chip and forms a light window for providing a light path for the photosensitive chip;

wherein a distance between an outer edge and an inner edge of a portion of the molding base corresponding to a first end side of the molding base adjacent to the flexible region is a; a portion of the molding base corresponding to an opposite second end side of the molding base away from the flexible region has a cutting surface, and a distance between an outer edge and an inner edge thereof is b, wherein 0.2 mm≤a≤1 mm, 0.2 mm≤b≤1.5a-0.2 mm.

In the above photosensitive assembly of the camera module, the circuit board further includes a plurality of electronic components, and the plurality of electronic components are provided at at least one wing side on both sides of the photosensitive assembly on the rigid region except for both end sides being adjacent to the flexible region and away from the flexible region, wherein the molding base integrally embeds the electronic component.

In the above photosensitive assembly of the camera module, at the first end side of the molding base adjacent to the flexible region, a pressing distance W for a pressing block of the molding die in the molding process to facilitate pressing on the rigid region is between an outer edge of the molding base and an outer edge of the rigid region, and the pressing distance W has a value ranging from 0.1~1 mm.

In the above photosensitive assembly of the camera module, further including a filter assembly and a filter assembly lens holder, wherein the filter assembly is assembled to the filter assembly lens holder, and the filter assembly lens holder is assembled on a top side of the molding base.

In the above photosensitive assembly of the camera module, further including a protective frame provided on the photosensitive chip, and the molding base is integrally molded on the circuit board, the photosensitive chip and the protective frame.

According to still another aspect of the present application, the present application provides a photosensitive assembly jointed panel of a camera module, comprising:
one or more rows of circuit boards, each row of circuit boards including one or more circuit boards arranged side by side, each of the circuit boards including a combined rigid region and flexible region;
one or more rows of photosensitive chips; and
one or more one-piece molding bases, each of which is integrally molded on a row of the circuit boards and a row of the photosensitive chips and forms a light window for providing a light path for each of the photosensitive chips; wherein a distance between an outer edge and an inner edge of a portion of the one-piece molding base corresponding to a first end side of the one-piece molding base adjacent to the flexible region is a; a distance between an outer edge and an inner edge of the one-piece molding base corresponding to an opposite second end side of the one-piece molding base away from the flexible region is c, wherein 0.2 mm≤a≤1 mm, 0.2 mm≤c≤1.5a.

In the above photosensitive assembly jointed panel of the camera module, the photosensitive assembly jointed panel includes a plurality of rows of the circuit boards, a plurality of rows of the photosensitive chips, and a plurality of the one-piece molding bases, wherein in two adjacent rows of the circuit boards, the second end side of the one-piece molding base on one row of the circuit boards away from the flexible region faces towards the first end side of the one-piece molding bases adjacent to the flexible region on another row of the circuit boards.

In the above photosensitive assembly jointed panel of the camera module, there is 0.7a≤c≤1.3a. In the above photosensitive assembly jointed panel of the camera module, the rigid region of each of the circuit boards has a pressing distance W for a pressing block of the first molding die in the molding process to facilitate pressing on the first end side adjacent to the flexible region, and the pressing distance W has a value ranging from 0.1~1 mm.

In the above photosensitive assembly jointed panel of the camera module, the rigid regions of a row of the circuit boards are integrally molded to form an integral rigid region jointed panel.

According to still another aspect of the present application, the present application provides a photosensitive assembly jointed panel of a camera module, comprising:
a plurality of rows of circuit boards, each row of circuit boards including one or more circuit boards arranged side by side, each of the circuit boards including a combined rigid region and flexible region;
a plurality of rows of photosensitive chip; and
one or more one-piece molding bases, each of which is integrally molded on two rows of adjacent circuit boards and two rows of adjacent photosensitive chips and forms a light window for providing a light path for each of the photosensitive chips; and the two adjacent rows of the circuit boards are arranged such that the flexible regions thereof are far from each other and the rigid regions thereof are adjacent to each other, thereby each of the one-piece molding bases has two end sides adjacent to the flexible region; wherein a distance between an outer edge and an inner edge of a portion of the one-piece molding base corresponding to each end side of the one-piece molding base adjacent to the flexible region is a; the one-piece molding base extends to be located between the two adjacent rows of the photosensitive chips and a distance between two inner edges thereof is c, wherein 0.2 mm≤a≤1 mm, 0.2 mm≤c≤1.5a.

In the above photosensitive assembly jointed panel of the camera module, the rigid region of each of the circuit boards has a pressing distance W for a pressing block of the first molding die in the molding process to facilitate pressing on the first end side adjacent to the flexible region, and the pressing distance W has a value ranging from 0.1~1 mm.

In the above photosensitive assembly jointed panel of the camera module, the rigid regions of the two adjacent rows of the circuit boards are integrally molded to form an integral rigid region jointed panel.

According to still another aspect of the present application, the present application provides a camera module, comprising:
a lens;
a circuit board, including a combined rigid region and flexible region;
a photosensitive chip; and
a molding base, wherein the molding base is integrally molded on the circuit board and the photosensitive chip and forms a light window for providing a light path for the photosensitive chip, wherein the lens is located on a photosensitive path of the photosensitive chip; wherein a distance between an outer edge and an inner edge of a portion of the molding base corresponding to a first end side of the molding base adjacent to the flexible region is a; a distance between an outer edge and an inner edge of a portion of the molding base corresponding to an opposite second end side of the molding base away from the flexible region is c, wherein 0.2 mm≤a≤1 mm, 0.2 mm≤c≤1.5a.

In the above camera module, there is 0.7a≤c≤1.3a.

In the above camera module, the circuit board further includes a plurality of electronic components, wherein the plurality of electronic components are provided at at least one wing side on both sides of the photosensitive assembly on the rigid region except for both end sides being adjacent to the flexible region and away from the flexible region, wherein the molding base integrally embeds the electronic component.

In the above camera module, the molding base integrally molded on the circuit board and the photosensitive chip is cut from a one-piece molding base made in a jointed panel molding process, and the opposite second end side of the molding base away from the flexible region corresponds to a cutting side.

In the above camera module, a distance between an outer edge and an inner edge of the cutting side of the molding base corresponding to the opposite second end side of the molding base away from the flexible region is c, where 0.2 mm≤c≤1.5a-0.2 mm.

In the above camera module, further including a filter assembly and a filter assembly lens holder, wherein the filter assembly is assembled to the filter assembly lens holder, the filter assembly lens holder is assembled on the top side of the molding base.

In the above camera module, the lens is assembled on the molding base; or the lens is assembled on the filter assembly lens holder; or the lens is assembled on the molding base and the filter assembly lens holder.

In the above camera module, further including a driver, the lens is assembled on the driver, the driver is assembled on the molding base, or the driver is assembled on the filter assembly lens holder; or the driver is assembled on the molding base and the filter assembly lens holder.

In the above camera module, further including a fixed lens barrel, the lens is assembled on the fixed lens barrel, and the fixed lens barrel is assembled on the molding base; or the fixed lens barrel is assembled on the filter assembly lens holder; or the fixed lens barrel is assembled on the molding base and the filter assembly lens holder.

According to still another aspect of the present application, the present application provides a molding die to produce a photosensitive assembly jointed panel for a camera module, comprising a first die and a second die suitable for being separated from each other and being in close contact with each other, wherein the first die and the second die form a molding cavity when they are in close contact with each other, and the molding die is configured with a light window molding portion and a base jointed panel molding guide groove formed around the light window molding portion in the molding cavity, and the molding cavity is suitable for fixing a circuit board jointed panel therein, wherein the circuit board jointed panel includes one or more rows of circuit boards, each row of circuit boards includes one or more circuit boards arranged side by side, each of the circuit boards includes a combined rigid region and flexible region, and each of the circuit boards is operatively connected with a photosensitive chip, and the base jointed panel molding guide groove is adapted to be filled with a molding material to form a one-piece molding base at a position corresponding to the base jointed panel molding guide groove, wherein the one-piece molding base is integrally molded in corresponding each row of the circuit boards and each row of the photosensitive chips to form the photosensitive assembly jointed panel and form a light window for providing a light path for each of the photosensitive chips at a position corresponding to the light window molding portion, wherein the base jointed panel molding guide groove has a first diversion groove corresponding to a first end side of the one-piece molding base adjacent to the flexible region and a second diversion groove corresponding to the one-piece molding base away from the flexible region, and a plurality of filling grooves extending between the first diversion groove and the second diversion groove, wherein each of the light window molding portions is located between the two adjacent filling grooves, wherein a width of a bottom end of the first diversion groove is a, and a width of a bottom end of the second diversion groove is c, where 0.2 mm≤a≤1 mm, 0.2 mm≤c≤1.5a.

According to still another aspect of the present application, the present application provides a molding die to produce a photosensitive assembly jointed panel for a camera module, comprising a first die and a second die suitable for being separated from each other and being in close contact with each other, wherein the first die and the second die form a molding cavity when they are in close contact with each other, and the molding die is configured with a light window molding portion and a base jointed panel molding guide groove formed around the light window molding portion in the molding cavity, and the molding cavity is suitable for fixing a circuit board jointed panel therein, wherein the circuit board jointed panel includes a plurality of rows of circuit boards, each row of circuit boards includes one or more circuit boards arranged side by side, each of the circuit boards includes a combined rigid region and flexible region, and each of the circuit boards is operatively connected with a photosensitive chip, wherein the base jointed panel molding guide groove is adapted to be filled with a molding material to form a one-piece molding base at a position corresponding to the base jointed panel molding guide groove, wherein the one-piece molding base is integrally molded on the two adjacent rows of the circuit boards and the two adjacent rows of the photosensitive chips to form the photosensitive assembly jointed panel and from a light window for providing a light path for each of the photosensitive chips at a position corresponding to the light window molding portion, wherein the two adjacent rows of the circuit boards are arranged such as their flexible regions are away from each other and their rigid regions are adjacent to each other, wherein the base jointed panel molding guide groove has two first diversion grooves corresponding to two end sides of the one-piece molding base adjacent to the flexible region and a second diversion groove corresponding to a region between the two adjacent rows of the photosensitive chips, and a plurality of filling grooves extending between the first diversion groove and the second diversion groove, wherein each of the light window molding portions is located between the two adjacent filling grooves, wherein a width of a bottom end of the first diversion groove is a, and a width of a bottom end of the second diversion groove is c, where 0.2 mm≤a≤1 mm, 0.2 mm≤c≤1.5a.

According to still another aspect of the present application, the present application provides a method for manufacturing a photosensitive assembly of a camera module, comprising the following steps:
  (1) fixing a circuit board jointed panel to a second die of a molding die, wherein the circuit board jointed panel includes one or more rows of circuit boards, and each row of circuit boards includes one or more circuit boards arranged side by side, each of the circuit boards includes a combined rigid region and flexible region, and each of the circuit boards is operatively connected with a photosensitive chip;
  (2) clamping the second die and a first die and filling molten molding material in a base jointed panel molding guide groove in the molding die, wherein a position corresponding to a light window molding portion is prevented from being filled with the molding material; and (3) curing the molding material in the base jointed panel molding guide groove to form a one-piece molding base at a position corresponding to the base jointed panel molding guide groove, wherein the one-piece molding base is integrally molded on corresponding each row of the circuit boards and each row of the photosensitive chips to form a photosensitive assembly jointed panel and form a light window for providing a light path for each of the photosensitive chips at a position corresponding to the light window molding portion, wherein the base jointed panel molding guide groove has a first diversion groove corresponding to a first end side of the one-piece molding base adjacent to the flexible region and a second diversion groove corresponding to the one-piece molding base away from the flexible region, and a plurality of filling grooves extending between the first diversion groove and the second diversion groove, wherein each of the light window molding portions is located between two adjacent filling grooves, wherein a width of a bottom end of the first diversion groove is a, and a width of a bottom end of the second diversion groove is d, wherein 0.2 mm≤a≤1 mm, d>1.5a, and a flow retarding part is provide on the rigid region corresponding to the second end side of the one-piece molding base away from the flexible region, and the flow retarding part is embedded by the one-piece molding base.

In the above method for manufacturing the photosensitive assembly of the camera module, further including a step of cutting the photosensitive assembly jointed panel to obtain a plurality of photosensitive assemblies, wherein each of the photosensitive assemblies includes the circuit board, the photosensitive chip, and the molding base, wherein the molding base is integrally molded on the circuit board and the photosensitive chip and forms the light window for providing a light path for the photosensitive chip.

In the above method for manufacturing the photosensitive assembly of the camera module, further including a step of removing a part of the one-piece molding base for embedding the flow retarding part.

According to still another aspect of the present application, the present application provides a method for manufacturing a photosensitive assembly of a camera module, comprising the following steps:

(a) fixing a circuit board jointed panel to a second die of a molding die, wherein the circuit board jointed panel includes a plurality of rows of circuit boards, and each row of circuit boards includes one or more circuit boards arranged side by side, each of the circuit boards includes a combined rigid region and flexible region, and each of the circuit boards is operatively connected with a photosensitive chip;

(b) clamping the second die and a first die and filling molten molding material in a base jointed panel molding guide groove in the molding die, wherein a position corresponding to a light window molding portion is prevented from being filled with the molding material; and (c) curing the molding material in the base jointed panel molding guide groove to form a one-piece molding base at a position corresponding to the base jointed panel molding guide groove, wherein the one-piece molding base is integrally molded on two adjacent rows of the circuit boards and two adjacent rows of the photosensitive chips to form a photosensitive assembly jointed panel and form a light window for providing a light path for each of the photosensitive chips at a position corresponding to the light window molding portion, wherein the two adjacent rows of the circuit boards are arranged such that their flexible regions are away from each other and their rigid regions are adjacent to each other, wherein the base jointed panel molding guide groove has two first diversion grooves corresponding to two end sides of the one-piece molding base adjacent to the flexible region and a second guide groove corresponding to a region between the two adjacent rows of photosensitive chips, and a plurality of filling grooves extending between two first diversion grooves and the second diversion groove, wherein each of the light window molding portions is located between two adjacent filling grooves, wherein a width of a bottom end of the first diversion groove is a, and a width of a bottom end of the second diversion groove is d, wherein 0.2 mm≤a≤1 mm, d>1.5a, and a flow retarding part is provided in second diversion groove on a hard plate.

In the above method for manufacturing the photosensitive assembly of the camera module, further including a step of cutting the photosensitive assembly jointed panel to obtain a plurality of photosensitive assemblies, wherein each of the photosensitive assemblies includes the circuit board, the photosensitive chip, and the molding base, wherein the molding base is integrally molded on the circuit board and the photosensitive chip and forms the light window that provides a light path for the photosensitive chip.

In the above method for manufacturing the photosensitive assembly of the camera module, further including a steps of removing a part of the one-piece molding base between the two adjacent rows of the photosensitive chips and removing a part for embedding the flow retarding part.

According to another aspect of the present application, the present application also provides an electronic device including one or more of the camera modules described above. The electronic device includes, but is not limited to, a mobile phone, a computer, a television, a smart wearable device, a vehicle, a camera, and a monitoring device.

BRIEF DESCRIPTION OF THE DRAWINGS

FIG. 7A is a cross-sectional view illustrating when a molten molding material is pushed into a base jointed panel molding guide groove in the molding die of the photosensitive assembly jointed panel according to the above mentioned first preferred embodiment of the present application, wherein the cross-sectional view is a cross-sectional view corresponding to the direction of the A-A line illustrated in FIG. 4.

FIG. 7B is a partially enlarged schematic view at B in FIG. 7A.

FIG. 8 is a cross-sectional view of a molten molding material being filled in a base jointed panel molding guide groove in the molding die of the photosensitive assembly jointed panel according to the above mentioned first preferred embodiment of the present application, wherein the cross-sectional view is a cross-sectional view corresponding to the direction of the A-A line illustrated in FIG. 4.

FIG. 9 is a cross-sectional view of a molten molding material being filled in a base jointed panel molding guide groove in the molding die of the photosensitive assembly jointed panel according to the above mentioned first preferred embodiment of the present application, wherein the cross-sectional view is a cross-sectional view corresponding to the direction of the B-B line illustrated in FIG. 4.

FIG. 20A is a cross-sectional view of the photosensitive assembly jointed panel of the camera module according to the above mentioned second preferred embodiment of the present application, taken along line H-H in FIG. 19A.

FIG. 20B is a schematic structural view of two photosensitive assemblies obtained by cutting the photosensitive assembly jointed panel of the camera module according to the above mentioned second preferred embodiment of the present application.

FIG. 21A is a cross-sectional view illustrating when a molten molding material is pushed into a base jointed panel molding guide groove in the molding die of the photosensitive assembly jointed panel according to the above mentioned second preferred embodiment of the present application, wherein the cross-sectional view is a cross-sectional view corresponding to the direction of the F-F line illustrated in FIG. 18.

FIG. 21B is a partially enlarged schematic view at E in FIG. 21A.

DETAIL DESCRIPTION OF THE INVENTION

Figure 1A:
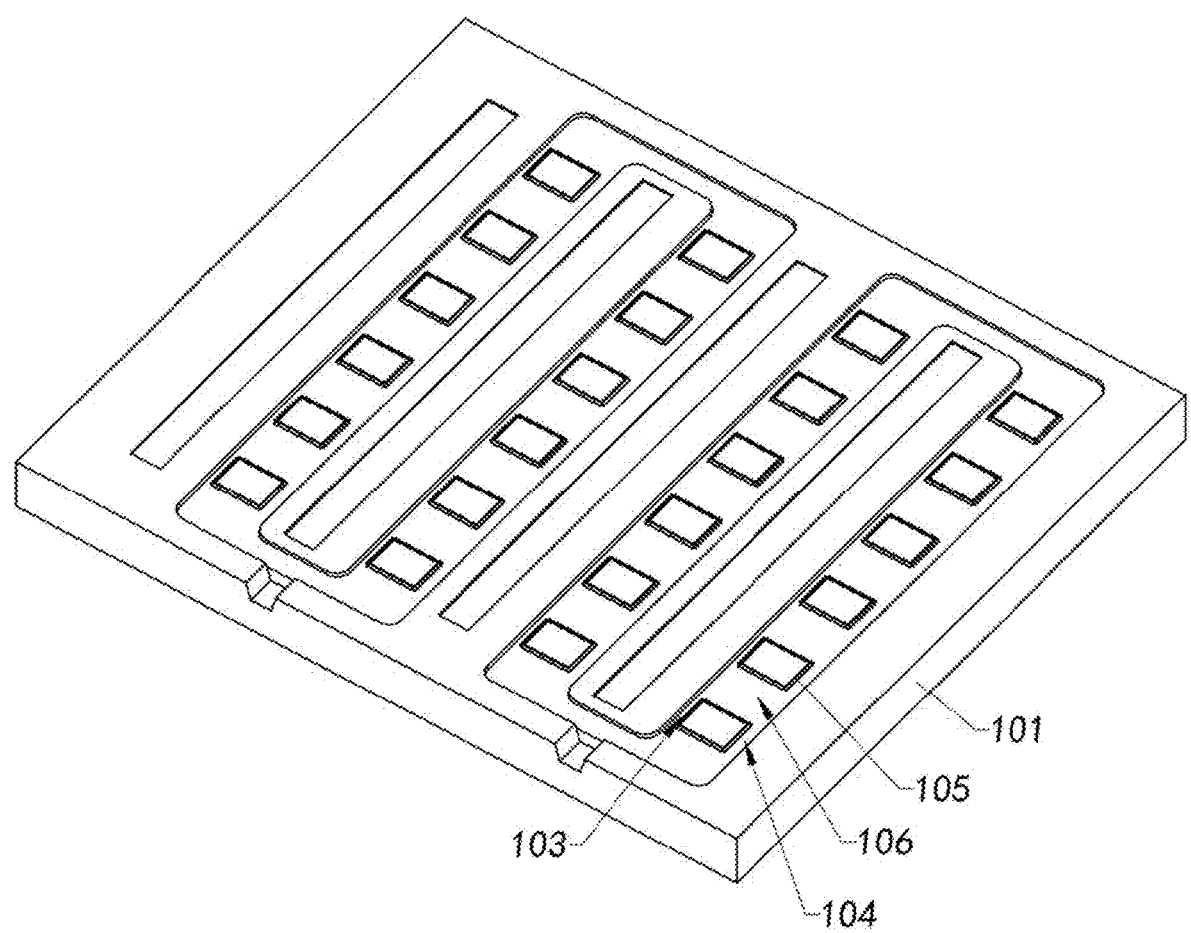
FIG. 1A is a schematic structural view of a molding die for obtaining a photosensitive assembly packaged by the conventional integrated packaging process.
Figure 1B:
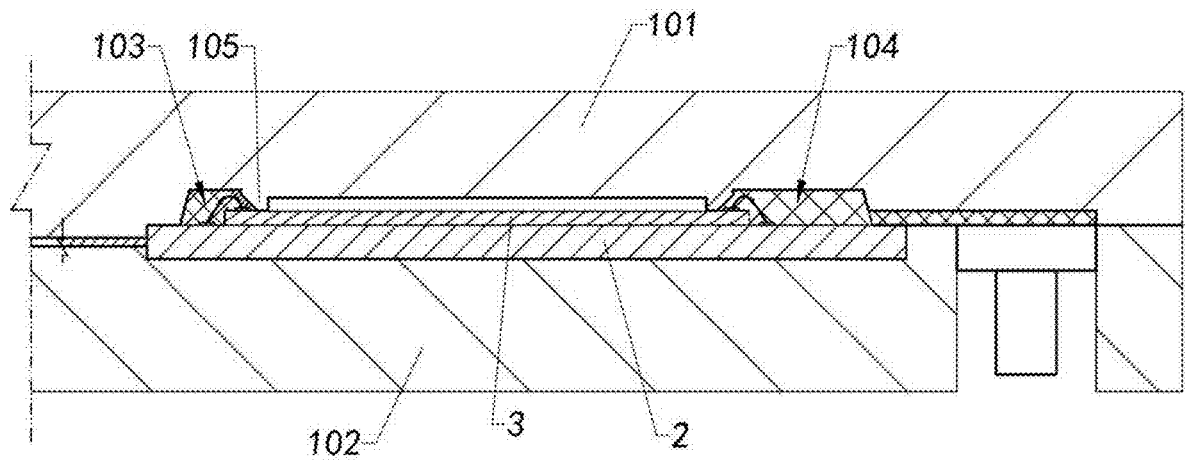
FIG. 1B is a schematic view of a molding process of forming an integrated packaging assembly by the conventional integrated package process.

The following description is used to disclose the present application so that those skilled in the art can implement the present application. The preferred embodiments in the following description are merely examples, and those skilled in the art can think of other obvious variations. The basic principles of the present application defined in the following description can be applied to other embodiments, modifications, improvements, equivalents, and other technical solutions without departing from the spirit and scope of the present application.

Those skilled in the art should understand that, in the disclosure of the present application, The orientation or positional relationship of the indications of the terms "longitudinal", "transverse", "upper", "lower", "front", "back", "left", "right", "upright", "horizontal", "top", "bottom", "inside", "outside", etc. is based on the orientation or positional relationship shown in the drawings, which is merely for the convenience of describing the present application and simplifying the description rather than indicating or implying that the device or component referred to must have a particular orientation, be constructed and operated in a particular orientation. Therefore, the above terms are not to be construed as limiting the present invention.

It can be understood that the term "a" should be understood as "at least one" or "one or more", that is, in one example, the number of a component can be one, while in other examples, the number of the component may be plural, and the term "a" cannot be understood as a limitation on the number.

Figure 38:
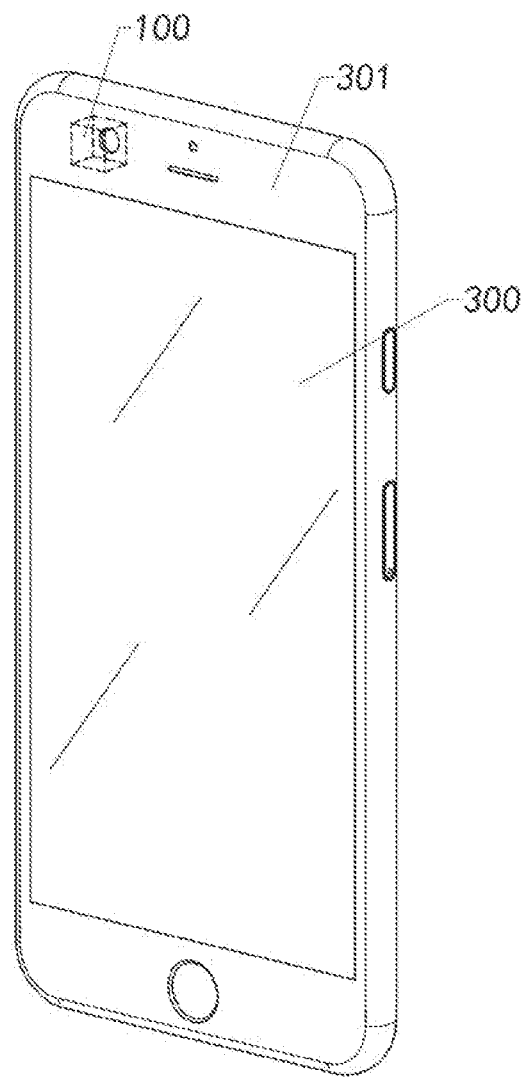
FIG. 38 is a structural schematic view of the abovementioned camera module applied to an intelligent electronic device according to the present application.

As shown in FIG. 2 to FIG. 14, a camera module 100 and a photosensitive assembly 10 and a manufacturing method thereof according to a first preferred embodiment of the present application are shown. The camera module 100 can be applied to various electronic devices 300. The electronic device 300 includes a device main body 301 and one or more camera modules 100 mounted in the device main body 301, as shown in FIG. 38. The electronic device 30 is exemplified but not limited to a smart phone, a wearable device, a computer device, a television, a vehicle, a camera, a monitoring device, etc., and the camera module cooperates with the electronic device to implement image acquisition and reproduction of the target object.

More specifically, the figure illustrates a photosensitive assembly 10 of the camera module 100 and its manufacturing equipment 200. The photosensitive assembly 10 includes a circuit board 11, a molding base 12 and a photosensitive chip 13. The molding base 12 is integrally molded on the circuit board 11 and the photosensitive chip 13 and forms a light window 122 for providing a light path for the photosensitive chip 13. Wherein, the molding base 12 of the present application is integrally molded on the circuit board 11 and the photosensitive chip 13 by the manufacturing equipment 200 through a molding process, more specifically, a transfer molding process, so that the molding base 12 can replace the lens holder or the bracket of the conventional camera module, and does not need to attach the lens holder or the bracket to the circuit board 11 by glue in a conventional packaging process.

Further, referring to FIGS. 2-4 and FIGS. 7A to 10, the present application manufactures a photosensitive assembly jointed panel 1000 through the manufacturing equipment 200, that is, the photosensitive assembly jointed panel 1000 having a plurality of photosensitive assemblies 10 is manufactured by a jointed panel process. The photosensitive assembly jointed panel 1000 includes a circuit board 1100 and one or more one-piece molding bases 1200. The circuit board jointed panel 1100 includes a plurality of rows of circuit boards, such as the four-row circuit boards illustrated in FIG. 4, and each row of the circuit boards includes a plurality of circuit boards 11, such as 2-12 of the circuit boards 11, six of the circuit boards shown the FIG. 11, and each of the circuit boards 11 is operatively connected to a photosensitive chip 13. Each of the one-piece molding bases 1200 is formed on a row of the circuit boards and is integrally molded on at least a part of a non-photosensitive region 132 of each of the photosensitive chips 13 of the row of the photosensitive chips 13 to expose a photosensitive region 131 of the photosensitive assembly 13. Each of the one-piece molding bases 1200 has a plurality of light windows 122, and the positions of each of the light windows 122 correspond to each of the photosensitive chips 13 for providing a light path for the corresponding photosensitive chips 13.

The manufacturing equipment 200 of the photosensitive assembly jointed panel 1000 of the camera module 100 includes a molding die 210, a molding material feeding mechanism 220, a die fixing device 230, a temperature control device 250, and a controller 260. The molding material feeding mechanism 220 is used to provide a molding material 14 to a base jointed panel molding guide groove 215. The die fixing device 230 is used to control the die opening and clamping of the molding die 210. The temperature control device 250 is used to heat the thermosetting molding material 14.

The controller 260 is used to automatically control the operation of the molding material feeding mechanism 220, the die fixing device 230, and the temperature control device 250 in the molding process.

The molding die 210 includes a first die 211 and a second die 212 that can be opened and clamped under the action of the die fixing device 230, that is, the die fixing device 230 can operate the first die 211 and the second die 212 being separated and closely contacted to form a molding cavity 213. During die clamping, the circuit board jointed panel 1100 is fixed in the molding cavity 213, and the fluid-like molding material 14 enters the molding cavity 213 so as to be integrally molded on each row of the circuit boards 11 and the corresponding each row of the photosensitive chips 13, and after curing, it forms the one-piece molding base 1200 integrally molded on each row of the circuit boards 11 and on each row of the photosensitive chips 13.

More specifically, the molding module 210 further has one or more base jointed panel molding guide grooves 215 and a plurality of light window molding portions 214 located in the base jointed panel molding guide grooves 215. When the first and second dies 211 and 212 are clamped, the light window molding portion 214 and the base jointed panel molding guide groove 215 extend in the molding cavity 213, and the fluid-like molding material 14 is filled into the base jointed panel molding guide groove 215, and the position corresponding to the light window molding portion 214 cannot be filled with the fluid-like molding material 14, therefore, at a position corresponding to the base jointed panel molding guide groove 215, the fluid-like molding material 14 can be formed into the one-piece molding base 1200 after curing, which includes a ring-shaped molding main body 121 corresponding to the molding base 12 of each of the photosensitive assemblies 10, and the light window 122 of the molding base 12 is formed at a position corresponding to the light window molding portion 214. The molding material 14 may be selected from, but not limited to, nylon, LCP (Liquid Crystal Polymer), PP (Polypropylene), epoxy resin, and the like.

The first die 211 and the second die 212 may be two dies capable of generating relative movement, such as one of the two molds is fixed and the other is movable; or both molds are movable. The present application is not limited in this aspect. In the example of this embodiment of the present application, the first die 211 is specifically implemented as a fixed upper die, and the second die 212 is implemented as a movable lower die. The fixed upper die and the movable lower die are arranged coaxially, for example, the movable lower die can slide up along with a plurality of positioning axes, and can form the tightly closed molding cavity 213 when clamping die with the fixed upper die.

The second die 212, that is, the lower die may have a circuit board positioning groove 2121, which may be in the shape of a groove or formed by a positioning post for mounting and fixing the circuit board 11, and the light window molding portion 214 and the base jointed panel molding guide groove 215 may be formed in the first die 211, that is, formed in the upper die, and when the first die 211 and the second die 212 are clamped, it forms the molding cavity 213. And, the fluid-like molding material 14 is injected into the base jointed panel molding guide grooves 215 on the top side of the circuit board jointed panel 1100, so that the one-piece molding base 1200 is formed on the top side of each row of the circuit boards 11 and each row of the photosensitive chips 13.

It can be understood that the circuit board positioning groove 2121 may also be provided in the first die 211, that is, the upper die, for mounting and fixing the circuit board jointed panel 1100, and the light window molding portion 214 and the base jointed panel molding guide groove 215 may be formed in the second die 211, and when the first die 211 and the second die 212 are clamped, the molding cavity 213 is formed. The circuit board jointed panel 1100 may be arranged face-to-face in the upper die, and the fluid-like molding material 14 is injected into the base jointed panel molding guide groove 215 on the bottom side of the circuit board jointed panel 1100 that is inverted, so that the one-piece molding base 1200 is formed on the bottom side of the circuit board jointed panel 1100 that is inverted.

More specifically, when the first die 211 and the second die 212 are clamped and a molding step is performed, the light window molding portion 214 is superimposed on the top surface of the photosensitive chip 13 and closely adhered, so that the fluid-like molding material 14 is prevented from entering the photosensitive region 131 on the top surface of the photosensitive chip 13 on the circuit board 11, so that the light window 122 of the one-piece molding base 1200 can be finally formed at a position corresponding to the light window molding portion 214. It can be understood that the light window molding portion 214 may be a solid structure or a structure having a groove shape inside as shown in the figure.

It can be understood that the molding surface of the first die 211 forming the base jointed panel molding guide groove 215 can be configured as a flat surface and is on the same plane. In this way, when the molding base 12 is cured and molded, the top surface of the molding base 12 is relatively flat, so as to provide flat mounting conditions for optical components such as drivers, lenses, and fixed lens barrels above the photosensitive assembly 10 of the camera module 100 to reduce the tilt error of the camera module 100 after assembly.

It is worth mentioning that the base jointed panel molding guide groove 215 and the light window molding portion 214 can be integrally molded in the first die 211. Alternatively, the first die 211 further includes a detachable molding structure, and the molding structure is formed with the base jointed panel molding guide groove 215 and the light window molding portion 214. In this way, according to the shape and dimension requirements of the photosensitive assembly 10 such as the diameter and thickness of the molding base, the base jointed panel molding guide grooves 215 and the light window 214 of different shapes and dimensions can be designed. In this way, only the different molding structures need to be replaced, then the manufacturing equipment can be adapted to be applied to the photosensitive assembly 10 with different specifications. It can be understood that the second die 212 may also include accordingly a detachable fixing block to provide the grooves of different shapes and dimensions, so as to facilitate the replacement of the circuit board 11 adapted to different shapes and dimensions.

It can be understood that the molding material 14 is a thermosetting material. The molding material 14 becomes a fluid state by heating and melting the thermosetting material in a solid state. During the molding process, the thermosetting molding material 14 is cured through a further heating process, and can no longer be melted after curing, thereby forming the one-piece molding base 1200. It can be understood that, in the molding process of the present application, the molding material 14 may be a block shape, a granular shape, or a powder shape, which is changed to fluid in the molding die 210 after being heated, then cured to form the one-piece molding base 1200.

More specifically, each of the base jointed panel molding guide grooves 215 of the present application has a first diversion groove 2151 and a second diversion groove 2152 that are substantially parallel, and a plurality of filling grooves 2153 extends between the first diversion groove 2151 and the second diversion grooves 2152, wherein the filling grooves 2153 are formed between two adjacent light window molding portions 214, and as shown in the figure, the base jointed panel molding guide groove 215 has seven filling grooves 2153, and six light window molding portions 214 are located between two adjacent filling grooves 2153. The molding material 14 flows along with the first diversion groove 2151 and the second diversion groove 2152 from the feeding end 215A to the terminal end 215B, and between the first diversion groove 2151 and the second diversion groove 2152, when the dimension and ratio of the first diversion groove 2151 and the second diversion groove 2152 are within a predetermined range, the molding material 14 can fill each of the filling grooves 2153, so that the one-piece molding base 1200 is formed after the molding material 14 is cured.

As shown in FIGS. 7A to 10, it is a schematic view of a manufacturing process of the photosensitive assembly jointed panel 1000 of the camera module 100 according to this preferred embodiment of the present application. As shown in FIG. 7A, the molding die 210 is in a die clamping state, the circuit board jointed panel 1100 to be molded and the solid molding material 14 are ready to be in place, the solid molding material 14 is heated, thereby when the molding material 14 is melted into a fluid state or a semi-solid or semi-fluid state, it is sent to the base jointed panel molding guide groove 215, flows forward along with the first diversion groove 2151 and the second diversion groove 2152, and fills the filling groove 2153 between two adjacent light window molding portions 214.

As shown in FIG. 8 and FIG. 9, when the base molding plate forming guide groove 215 is completely filled with the fluid-like molding material 14, the fluid-like molding material 14 is cured through a curing process to mold the one-piece molding base 1200 integrally molded in each row of the circuit boards 11 and each row of the photosensitive chips 13.

Figure 10:
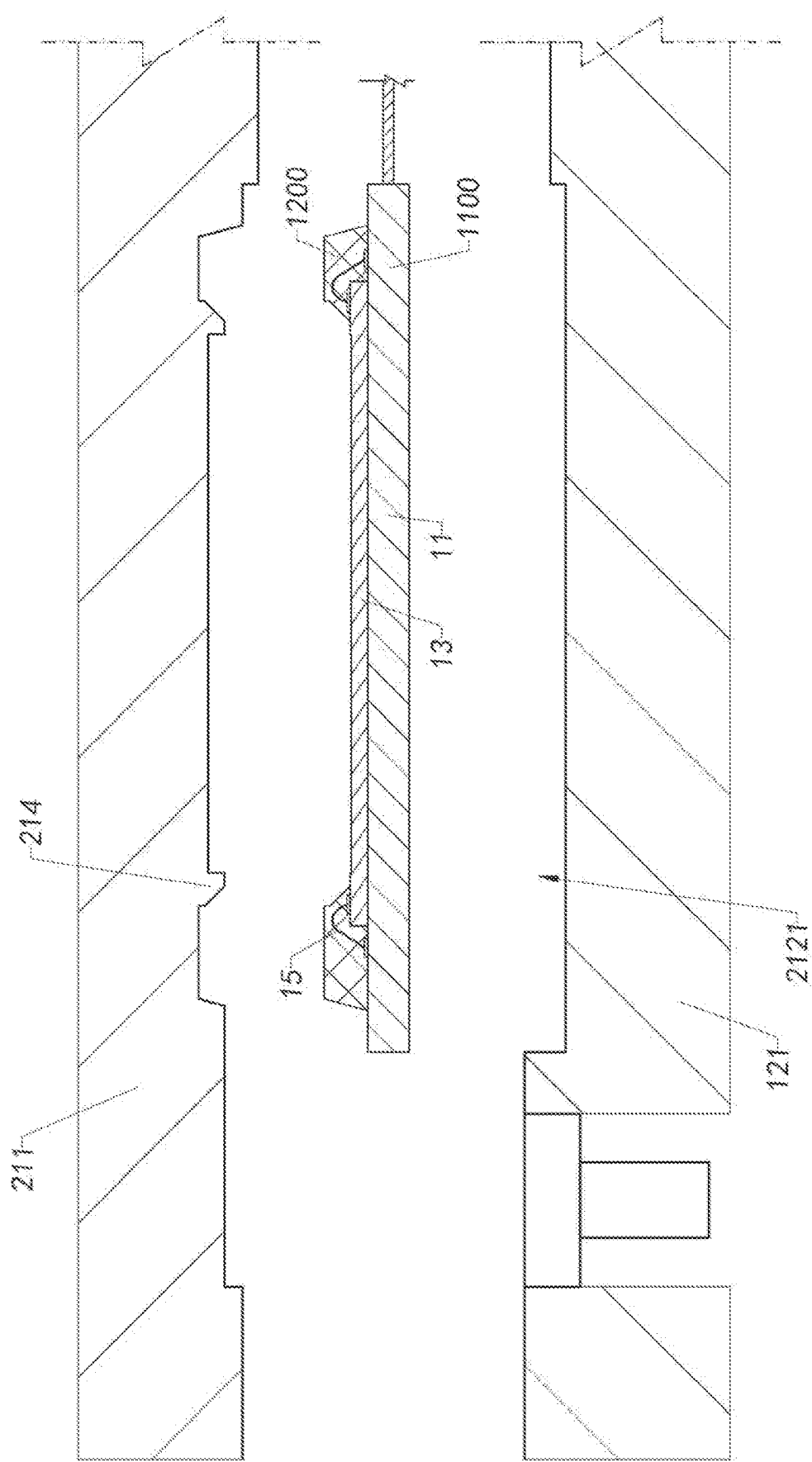
FIG. 10 is a cross-sectional view of performing a demold step to form a one-piece molding base in the molding die of the photosensitive assembly jointed panel according to the above mentioned first preferred embodiment of the present application, wherein the cross-sectional view is a cross-sectional view corresponding to the direction of the A-A line illustrated in FIG. 4.
Figure 11:
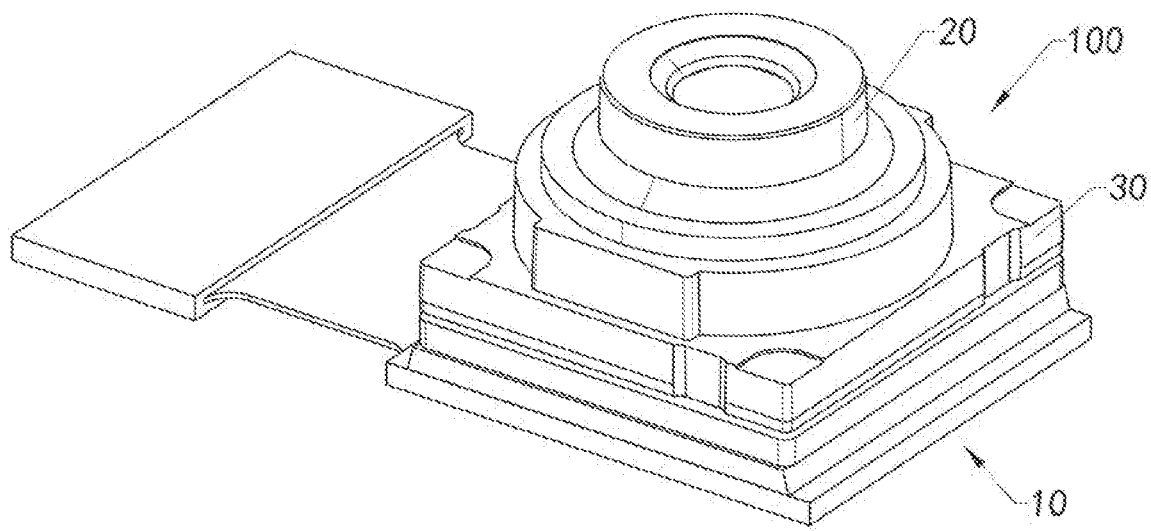
FIG. 11 is a schematic view illustrating a three-dimensional structure of the camera module according to the above mentioned first preferred embodiment of the present application.
Figure 12:
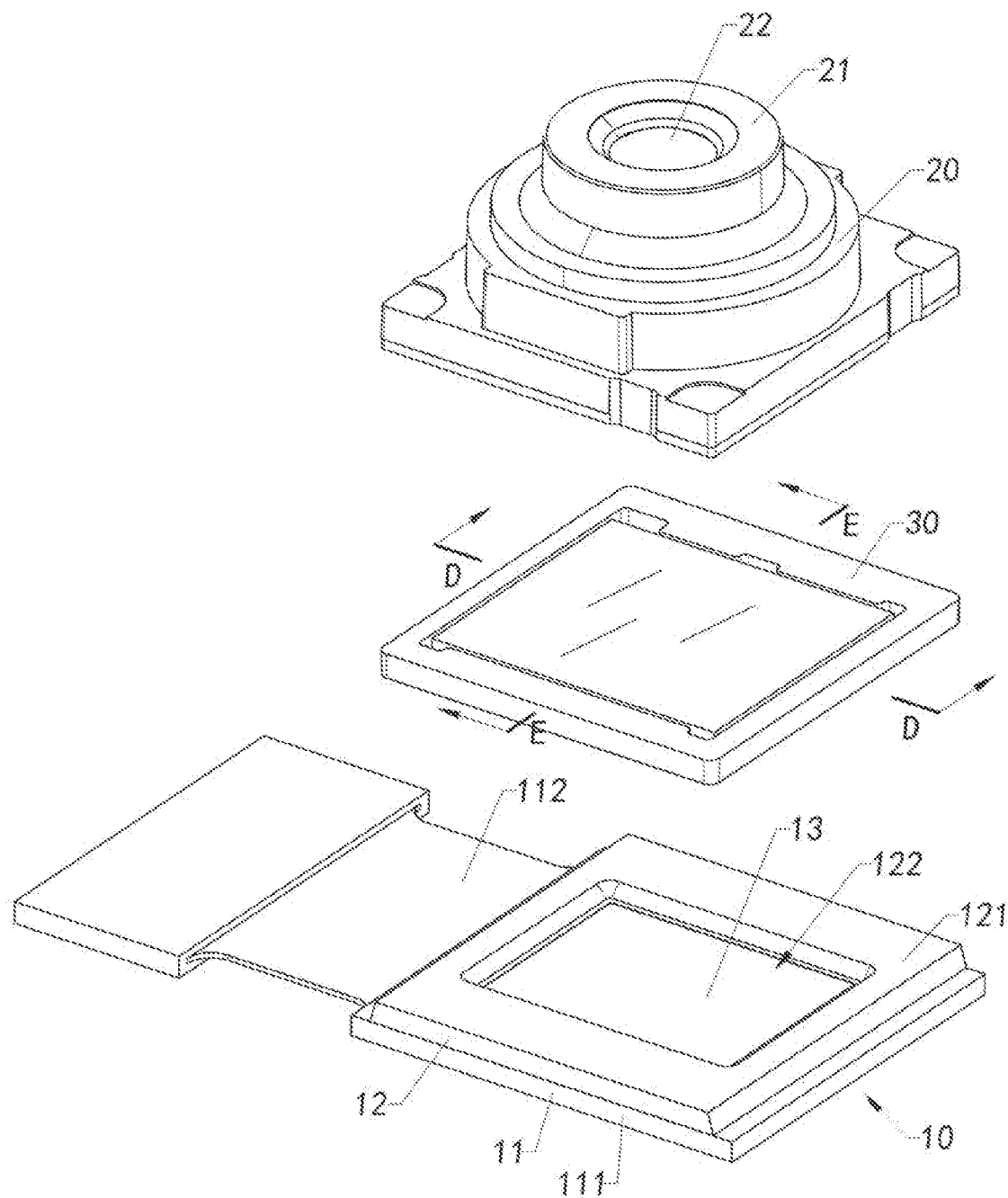
FIG. 12 is a schematic exploded view illustrating the camera module according to the above mentioned first preferred embodiment of the present application.

As shown in FIG. 10, after the molding material 14 is cured to form the one-piece molding base 1200, the demold process of the present application is performed, that is, the die fixing device 230 makes the first die 211 and the second die 212 be separated from each other, so that the light window molding portion 214 is separated from the one-piece molding base 1200, so that the light window 122 corresponding to each of the photosensitive chips 13 is formed in the one-piece molding base 1200.

Figure 4:
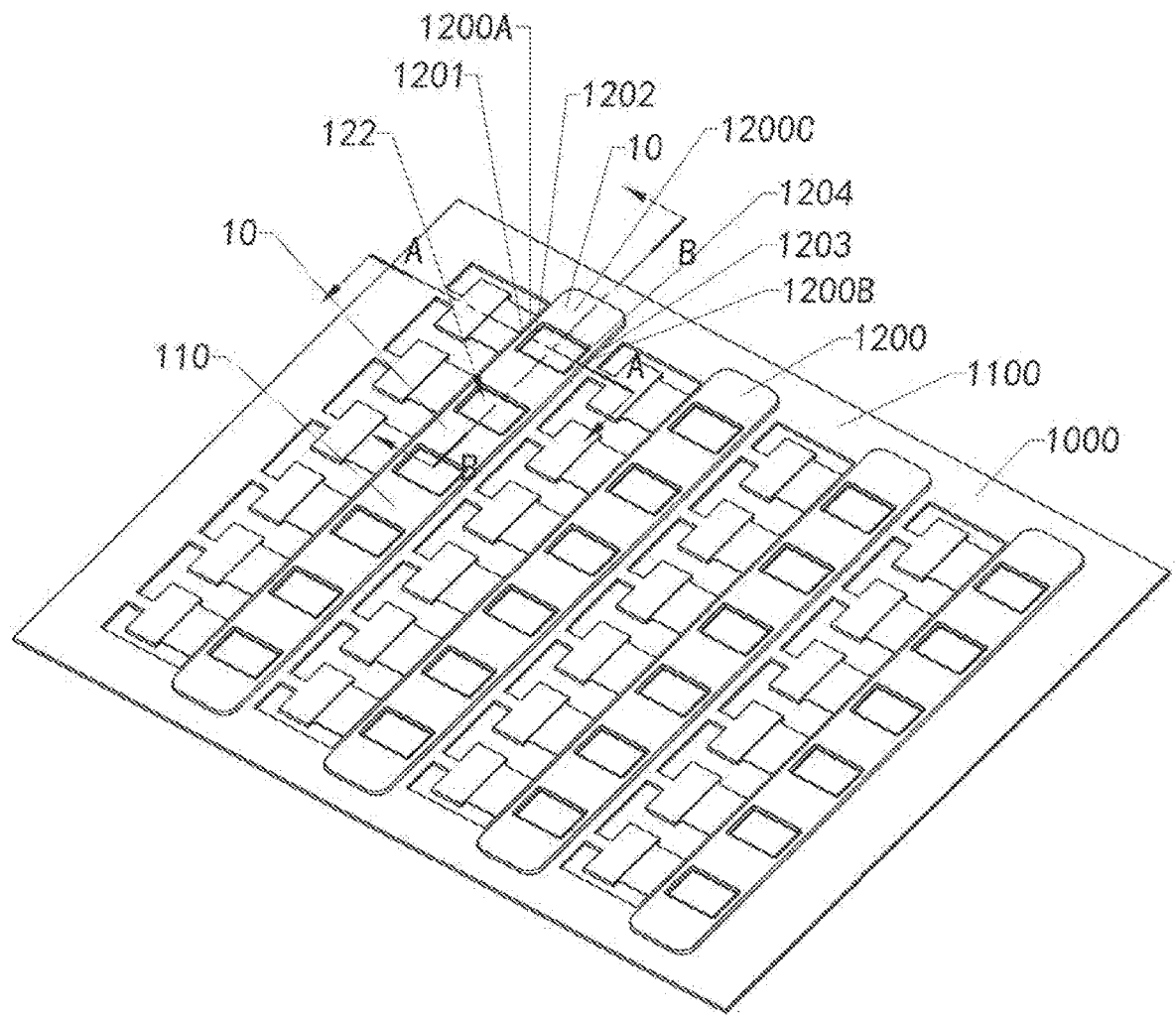
FIG. 4 is a schematic structural view of the photosensitive assembly jointed panel of the camera module according to the first preferred embodiment of the present application.
Figure 5A:
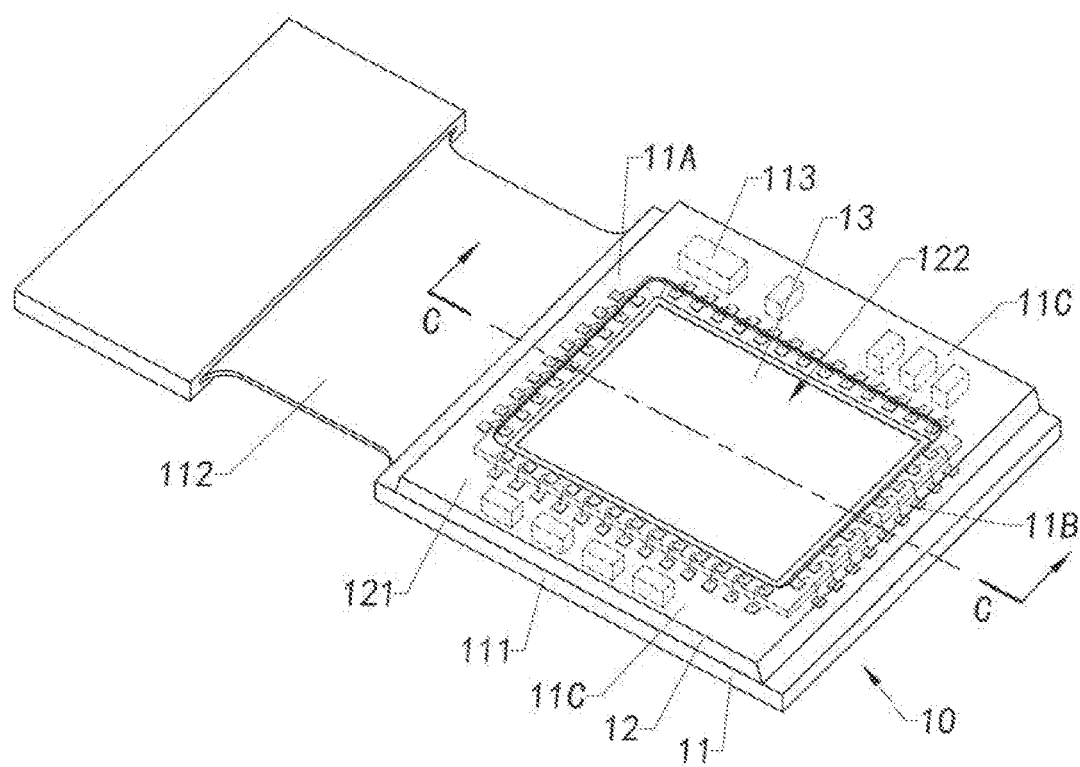
FIG. 5A is an enlarged structural schematic view of the photosensitive assembly of the camera module according to the first preferred embodiment of the present application.
Figure 5B:
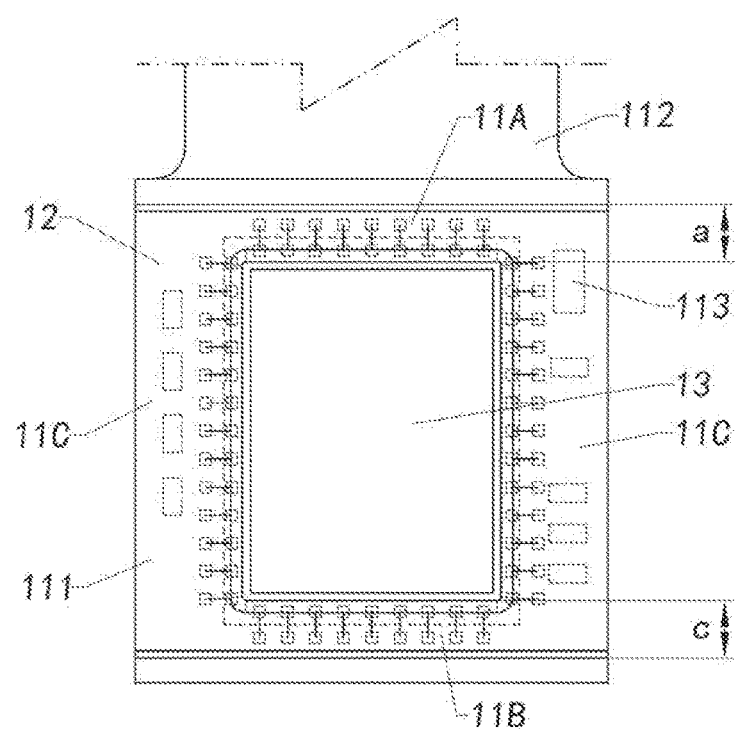
FIG. 5B is an enlarged structural schematic top view of the photosensitive assembly of the camera module according to the first preferred embodiment of the present application.

As shown in FIGS. 4 to 6, the prepared photosensitive assembly jointed panel 1000 can be further cut to obtain a single photosensitive assembly 10. Each of the photosensitive assemblies 10 includes at least one circuit board 11, at least one photosensitive chip 13 and the molding base 12 integrally molded on the circuit board 11 and the photosensitive chip 13. Each of the circuit boards 11 includes a combined rigid region 111 and flexible region 112, that is to say, each of the circuit boards 11 can be implemented as a rigid-flex combined board in this example of the present application. Wherein, the molding base 12 integrally molds the rigid region 111 of the circuit board 11 and at least a part of the non-photosensitive region 132 of the photosensitive chip 13, and forms the light window 122 that provides a light path for the photosensitive region 131 of the photosensitive chip 13.

It is worth mentioning that the manufacturing method of the photosensitive assembly jointed panel 1000 of the present application is suitable for manufacturing the photosensitive assembly 10 with a small dimension. In the molding process, the width of the bottom end of the first diversion groove 2151 is a, and the width of the bottom end of the second diversion groove 2152 is c. The width a corresponds to the width of the bottom end of the first flow guide 2151 adjacent to the position where the rigid region 111 and the flexible region 112 of the circuit board 11 are combined, and the width c corresponds to the width of the bottom end of the second diversion groove 2152 away from the other side of the flexible region 112. When the widths a and c meet the following conditions, that is, 0.2 mm≤a≤1 mm and 0.2 mm≤c≤1.5a, the fluid-like molding material 14 can flows forward along with the first diversion groove 2151 and the second diversion groove 2152 and fills the entire base jointed panel molding guide groove 215 with the molding material 14 before the molding material 14 is cured. It is worth mentioning that 0.7a≤c≤1.3a is more preferred, for example, in some examples, c=0.8a or c=1a or c=1.2a.

Correspondingly, the molding process of the present application yields the photosensitive assembly jointed panel 1000, which includes: one or more rows of the circuit board 11, one or more rows of the photosensitive chip 13, and one or more of a one-piece molding base 1200. Each row of the circuit boards 11 includes one or more of the circuit boards 11 arranged side by side, and each of the circuit boards 11 includes a combined rigid region 111 and flexible region 112. Each of the one-piece molding bases 1200 is integrally molded in a row of the circuit boards 11 and a row of the photosensitive chips 13 and forms the light windows 122 that provide a light path for each of the photosensitive chips 13. Wherein, a distance between the outer edge 1201 and the inner edge 1202 of the portion 1200A of the one-piece molding base corresponding to the first end side of the one-piece molding base 1200 adjacent to the flexible region 112 is a; a distance between the outer edge 1203 and the inner edge 1204 of the portion 1200B of the one-piece molding base corresponding to the opposite second end side of the one-piece molding base 1200 away from the flexible region 112 is c, where 0.2 mm≤a≤1 mm, 0.2 mm≤c≤1.5a. Wherein, the first end side of the one-piece molding base 1200 corresponds to a combined side of the rigid region 111 and the flexible region 112 of the circuit board 11, that is, near the proximal side of the flexible region 112; the second end side of the one-piece molding base 1200 corresponds to the distal end side of the circuit board 11 away from the flexible region 112.

A single of the photosensitive assembly 10 can be obtained after the photosensitive assembly jointed panel 1000 is cut, wherein, in the cutting step, it can be cut on the two wing sides of the one-piece molded base 1200 except for the first end side and the second end side to obtain the molding base 12, and the portion 1200B of the molding base corresponding to the second end side is not cut, so that the photosensitive assembly 10 having the portion 1200C of the one-piece molding base on a pair of opposite wing sides is obtained.

Figure 6A:
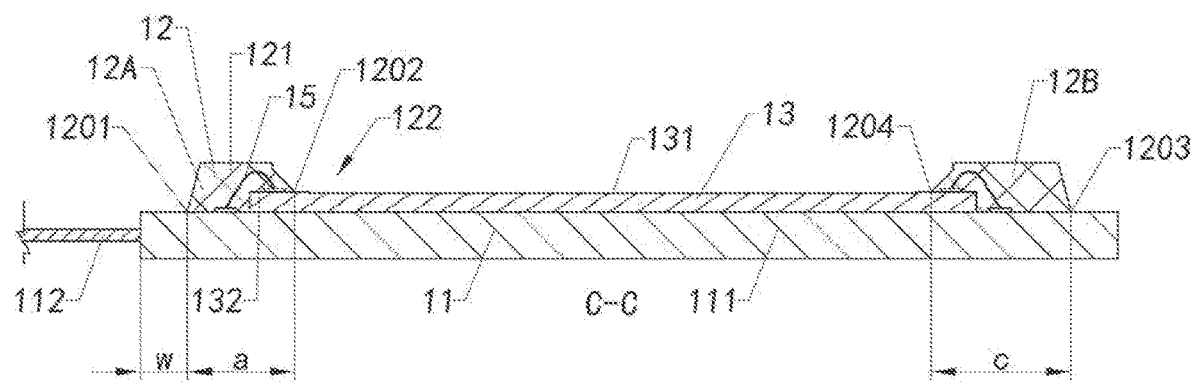
FIG. 6A is a cross-sectional view of the photosensitive module of the camera module according to the above mentioned first preferred embodiment of the present application, taken along the line C-C in FIG. 5A.

As shown in FIG. 6A, correspondingly, the photosensitive assembly 10 includes the circuit board 11, the photosensitive chip 13, and the molding base 12. Wherein, the circuit board 11 includes a combined rigid region 111 and flexible region 112. The molding base 12 is integrally molded on the circuit board 11 and the photosensitive chip 13 and forms the light window 122 that provides a light path for the photosensitive chip 13. The circuit board 11 and the photosensitive chip 13 are connected through a series of connecting wires 15. A distance between the outer edge 1201 and the inner edge 1202 of the portion 12A of the molding base corresponding to the first end side of the molding base 12 adjacent to the flexible region 112 is a; a distance between the outer edge 1203 and the inner edge 1204 of the portion 12B of the molding base portion corresponding to the opposite second end side of the molding base 12 away from the flexible region 112 is c, where 0.2 mm≤a≤1 mm, 0.2 mm≤c≤1.5a.

Figure 6B:
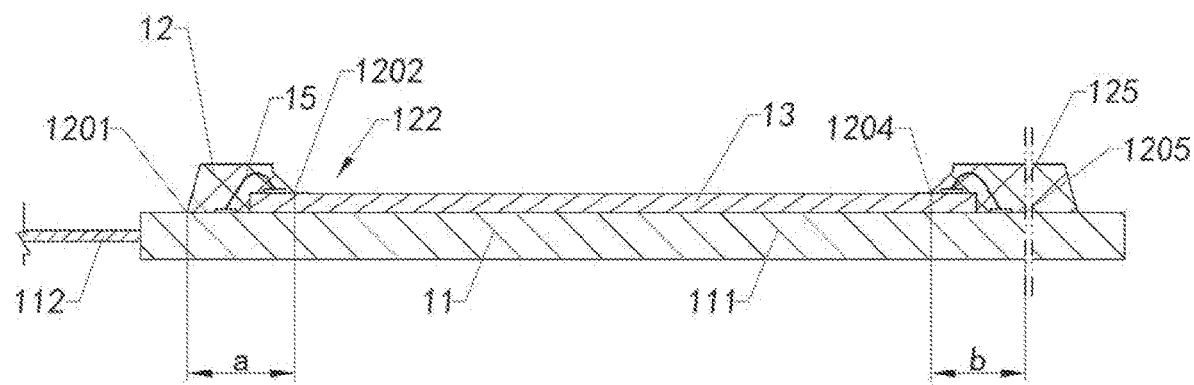
FIG. 6B is a cross-sectional view of a second end side of the photosensitive module of the camera module according to the above mentioned first preferred embodiment of the present application after being further cut.

As shown in FIG. 6B, correspondingly, in order to further reduce the dimension of the photosensitive assembly 10, at least a part of the photosensitive assembly 10 on the opposite second end side of the molding base 12 away from the flexible region 112 is suitable for being removed, such as cutting with a cutting tool, or being abraded, so that a distance between the outer edge 1205 and the inner edge 1204 of the remaining part of the molding base 12 after being cut is b, wherein 0.2 mm≤b≤1.5a-0.2 mm. Wherein, b is reduced relative to c by 0.2 mm, which corresponds to the minimum accuracy of the cutting tool, that is, the cutting dimension limit of the cutting tool enables the molding base 12 to be cut by a portion having a width of approximately 0.2 mm.

Based on the consideration of the small-dimension photosensitive assembly 10, a≤1 mm is selected. And according to actual production experience, when the dimensions of the widths a and c are relatively large, such as when both are larger than 1 mm, the flow velocity and flow rate in the two diversion grooves 2151 and 2152 are sufficient to fill the entire base jointed panel molding guide groove 215 before the molding material 14 is cured.

It is found in actual production that when a<0.2 mm or c<0.2 mm, because the dimensions of the widths a and c are relatively small, the flow velocity and the flow rate of the mold material 14 in the corresponding first diversion groove 2151 and the second diversion groove 2152 are relatively small, so that the base plate molding guide groove 215 cannot be filled with the mold material 14 during the curing time of the molding material.

Wherein, when c>1.5a, that is, when the value of c is greater than 1.5 times the value of a, such as c=1.6a, in actual production, a part of the base jointed panel molding guide groove 215 cannot be filled, resulting in a defective product. Therefore, in this example of the present application, 0.2 mm ≤a≤1 mm and 0.2 mm≤c≤1.5a. The above mentioned dimension range of the widths a and c enables the molding material 14 to fill the base jointed panel molding guide groove 215 in the molding process, thereby avoiding the occurrence of defective products of the photosensitive assembly.

Figure 1C:
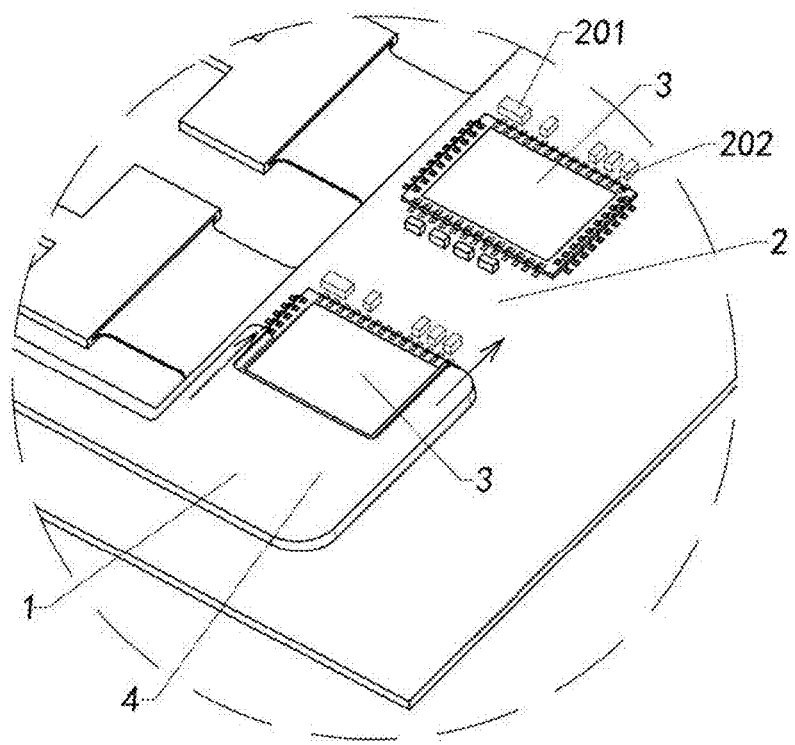
FIG. 1C is an enlarged structure view illustrating the forward flow of the packaging material along with two flow passages in the conventional integrated packaging process.
Figure 1D:
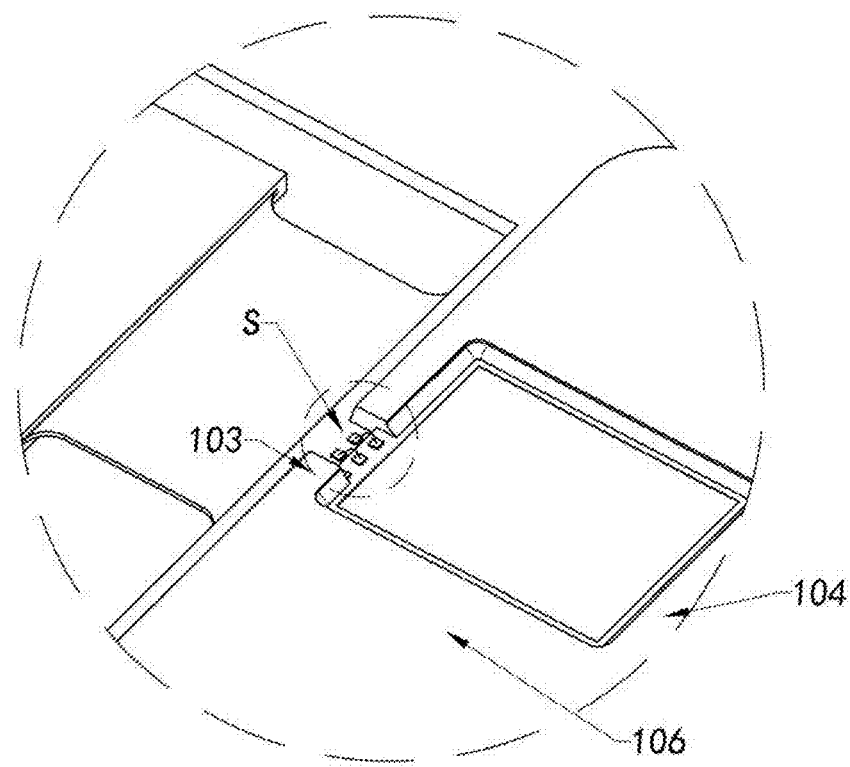
FIG. 1D is an enlarged structure view illustrating that the packaging material is partially not filled with in the conventional integrated packaging process.
Figure 1E:
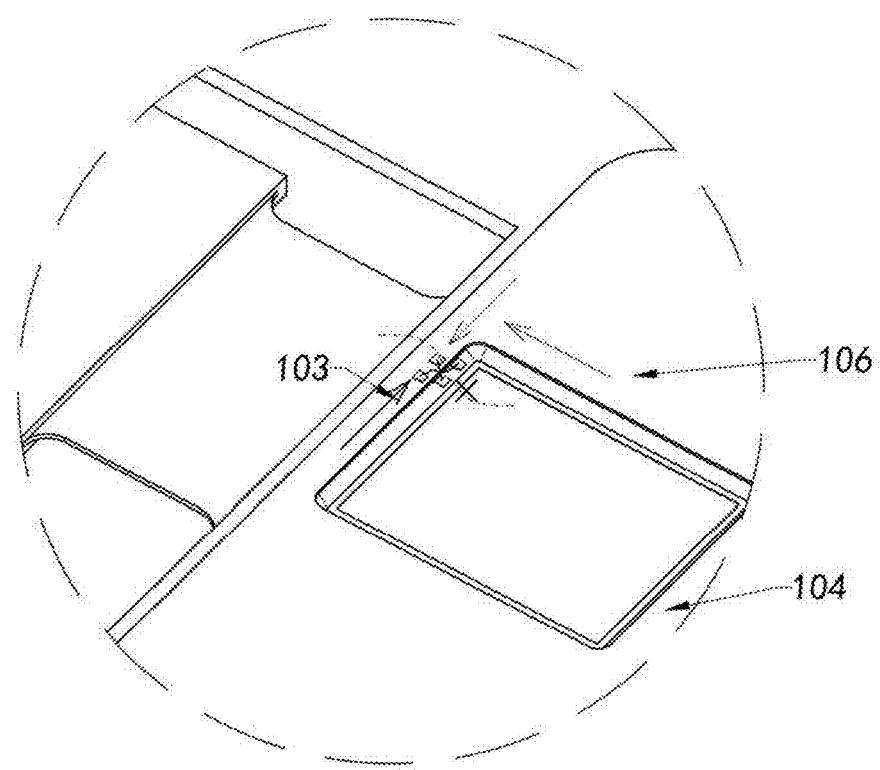
FIG. 1E is an enlarged structure view of damage to lead due to friction between leads in the conventional integrated packaging process.
Figure 1F:
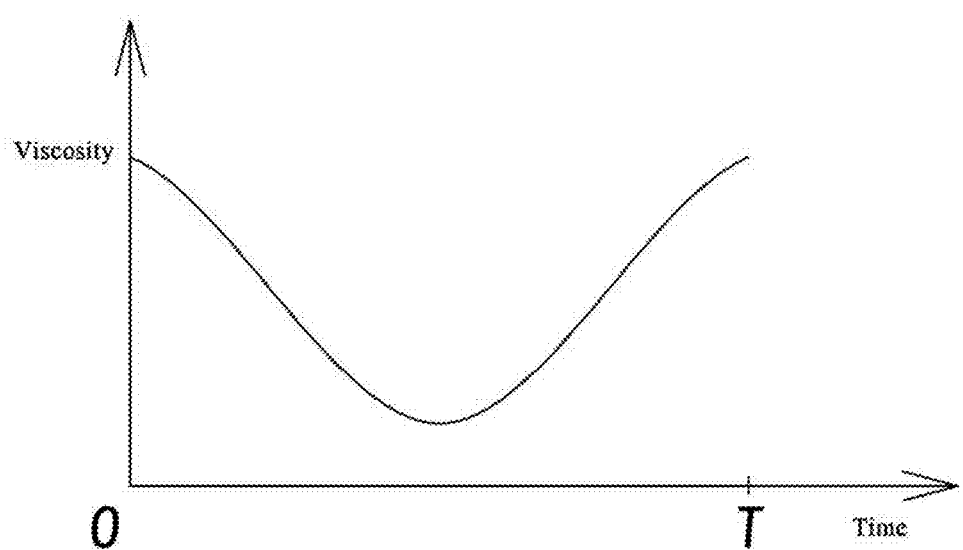
FIG. 1F is a schematic view of a viscosity change tendency of a molding material during curing time.
Figure 2:
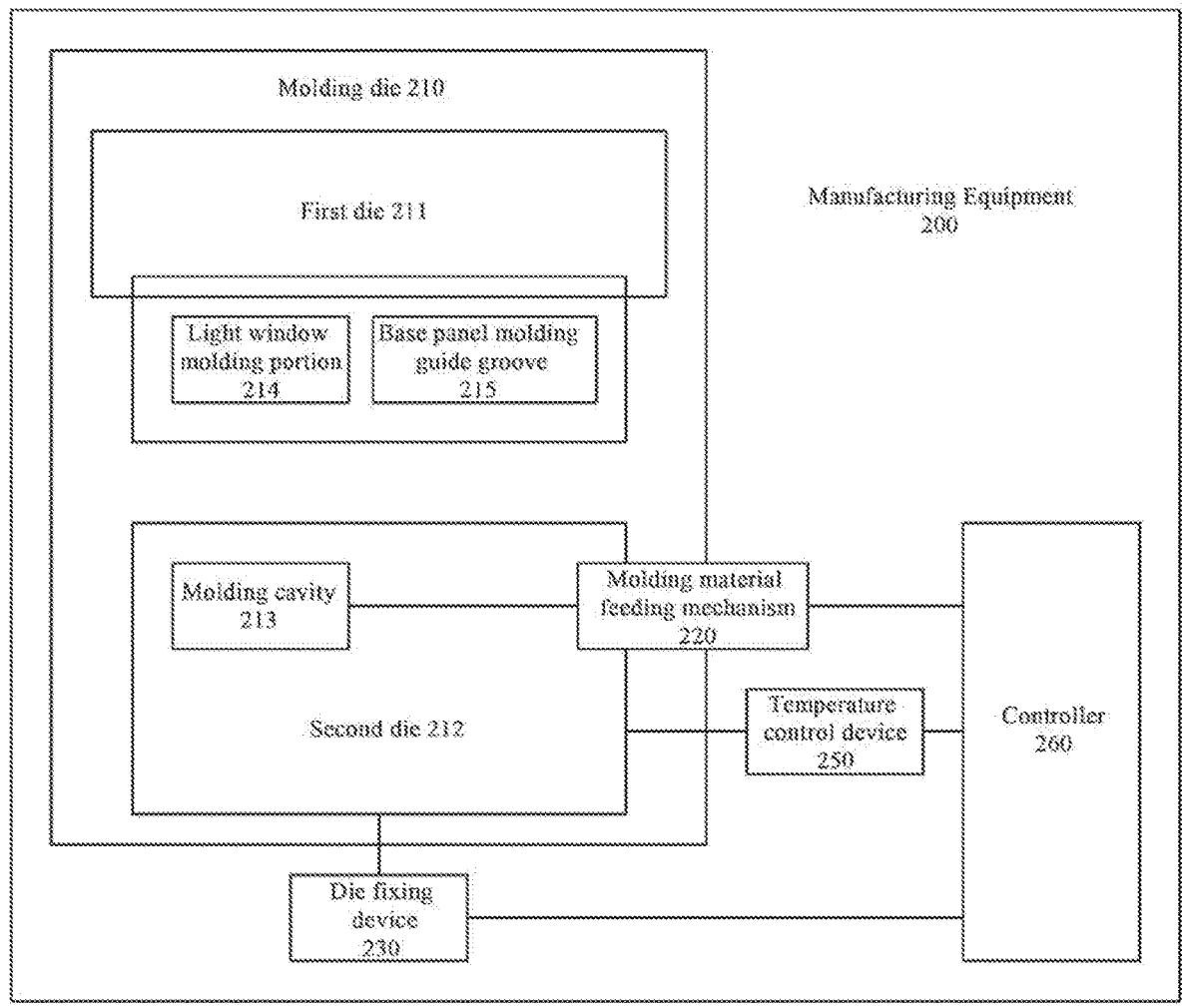
FIG. 2 is a schematic block view of a manufacturing equipment of a photosensitive assembly jointed panel for a camera module according to the first preferred embodiment of the present application.
Figure 3A:
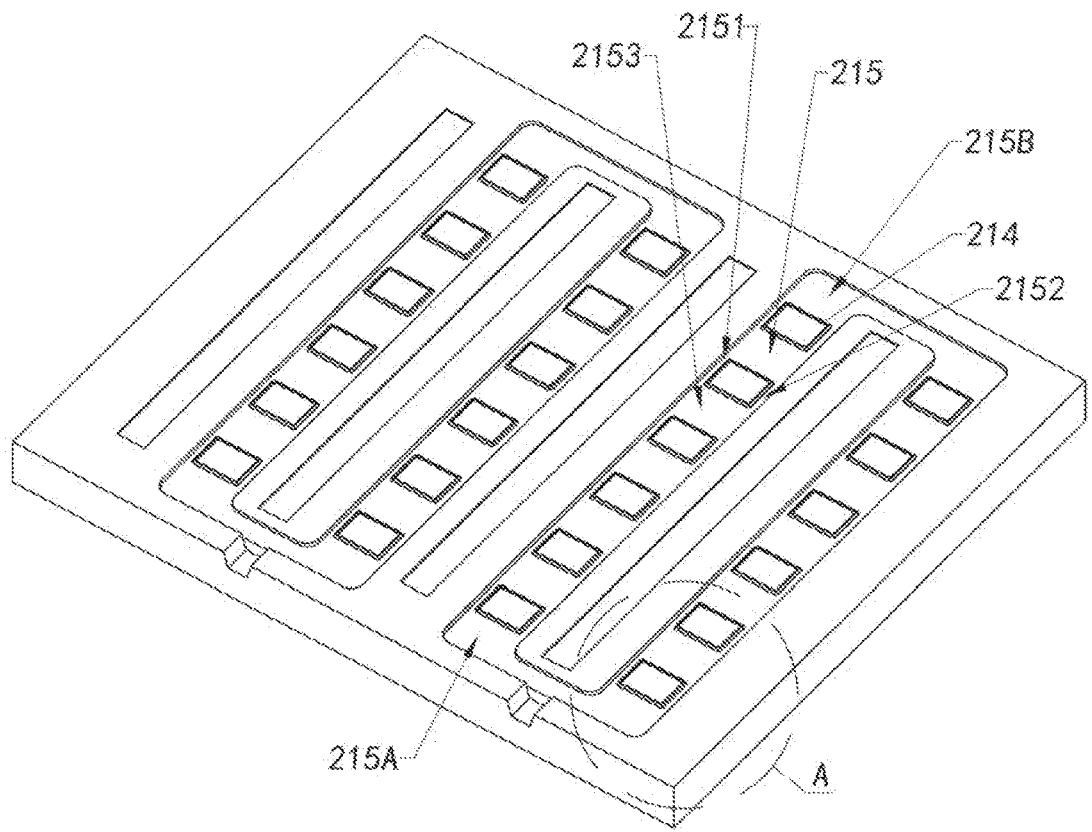
FIG. 3A is a schematic structural view of a molding die of the manufacturing equipment for the photosensitive assembly jointed panel of the camera module according to the above mentioned first preferred embodiment of the present application.
Figure 3B:
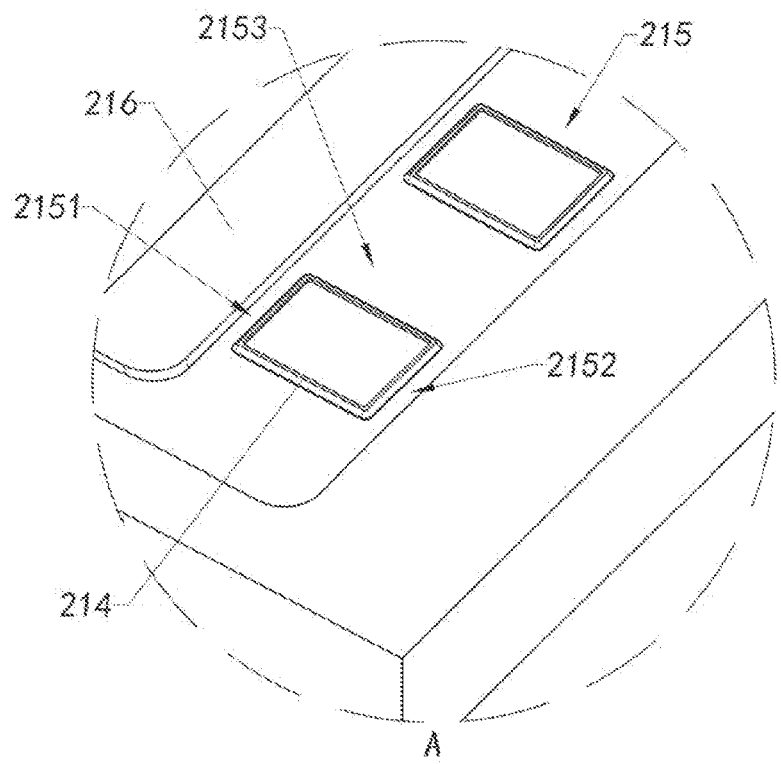
FIG. 3B is an enlarged structural schematic view of a partial region A of a first die of the molding die of the manufacturing equipment of the photosensitive assembly jointed panel of the camera module according to the above mentioned first preferred embodiment of the present application.

In this embodiment of the present application, when 0.2 mm≤a≤1 mm and 0.2 mm≤c≤1.5a, in the molding process, the molding material 14 is capable of forming one-piece molding base 1200 on the circuit board jointed panel 1100, and the one-piece molding base 1200 can form the light window 122 closed all around at the position corresponding to each of the photosensitive chips 13, so that after cutting the formed one-piece photosensitive assembly jointed panel 1200, a molding base 12 having the light window 122 is formed on each circuit board 11 and the corresponding photosensitive chip 13 to prevent a part of the molding base from forming an opening similar to that in FIG. 1C to communicate the light window 122 to the outside of the molding base 12.

That is, the molding material 14 of the present application can flow forward from the feeding ends 215A of the two diversion grooves 2151 and 2152 and fill the diversion grooves 2151 and 2152 and the filling groove 2153 of the entire base jointed panel molding guide groove 215. The molding material 14 can flow along with the two diversion grooves 2151 and 2152 from the feeding end 215A to the terminal end 215B before curing. And before the viscosity of the molding material 14 reaches a high value and is cured, the molding material 14 can fill the base jointed panel molding guide groove 215, thereby preventing the connecting wire 15 between the circuit board 11 and the photosensitive chip 13 from being damaged by the molding material 14 having a high viscosity and flowing forward. And the fluid in the two diversion grooves 2151 and 2152 flows forward at substantially the same step, and the two fluids basically meet in the filling groove 2153 to prevent the molding material 14 in one diversion groove from flowing to the other diversion groove and prevent the molding material 14 in the other diversion groove from flowing forward. Moreover, no turbulence or sinuous flow is generated, which causes the connecting wires 15 connecting the circuit board 11 and the photosensitive chip 13 to swing irregularly, resulting in deformation and damage.

Accordingly, the molding material 14 of the present application can also select a material with a relatively high viscosity range, thereby avoiding that when a material with a small viscosity range is selected, the molding material 14 easily enters into the photosensitive region 131 of the photosensitive chip 13 to form a flash in the molding process.

In addition, it is worth mentioning that, as shown in FIG. 7B, in order to facilitate demold and pressing of the rigid region 111 of the circuit board 11, the first die 211 further includes a plurality of pressing blocks 216. The outer edge 1201 of the molding base 12 and the outer edge of the rigid region 111 of the circuit board 11 will form a pressing edge 1111 with a width of W, that is, in the molding process, it is suitable for the pressing block 216 is pressed on a region of the rigid region 111 of the circuit board 11, for example, the pressing distance W may be 0.1~1 mm, for example, in a specific example, the pressing distance W may be 0.2 mm. The pressing block 216 is further pressed over the flexible region 112 of each row of the circuit boards 11 to prevent the molding material 14 from flowing to the flexible region 112. In addition, the rigid regions 111 of each row of the circuit boards 11 are integrally molded to form an integral rigid region jointed panel 110, thereby facilitating the pressing of the first die to each row of the circuit boards 11.

Accordingly, the present application provides a method for manufacturing the photosensitive assembly 10 of the camera module 100, which includes the following steps:

fixing a circuit board jointed panel 1100 to a second die 212 of a molding die 210, wherein the circuit board jointed panel 1100 includes one or more rows of circuit boards, and each row of circuit boards includes one or more circuit board 11 arranged side-by-side, each of the circuit boards 11 includes a combined rigid region 111 and flexible region 112, and each of the circuit boards 111 is operatively connected to the photosensitive chip 13;

clamping the second die 212 and the first die 211 by the die fixing device 213 and filling the molten molding material 14 in a base jointed panel molding guide groove 215 in the molding die 210, wherein the position corresponding to a light window molding portion 214 is prevented from being filled with the molding material 14;

curing the molding material 14 in the base jointed panel molding guide groove 215 to form a one-piece molding base 1200 at a position corresponding to the base jointed panel molding guide groove 215, wherein the one-piece molding base 1200 is integrally molded on corresponding each row of the circuit boards 11 and each row of the photosensitive chips 13 to form a photosensitive assembly jointed panel 1000 and form a light window 122 at a position corresponding to the light window molding portion 214 to provide a light path for each of the photosensitive chips 13, wherein the base jointed panel molding guide groove 215 has a first diversion groove 2151 corresponding to a first end side of the one-piece molding base 1200 adjacent to the flexible region 112 and a second diversion groove 2152 corresponding to the one-piece molding base 1200 away from the flexible region 112, and a filling grooves 2153 extending between the first diversion groove 2151 and the second diversion groove 2152 for filling the molding material 14 between two adjacent photosensitive chips 13 in each row of the photosensitive chips 13 and located between two adjacent light window molding portions 214, wherein a width of the bottom end of the first diversion groove 2151 is a, and a width of the bottom end of the second diversion groove 2152 is c, wherein the width a corresponds to a distance between an outer edge 1201 and an inner edge 1202 of a portion 1200A of the one-piece molding base of the first end side of the one-piece molding base 1200 adjacent to the flexible region 112; wherein the width c corresponds to a distance between the outer edge 1203 and the inner edge 1204 of a portion 1200B of the one-piece molding base of an opposite second end side of the one-piece molding base 1200 away from the flexible region 112, wherein 0.2 mm≤a≤1 mm, 0.2 mm≤c≤1.5a, and preferably 0.7a≤c≤1.3a, such as c=0.8a or c=1a or c=1.2a, so that the width dimension of first diversion groove 2151 and the second diversion groove 2152 enables the molding material 14 to fill the base jointed panel molding guide groove 215 in the molding process of forming the one-piece molding base 1200, and the molding material 14 can reach the terminal end 215B of the first diversion groove 2151 and the second diversion groove 2152 from the feeding ends 215A of the first diversion groove 2151 and the second diversion groove 2152, respectively;

cutting the photosensitive assembly jointed panel 1000 to obtain a plurality of the photosensitive assemblies 10, wherein each of the photosensitive assemblies 10 includes the circuit board 11, the photosensitive chip 13 and the molding base 12, wherein, the molding base 12 is integrally molded on the circuit board 11 and the photosensitive chip 13 and forms the light window 122 that provides a light path for the photosensitive chip 13.

And, the method may further include a step of cutting a portion of the photosensitive assembly corresponding to the opposite second end side of the molding base 12 away from the flexible region 112, that is, a part of the portion 12B of the molding base and a part of the circuit board 11, so that the molding base 12B has a cutting surface 125 on an opposite second end side away from the flexible region 112, and a distance between the outer edge 1203 and its inner edge 1204 of the remaining part of the molding base is b, where 0.2 mm≤b≤1.5a-0.2 mm.

As shown in FIG. 5A to FIG. 6B, the circuit board 11 includes a plurality of electronic components 113 formed in the rigid region 111 such as mounted by SMT process. The electronic components 113 include, but are not limited to, resistors, capacitors, driving devices, etc. In this embodiment of the present application, the molding base 12 integrally covers the electronic component 113, so as to prevent dust and debris from adhering to the electronic component 113 in similar conventional camera module, and further contaminating the photosensitive chip 13, thereby affecting the imaging effect. In addition, preferably, the plurality of electronic components 113 are provided on a region except for a first end side 11A and a second end side 11B of the rigid region 111 of the circuit board 11 adjacent to the flexible area 112 and away from the flexible area 112, at least one wing side 11C on the rigid region 111 on both sides of the photosensitive assembly 11, wherein the molding base 12 integrally embeds the electronic component 113.

That is, referring to FIGS. 8 and 9, in the first diversion groove 2151 and the second diversion groove 2152, the electronic component 113 is not included, and the electronic component 113 may be centrally provided in the filling groove 2153, so that during the molding process, there will not be any block in the first diversion groove 2151 and the second diversion groove 2152, so as not to affect the molding material 14 flows forward along with the first diversion groove 2151 and the second diversion groove 2152, so that the molding material 14 flows from the feeding end 215A to the terminal end 215B as soon as possible.

It can be understood that the connecting wires 15 may be provided on four sides of the photosensitive chip 13 or may be collectively provided on both wing sides 11C of the rigid region 111 of the circuit board 11, so that they are also concentrated in the filling groove 2153 during the molding process, thereby not affecting the forward flow of the molding material 14 along with the first diversion groove 2151 and the second diversion groove 2152.

As shown in FIGS. 11 to 14, the camera module 100 to which the photosensitive assembly 10 of the present application is applied is illustrated. The camera module 100 includes a photosensitive assembly 10, a lens 20 and a filter assembly 30. The photosensitive assembly 10 includes the circuit board 11, the molding base 12 and the photosensitive chip 13. The lens 20 includes a structural member 21 and one or more lenses 22 accommodated in the structural member 21. The filter assembly 30 includes a filter assembly lens holder 31 and a filter assembly 32. The filter assembly lens holder 31 is assembled on the top side of the molding base 12, and the lens 20 is directly assembled on the top side of the filter assembly lens holder 31 to form a fixed focus camera module. Wherein in this embodiment, the top side of the molding base 12 is a flat surface, the filter assembly lens holder 31 is assembled on the flat top surface of the molding base 12, and the filter assembly 32 plays a role of filtering the light passing through the lens 20, for example, it can be implemented as a filter for filtering infrared rays, which is located between the lens 20 and the photosensitive chip 13.

In this way, the light passing through the lens 30 can pass through the filter assembly 32 and reach the photosensitive chip 13 through the light window 122, so that after the photoelectric conversion effect, the camera module 100 can provide an optical image.

Figure 13A:
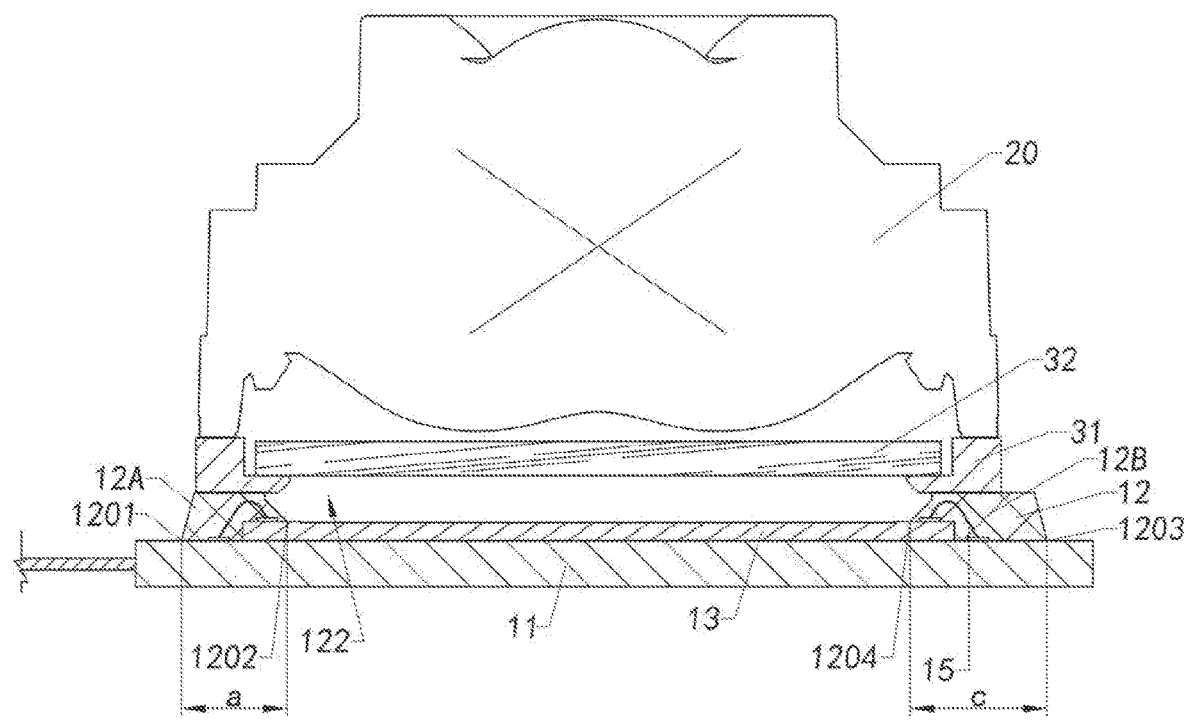
FIG. 13A is a cross-sectional view illustrating the camera module according to the above mentioned first preferred embodiment of the present application, taken along line D-D in FIG. 12.
Figure 13B:
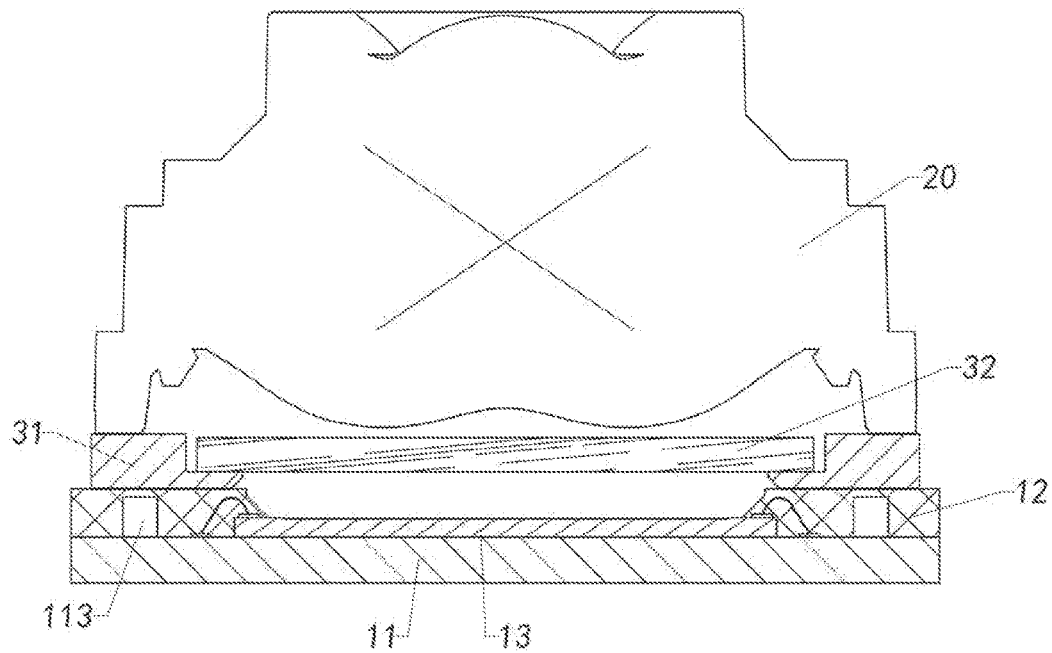
FIG. 13B is a cross-sectional view illustrating the camera module according to the above mentioned first preferred embodiment of the present application, taken along line E-E in FIG. 12.
Figure 14:
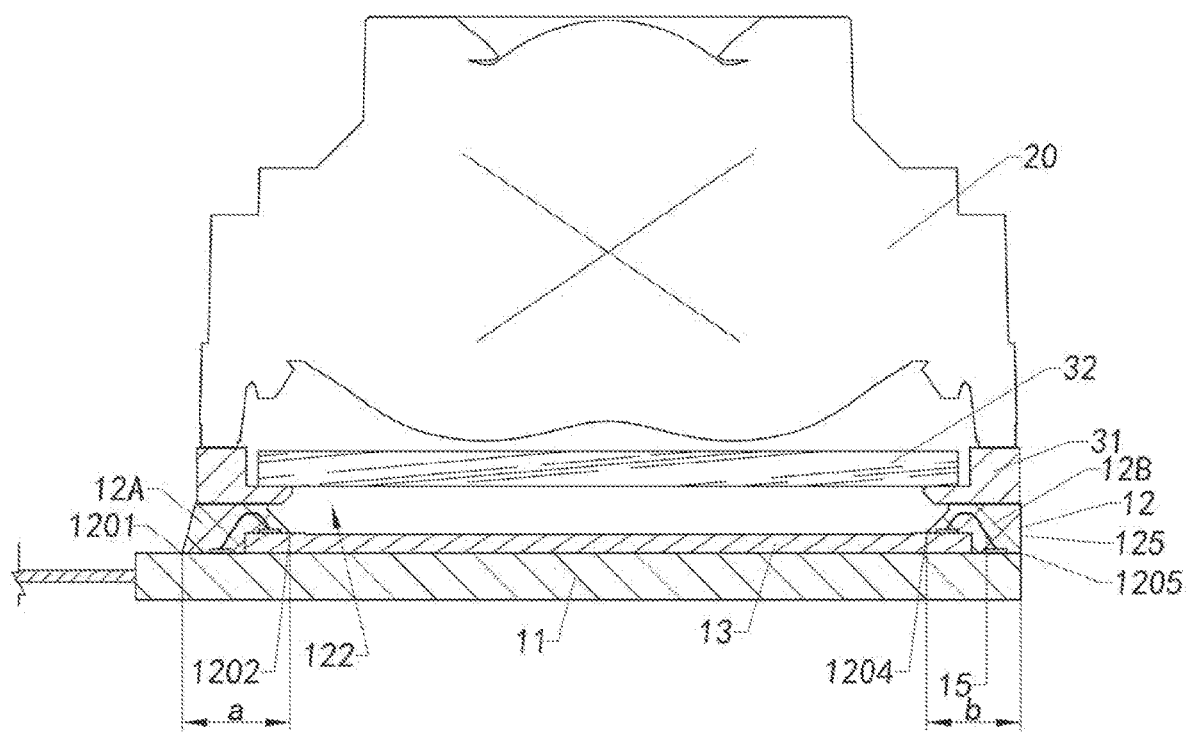
FIG. 14 is a cross-sectional view illustrating a variant embodiment of the camera module according to the above mentioned first preferred embodiment of the present application.

As shown in FIG. 13A, in the photosensitive assembly 10 of the camera module 100, a distance between an outer edge 1201 and an inner edge 1202 of a portion 12A of the molding base corresponding to the first end side of the molding base 12 adjacent to the flexible region 112 is a; and a distance between an outer edge 1203 and an inner edge 1204 of a portion 12B of the molding base corresponding to the opposite second end side of the molding base 12 away from the flexible region 112 is c, where 0.2 mm≤a≤1 mm, 0.2 mm≤c≤1.5a, so that the photosensitive assembly 10 can be obtained in a small dimension, thereby the dimension of the entire camera module 100 is further reduced. It can be understood that the opposite second end side of the molding base 12 away from the flexible region 112 can be further cut, so that the remaining part after the molding base 12 is cut has a cutting surface 125, and the distance between an outer edge and an inner edge thereof is b, where 0.2 mm≤b≤1.5a-0.2 mm, as shown in FIG. 14. In addition, as shown in FIG. 13B, it can be seen that the electronic components 113 may be collectively provided on at least one of the two wing sides of the photosensitive assembly 10, for example, may be concentrated on the two wing sides.

It can be understood that, in another variant embodiment, the filter assembly lens holder 31 may not be provided, and the filter assembly 32 may be directly assembled on the molding base 12, or the filter assembly 32 is assembled on the lens 20, or the filter assembly 32 is assembled to a supporting member such as a driver or a fixed lens barrel of the lens 20.

Figure 15:
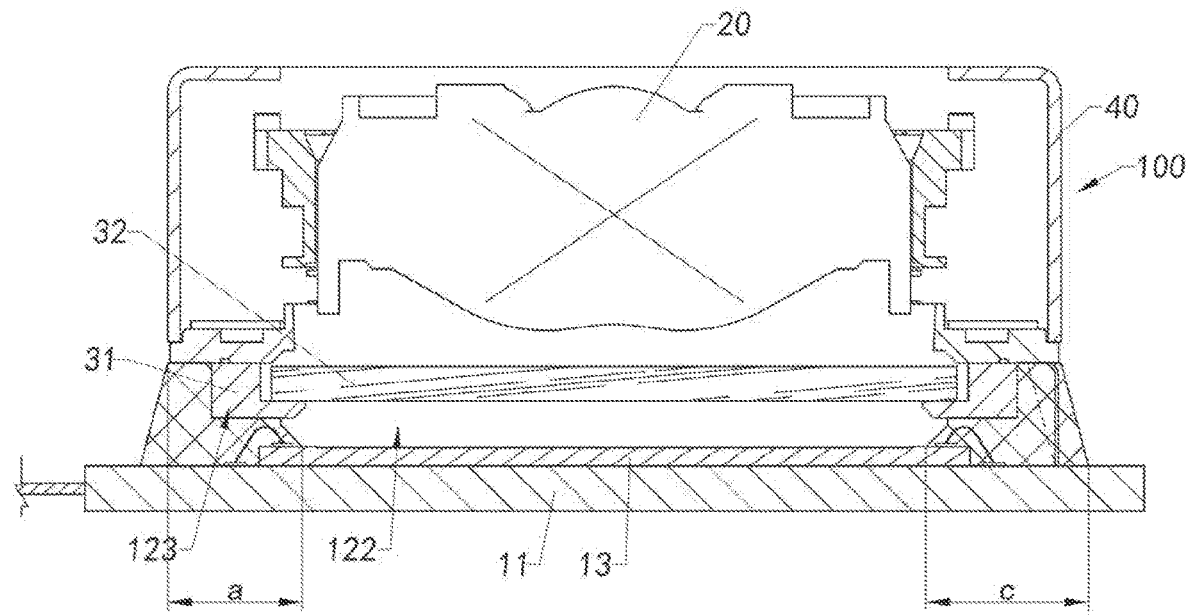
FIG. 15 is a cross-sectional view illustrating a camera module according to another variant embodiment of the camera module of the above mentioned first preferred embodiment of the present application.

As shown in FIG. 15, the camera module 100 may include a supporting member 40, which is a driver or a fixed lens barrel, in this figure, it is a driver such as a voice coil motor, a piezoelectric motor, etc., to form a moving focus camera module. The lens 20 is mounted on the driver. The molding base 12 has a groove 123 on the top side, which can be used to mount the filter assembly lens holder 31, and the driver can be directly mounted on the top side of the molding base 12. It can be understood that, in another variant embodiment, the supporting member 40 may also be mounted on the filter assembly lens holder 31, or a part of the supporting member 40 may be mounted on the filter assembly lens holder 31, and the other part thereof may be mounted on the molding base 12.

Figure 16:
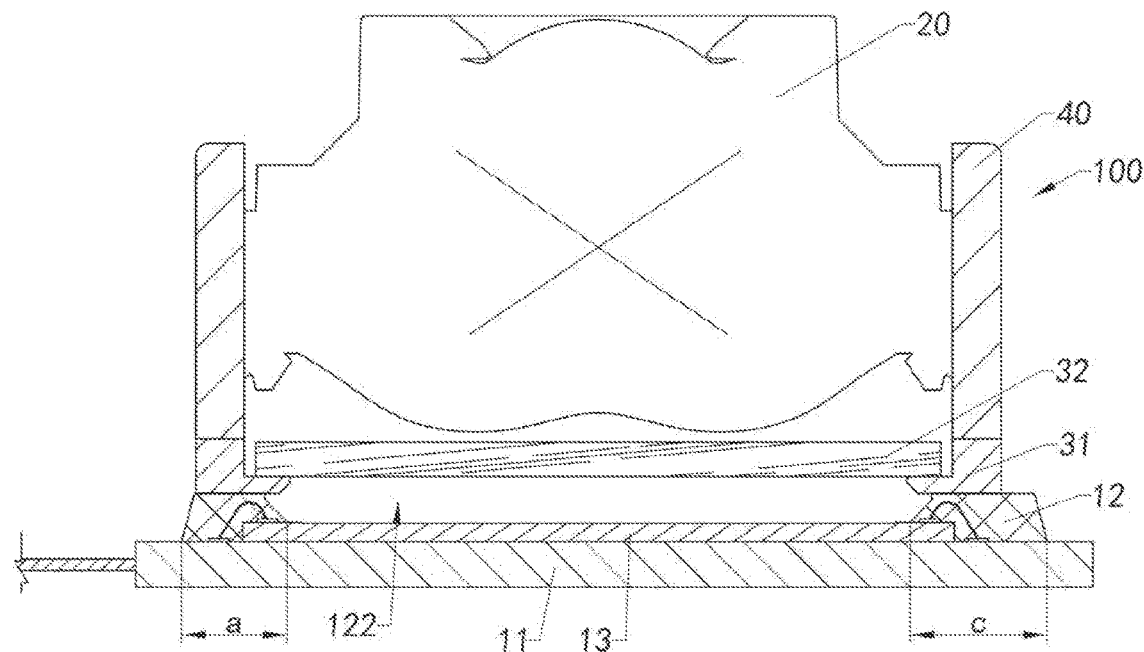
FIG. 16 is a cross-sectional view of a camera module according to another variant embodiment of the camera module of the above mentioned first preferred embodiment of the present application.
Figure 17A:
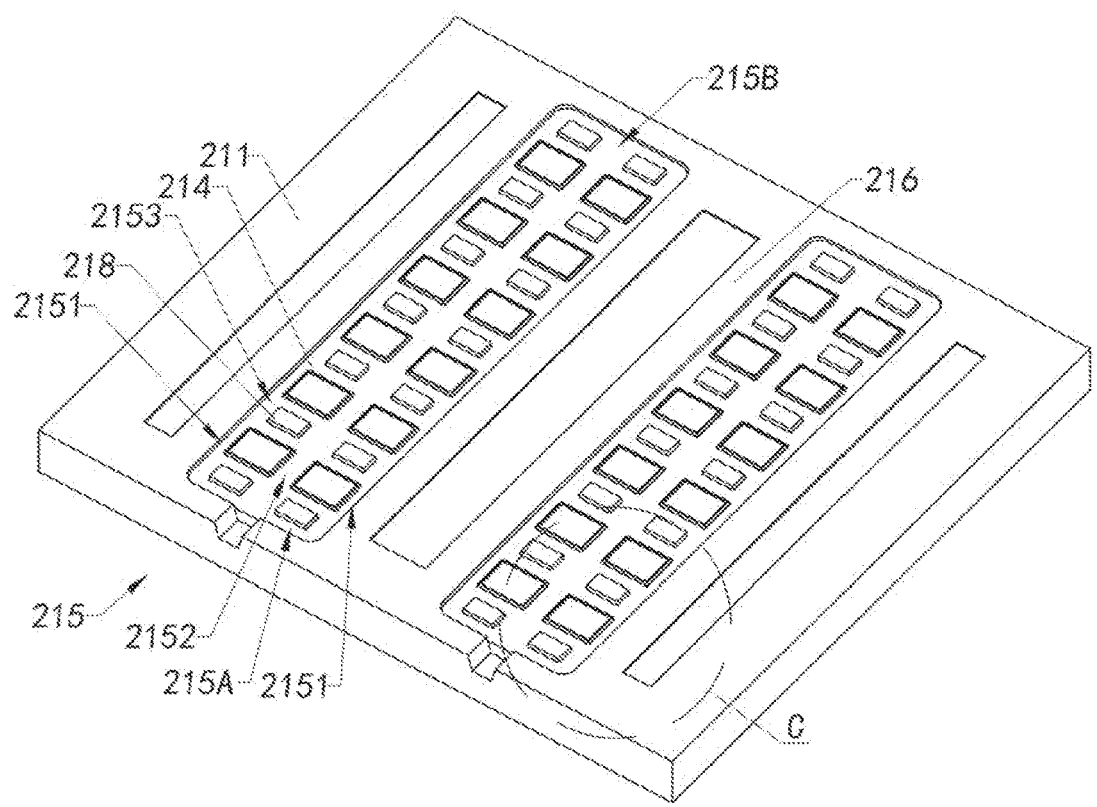
FIG. 17A is a schematic structural view of a molding die of a manufacturing equipment of a photosensitive assembly jointed panel of a camera module according to a second preferred embodiment of the present application.
Figure 17B:
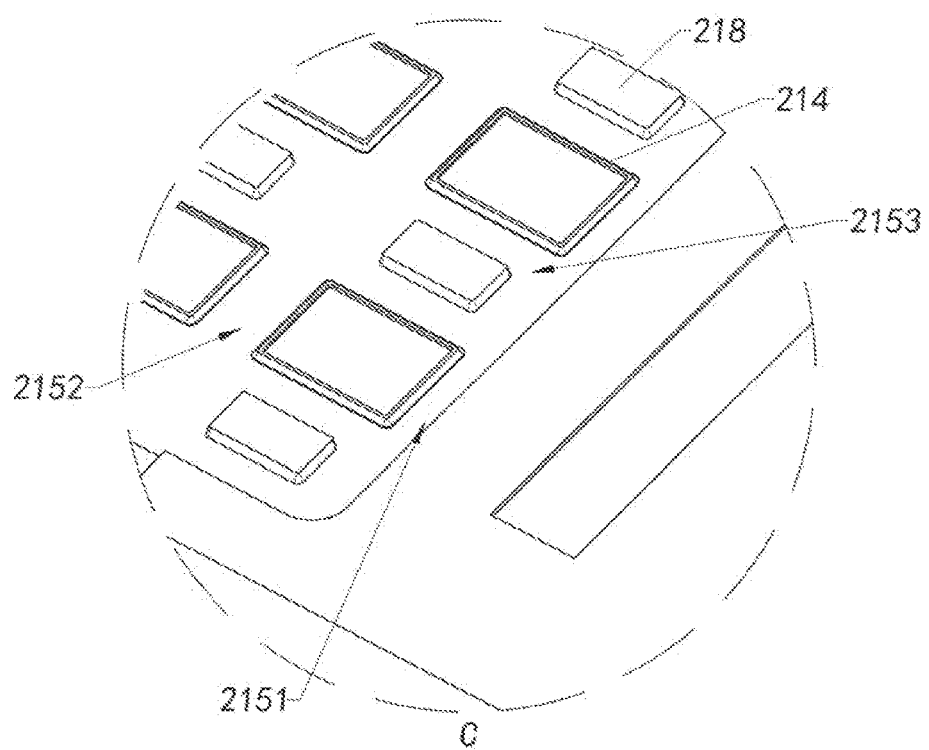
FIG. 17B is an enlarged schematic structural view of a partial region C of a first die of the molding die of the manufacturing equipment of the photosensitive assembly jointed panel of the camera module according to the above mentioned second preferred embodiment of the present application.
Figure 18:
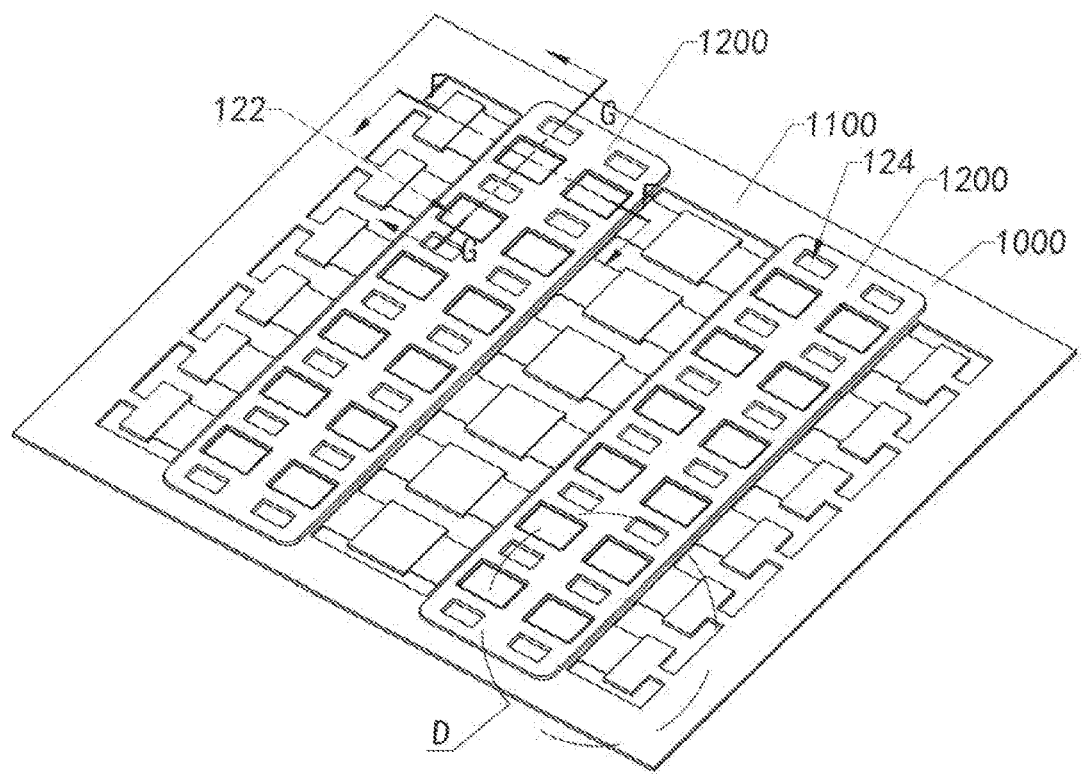
FIG. 18 is a schematic structural view of the photosensitive assembly jointed panel of the camera module according to the above mentioned second preferred embodiment of the present application.
Figure 19A:
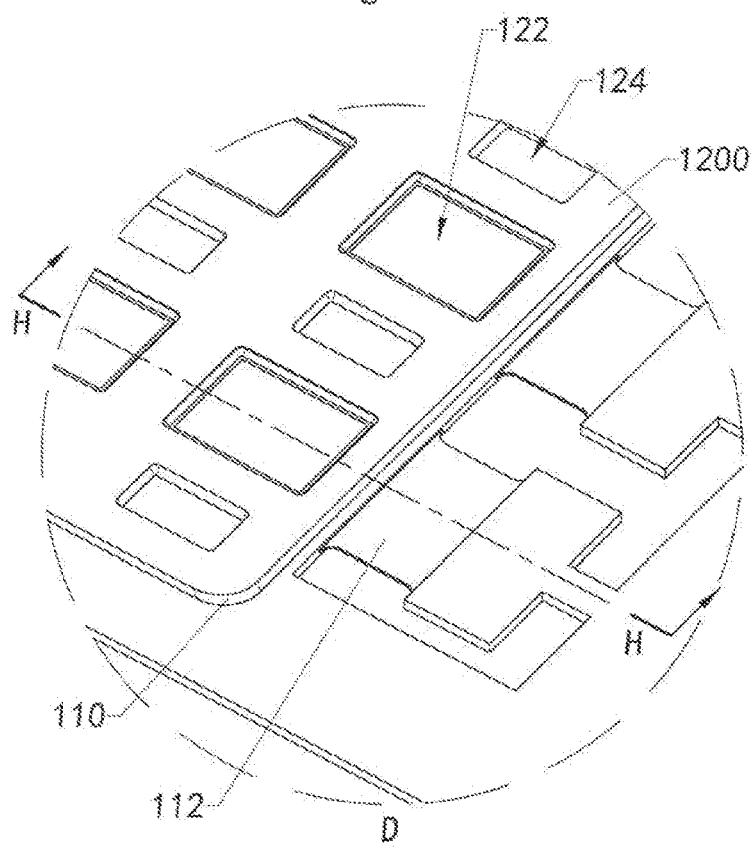
FIG. 19A is an enlarged structural schematic view of D position of the photosensitive assembly jointed panel of the camera module according to the above mentioned second preferred embodiment of the present application.
Figure 19B:
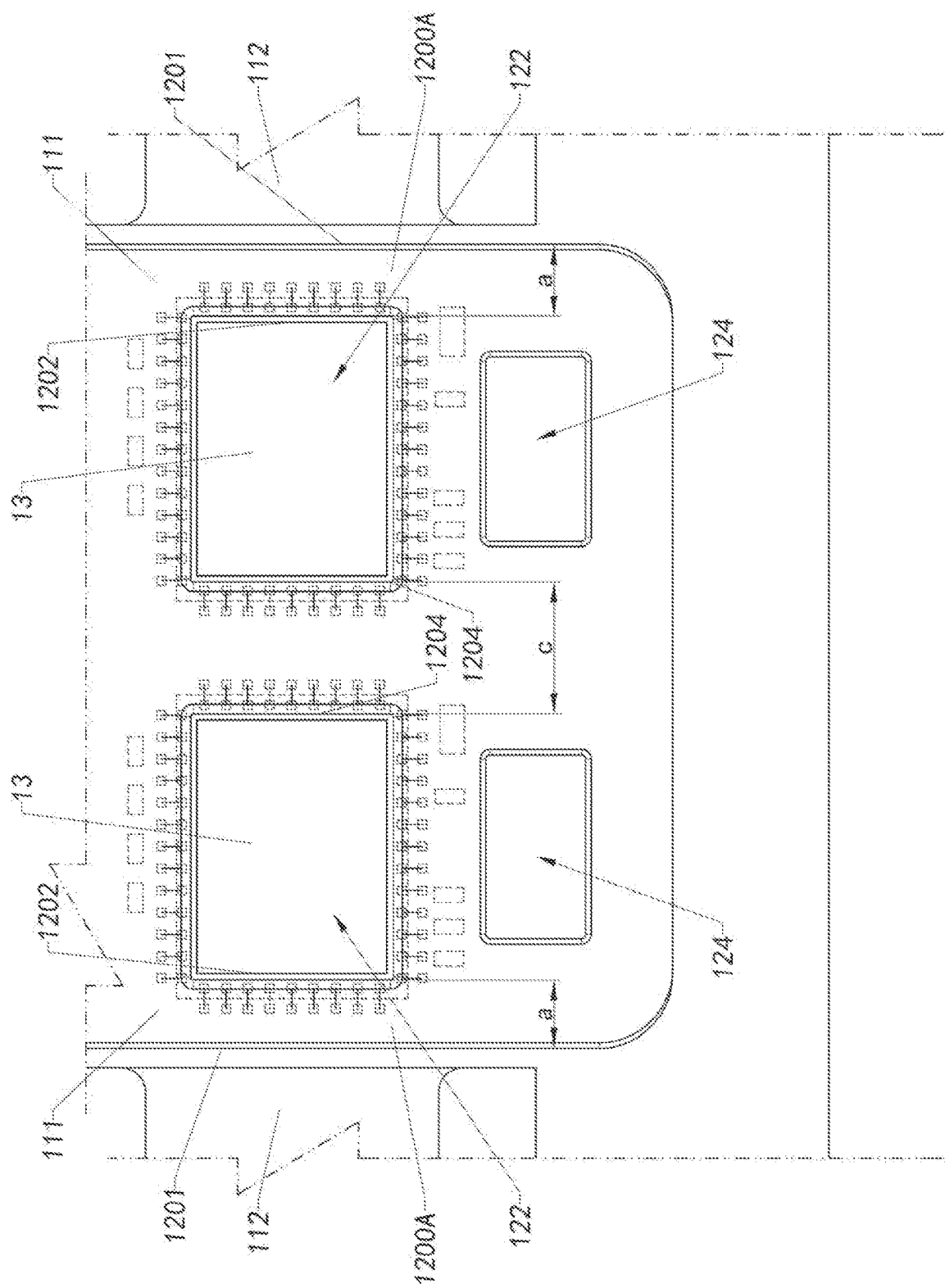
FIG. 19B is an enlarged structural schematic top view of two adjacent photosensitive assemblies of the photosensitive assembly jointed panel of the camera module according to the above mentioned second preferred embodiment of the present application.

As shown in FIG. 16, in this embodiment of the present application and in the drawings, the camera module 100 may include a supporting member 40, which is a fixed lens barrel, and the lens 20 is mounted on the fixed lens barrel. The molding base 12 has a groove 123 on the top side, which can be used to mount the filter assembly lens holder 31, and the fixed lens barrel is mounted on the top side of the molding base 12.

As shown in FIGS. 17A to 24, the photosensitive assembly 10 of the camera module 100 according to a second embodiment of the present application and a manufacturing process thereof are shown. In this embodiment, a photosensitive assembly jointed panel 1000 is also made by a jointed panel operation, and then cut to obtain the photosensitive assembly 10. In the embodiments shown in FIGS. 2 to 16, in a plurality of rows of circuit boards, the rigid regions 111 of one row of circuit boards are arranged adjacent to the flexible regions 112 of the other row of circuit boards. In this embodiment, the two adjacent rows of circuit boards can arrange the rigid regions 111 adjacently, and keep the corresponding flexible regions 112 away from each other. More preferably, the rigid regions 111 of the two adjacent rows of circuit boards are integrally molded, so that the middle of the two adjacent rows of circuit boards forms an integral rigid region.

Accordingly, more specifically, the molding die 210 forms a molding cavity 213 when clamping, and provides a plurality of light window molding portions 214 and one or more base jointed panel molding guide grooves 215, each of the base jointed panel molding guide groove 215 includes a first diversion groove 2151 arranged at two ends in a substantially parallel direction in the longitudinal direction, a second diversion groove 2152 located between two of the first guide grooves 2151, and a plurality of filling grooves 2153 arranged in a horizontal direction extending between the two first diversion grooves 2151 and the second diversion groove 2152, wherein two rows of the filling grooves 2153 extend respectively in the two first diversion grooves 2151 and the second diversion groove 2152.

For example, in this embodiment, the circuit board jointed panel 1100 includes four rows of the circuit boards 11, and two rows of the circuit boards 11 as a group, and the rigid regions 111 of the two rows of the circuit boards 11 of each group of the circuit boards 11 are located in the middle and are integrally molded, for example, each row of the circuit boards 11 has six circuit boards, and their rigid regions 111 are integrally molded. The molding die 210 has two base jointed panel molding guide grooves 215, and each of the base jointed panel molding guide grooves 215 has 7 filling grooves 2153 between each of the first diversion groove 2151 and the second diversion groove 2152, and there are filling grooves 2153 between two adjacent light window molding portions 214. The molding material 14 flows along the two first diversion grooves 2151 and the middle second diversion groove 2152 from the feeding end 215A to the terminal end 215B, and when the dimension and the ratio of the first diversion groove 2151 and the second diversion groove 2152 are within a predetermined range, the molding material 14 can fill each of the filling grooves 2153, so that the molding material 14 forms the one-piece molding base 1200 after being cured.

In this embodiment of the present application, the one-piece molding base 1200 is integrally molded on two adjacent rows of the circuit boards 11 and two adjacent rows of the photosensitive chips 13 to form a photosensitive assembly jointed panel 1000 and form a light window 122 for providing a light path for each of the photosensitive chips 13 at a position corresponding to the light window molding portion 214.

As shown in FIGS. 21A to 24, it is a schematic view of a manufacturing process of the photosensitive assembly jointed panel 1000 of the camera module 100 according to the preferred embodiment of the present application. As shown in FIG. 21A, the molding die 210 is in a clamping state, the circuit board 11 to be molded and the solid molding material 14 are ready to be in place, the solid molding material 14 is heated, thereby when the molding material 14 is melted into a fluid state or a semi-solid and semi-fluid state, it is fed to the base jointed panel molding guide groove 215, and along the first diversion groove 2151 and the second diversion groove 2152 flows forward and fills the filling groove 2153 between two adjacent light window forming portions 214. In addition, in order to make the molding surface of the first die 211 closely adhere to the circuit board 11 and the photosensitive chip 13 and facilitate demold, an elastic film layer 219 is further provided between the molding surface of the first die 211 and the circuit board 11 and the photosensitive chip 13.

Figure 22:
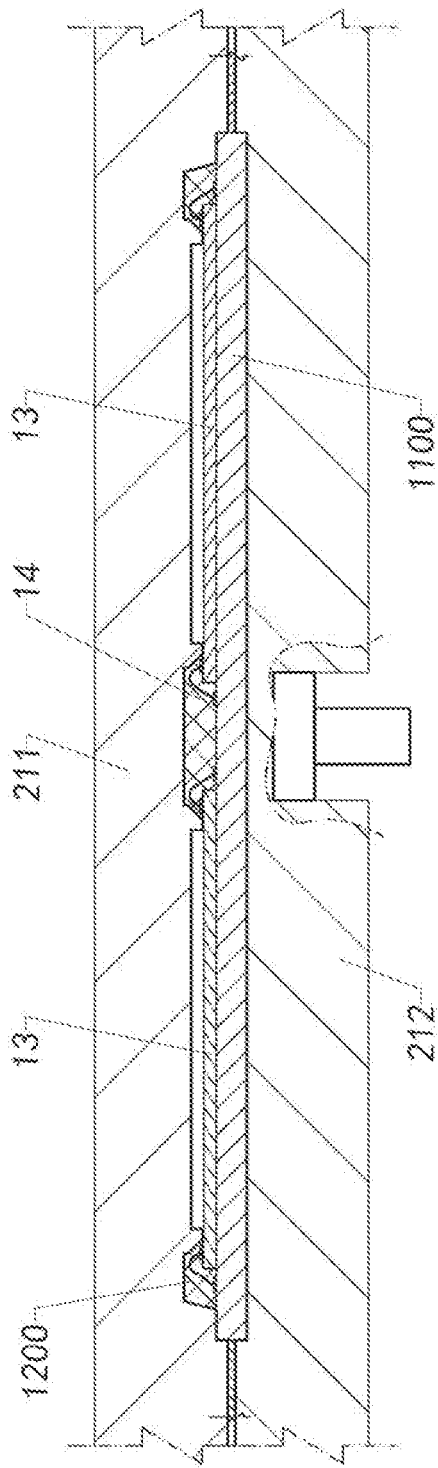
FIG. 22 is a cross-sectional view illustrating a molten molding material being filled in a base jointed panel molding guide groove in the molding die of the photosensitive assembly jointed panel according to the above mentioned second preferred embodiment of the present application, wherein the cross-sectional view is a cross-sectional view corresponding to the direction of the F-F line illustrated in FIG. 18.
Figure 23:
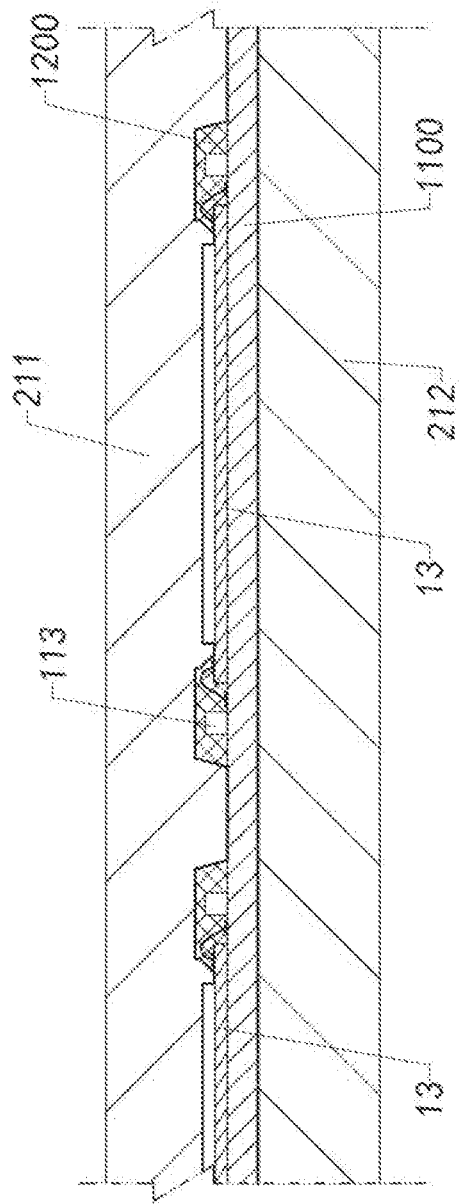
FIG. 23 is a cross-sectional view illustrating a molten molding material being filled in a base jointed panel molding guide groove in the molding die of the photosensitive assembly jointed panel according to the above mentioned second preferred embodiment of the present application, wherein the cross-sectional view is a cross-sectional view corresponding to the direction of the G-G line illustrated in FIG. 18.

As shown in FIGS. 22 and 23, when the two first diversion grooves 2151, the second diversion groove 2152, and the filling groove 2153 of the base jointed panel molding guide groove 215 are all filled with the fluid-like molding material 14, then the fluid-like molding material 14 is cured and molded into the one-piece molding base 120 integrally molded on two adjacent rows of the circuit board 11 and two rows of the photosensitive chips 13 through a curing process.

Figure 24:
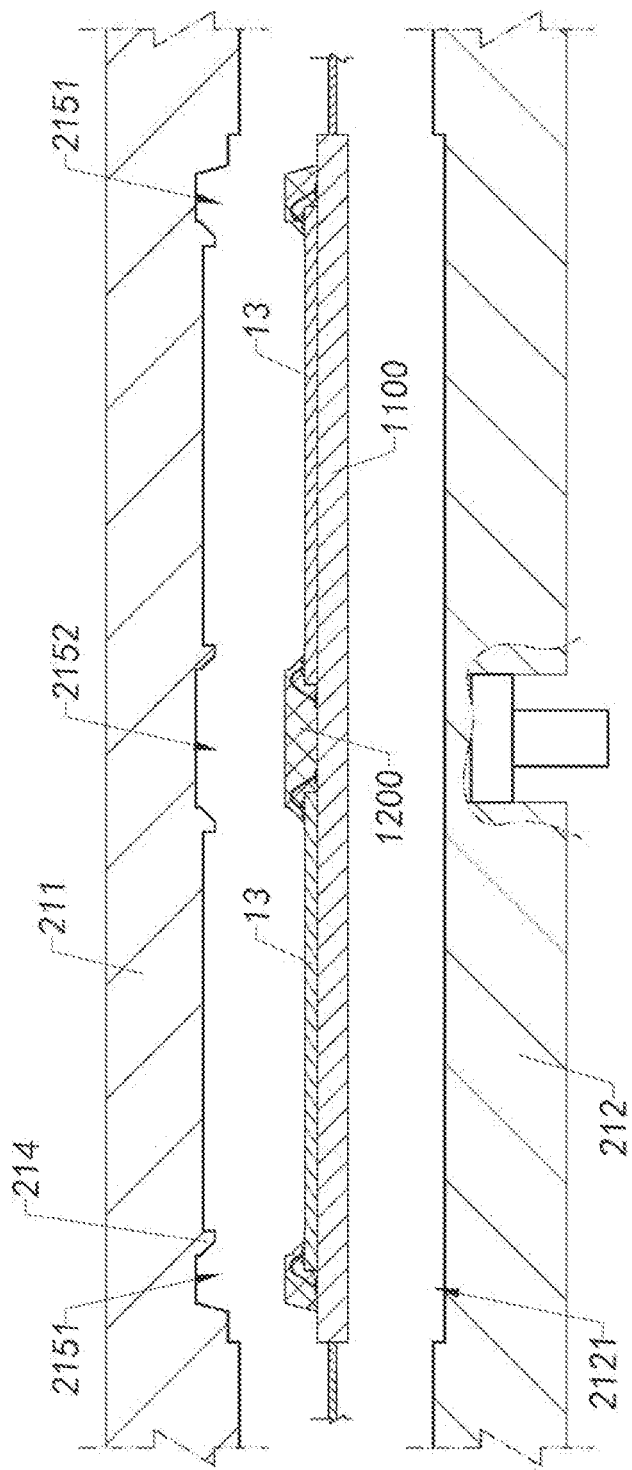
FIG. 24 is a cross-sectional view of performing a demold step to form a one-piece molding base in the molding die of the photosensitive assembly jointed panel according to the above mentioned second preferred embodiment of the present application, wherein the cross-sectional view is a cross-sectional view corresponding to the direction of the F-F line illustrated in FIG. 18.

As shown in FIG. 24, after the molding material 14 is cured to form the one-piece molding base 1200, the demold process of the present application is performed, that is, the die fixing device 230 makes the first die 211 and the second die 212 be far away from each other, so that the light window molding portion 214 is separated from the one-piece molding base 1200, and two rows of the light windows 122 corresponding to each of the photosensitive chips 13 are formed in the one-piece molding base 1200.

As shown in FIG. 20B, the prepared photosensitive assembly jointed panel 1000 can be further cut to obtain a single photosensitive assembly 10. Each of the photosensitive assemblies 10 includes at least one circuit board 11, at least one photosensitive chip 13 and the molding base 12 integrally molded on the circuit board 11 and the photosensitive chip 13. As shown in FIGS. 19A to 20B, the rigid regions 111 integrally molded between the two adjacent rows of the circuit boards 11 are separated, so that each of the circuit boards 11 includes a combined rigid region 111 and flexible region 112. The molding base 12 integrally molds the rigid region 111 of the circuit board 11 and at least a part of the non-photosensitive region 132 of the photosensitive chip 13, and forms the light window 122 that provides a light path for the photosensitive region 131 of the photosensitive chip 13.

It is worth mentioning that when each of the photosensitive assemblies 10 produced by cutting the photosensitive assembly jointed panel 1000 is used to make a moving focus camera module, that is, an autofocus camera module, the molding die 210 further provides with a plurality of driver pin groove molding blocks 218, and each of the driver pin groove molding blocks 218 extends into the filling groove 2153 of the base jointed panel molding guide groove 215, so as not to affect the flow of the molding material 14 in the three diversion grooves 2151, 2152 and 2153, and during the molding process, the fluid-like molding material 14 does not fill the position corresponding to each of the driver pin groove molding blocks 218, so that after the curing step, a plurality of the light windows 122 and a plurality of driver pin grooves 124 are formed in the one-piece molding base 1200 of the photosensitive assembly jointed panel 1000, and the molding base 12 of each of the photosensitive assemblies 10 obtained by cutting is configured with the driver pin groove 124, so that when the moving focus camera module 100 is manufactured, The driver pins can be connected to the circuit board 11 of the photosensitive assembly 10 by means of soldering or conductive adhesive.

It is worth mentioning that the manufacturing method of the photosensitive assembly jointed panel 1000 of the present application is suitable for manufacturing the photosensitive assembly 10 with a small dimension. In the molding process, a width of the bottom end of each of the first diversion grooves 2151 is a, and a width of the bottom end of each of the second diversion grooves 2152 is c. The width a corresponds to the width of the bottom end of the first diversion groove 2151 adjacent to the position where the rigid region 111 and the flexible region 112 of the circuit board 11 are combined, and the width c corresponds to the width of the bottom end of the second diversion groove 2152 on the other side far from the flexible region 112. When the widths a and c meet the following conditions, that is, 0.2 mm≤a≤1 mm and 0.2 mm≤c≤1.5a, the fluid-like molding material 14 can flow forward along with the two outer first guide grooves 2151 and the middle second guide groove 2152 and fills the entire base jointed panel molding guide groove 215 with the molding material 14 before the molding material 14 is cured. It is worth mentioning that 0.7a≤c≤1.3a is more preferred, for example, in some examples, c=0.8a or c=1a or c=1.2a.

Correspondingly, the molding process of the present application obtains the photosensitive assembly jointed panel 1000, which includes: one or more rows of the circuit board 11, one or more rows of the photosensitive chip 13, and one or more of the one-piece molding base 1200. Each row of the circuit boards 11 includes one or more of the circuit boards 11 arranged side by side, and each of the circuit boards 11 includes a combined rigid region 111 and flexible region 112. Each of the one-piece molding bases 1200 is integrally molded in two adjacent rows of the circuit boards 11 and two adjacent rows of the photosensitive chips 13 and forms a light window 122 that provides a light path for each of the photosensitive chips 13, and the two adjacent rows of the circuit boards 11 are arranged such that their flexible regions 112 are away from each other and their rigid regions 11 are adjacent to each other, so that each of the one-piece molding bases 1200 has two end sides adjacent to the flexible region 112; wherein a distance between an outer edge 1201 and an inner edge 1202 of a portion 1200A of the one-piece molding base corresponding to each end side of the one-piece molding base 1200 adjacent to the flexible region 112 is a; the one-piece molding base 1200 extends to a portion 1200B between the two adjacent rows of the photosensitive chips 13, and a distance between two inner edges 1204 thereof is c, wherein 0.2 mm≤a≤1 mm, 0.2 mm≤c≤1.5a. Wherein, each of the end sides of the one-piece molding base 1200 corresponds to a combined side of the rigid region 111 and the flexible region 112 of the circuit board 11, that is, a proximal end side adjacent to the flexible region 112; the distal end side of the one-piece molding base 1200 corresponding to the circuit board 11 away from the flexible region 112 extends between two adjacent rows of the photosensitive chips 13.

After the photosensitive assembly jointed panel 1000 is cut, a single photosensitive assembly 10 can be obtained, wherein, in the cutting step, it can be cut on the other side of the one-piece molding base 1200 except for the portion 1200A of the end side, so that the molding base 12 is obtained, wherein the portions 1200B corresponding to the molding base between two adjacent rows of the photosensitive chips 13 are also cut.

Accordingly, as shown in FIG. 20B, the photosensitive assembly 10 obtained after cutting includes the circuit board 11, the photosensitive chip 13 and the molding base 12. Wherein, the circuit board 11 includes a combined rigid region 111 and flexible region 112. The molding base 12 is integrally molded on the circuit board 11 and the photosensitive chip 13 and forms the light window 122 that provides a light path for the photosensitive chip 13. The circuit board 11 and the photosensitive chip 13 are connected through a series of connecting wires 15. After cutting the photosensitive assembly jointed panel 1000, each of the photosensitive assemblies 10 has a first end side without cutting and a second end side obtained by cutting similarly to the above embodiment. A distance between the outer edge 1201 and the inner edge 1202 of a portion 12A of the molding base corresponding to the first end side of the molding base 12 adjacent to the flexible region 112 is a; the portion 12B of the molding base 12 corresponding to the opposite second end side of the molding base 12 away from the flexible region 112 has a cutting surface 125, and a distance between an outer edge 1205 and an inner edge 1204 thereof is b, wherein 0.2 mm≤a≤1 mm, 0.2 mm≤b≤1.5a-0.2 mm.

Based on the consideration of the small-dimension photosensitive assembly 10, a≤1 mm is selected. And in actual production, it is found that when a<0.2 mm or c<0.2 mm, because the dimensions of the widths a and c are relatively small, the flow velocity and the flow rate of the molding material 14 in the corresponding two first diversion grooves 2151 and the second diversion grooves 2152 are relatively small, so that the base plate molding guide groove 215 cannot be filled with the molding material 14 during the curing time of the molding material. When c>1.5a, that is, when the value of c is greater than 1.5 times of a, in actual production, a part of the base jointed panel molding guide groove 215 cannot be filled, resulting in a defective product. Therefore, in this embodiment of the present application, 0.2 mm≤a≤1 mm and 0.2 mm≤c≤1.5a. The above dimension range of the widths a and c enables the molding material 14 to fill the base jointed panel molding guide groove 215 in the molding process, thereby avoiding the occurrence of defective products of the photosensitive assembly.

That is to say, in this embodiment of the present application, the molding material 14 can flow forward from the feeding ends 215A of the three diversion grooves 2151 and 2152 and fill the diversion grooves 2151 and 2152 and the filling groove 2153 of the entire base jointed panel molding guide groove 215. The molding material 14 can flow from the feeding end 215A to the terminal end 215B along with the three diversion grooves 2151 and 2152 before curing. And before the viscosity of the molding material 14 reaches a high value and is cured, the molding material 14 can fill the base jointed panel molding guide groove 215, thereby preventing the circuit board 11 and the connecting wire 15 between the photosensitive chips 13 is damaged by the molding material 14 with a high viscosity flowing forward. And the fluid in the three diversion grooves 2151 and 2152 flows forward substantially at the same step, so as to prevent the molding material 14 in one diversion groove from flowing to the other diversion groove and obstructing the molding material 14 from flowing forward in the other diversion groove. Moreover, no turbulence or sinuous flow is generated, which causes the connecting wires 15 connecting the circuit board 11 and the photosensitive chip 13 to swing irregularly, resulting in deformation and damage.

As shown in FIG. 21B, in order to facilitate demold and pressing of the rigid region 111 of the circuit board 11, the first die 211 further includes a plurality of pressing blocks 216, and the outer edge 1201 of the molding base 12 and the outer edge of the rigid region 111 of the circuit board 11 will form a pressing edge 1111 with a width of W, that is, in the molding process, the two pressing blocks 216 are pressed on a region of the rigid regions 111 of the two rows of the circuit boards 11, for example, the pressing distance W may be 0.1~1 mm. As in a specific example, the pressing distance W may be 0.2 mm. The two pressing blocks 216 are pressed above each group of the flexible regions 112 of the two adjacent rows of the circuit boards 11 to prevent the molding material 14 from flowing to the flexible regions 112. In addition, the rigid regions 111 of the two adjacent rows of the circuit board 11 are integrally molded to form an integral rigid region jointed panel 110, and the two pressing blocks 216 are respectively pressed on both end sides of the entire rigid region jointed panel 110, so as to facilitate the pressing of the first die 211 to the adjacent two rows of the circuit boards 11.

Accordingly, this embodiment of the present application provides a method for manufacturing the photosensitive assembly 10 of the camera module 100, which includes the following steps:

fixing the circuit board jointed panel 1100 to the second die 212 of the molding die 210, wherein the circuit board jointed panel 1100 includes one or more rows of circuit boards, and each row of circuit boards includes one or more circuit boards 11 arranged side by side, each of the circuit boards 11 includes a combined rigid region 111 and flexible region 112, and each of the circuit boards 11 is operatively connected with the photosensitive chip 13;

clamping the second die 212 and a first die 211 through a die fixing device 213 and filling the molten molding material 14 in a base jointed panel molding guide groove 215 in the molding die 210, wherein the position corresponding to the light window molding portion 214 is prevented from being filled with the molding material 14;

curing the molding material 14 in the base jointed panel molding guide groove 215 to form the one-piece molding base 1200 at a position corresponding to the base jointed panel molding guide groove 215, wherein the one-piece molding base 1200 is integrally molded on two adjacent rows of the circuit boards 11 and two adjacent rows of the photosensitive chips 13 to form a photosensitive assembly jointed panel 1000 and form a light window 122 for providing a light path for each of the photosensitive chips 13 at a position corresponding to the light window molding portion 214, wherein the two adjacent rows of the circuit boards 11 are arranged such that their flexible regions 112 are away from each other and their rigid regions 111 are adjacent to each other, wherein the base jointed panel molding guide groove 215 has two first diversion grooves 2151 corresponding to a two end sides of the one-piece molding base 1200 adjacent to the flexible region 112 and a second guide groove 2152 corresponding to a region between the two adjacent rows of photosensitive chips 13, and a filling grooves 2153 extending between the first diversion groove 2151 and the second diversion groove 2152 for filling the molding material 14 between two adjacent photosensitive chips 13 in each row of the photosensitive chips 13 and located between two adjacent light window molding portions 214, wherein a width of the bottom end of the first diversion groove is a, and a width of the bottom end of the second diversion groove is c, wherein the width a corresponds to a distance between an outer edge 1201 and an inner edge 1202 of a portion 1200A of the one-piece molding base of the each end side of the one-piece molding base 1200 adjacent to the flexible region 112; wherein the width c corresponds to a distance between two inner edges 1204 of a portion 1200B of the one-piece molding base extending between the two adjacent rows of the photosensitive chips 13, wherein 0.2 mm≤a≤1 mm, 0.2 mm≤c≤1.5a.

cutting the photosensitive assembly jointed panel 1000 to obtain a plurality of the photosensitive assemblies 10, wherein each of the photosensitive assemblies 10 includes the circuit board 11, the photosensitive chip 13 and the molding base 12, wherein, the molding base 12 is integrally molded on the circuit board 11 and the photosensitive chip 13 and forms the light window 122 that provides a light path for the photosensitive chip 13.

And, the method may further include the step of cutting a portion of the photosensitive assembly 10 located between the two adjacent rows of the photosensitive chips 13 to obtain a portion 12B of the molding base corresponding to the opposite other end side of the molding base 12 away from the flexible region 112, and making a distance between an outer edge 1205 and an inner edge 1204 thereof be b, where 0.2 mm≤b≤1.5a-0.2 mm. That is, the molding base 12 of the photosensitive assembly 10 between the two adjacent rows of the photosensitive chips 13 and the rigid region 111 of the circuit board 11 are adapted to be cut, so that the distal sides of the two adjacent rows of the photosensitive assemblies 10 away from the flexible region 112 are cutting sides, and form cutting surfaces 125 respectively.

The circuit board 11 includes a plurality of electronic components 113 formed in the rigid region 111, such as mounted by an SMT process, in corresponding two of the first diversion grooves 2151 and the second diversion grooves 2152, there is no the electronic component 113, the electronic component 113 can be centrally provided in the filling groove 2153, so that in the molding process, there will be no obstruction in the two first diversion grooves 2151 and the second diversion groove 2152, so that the molding material 14 will not be affected to flow forward along with two first diversion grooves 2151 and the second diversion groove 2152, so that the molding material 14 flow from the feeding end 215A to the terminal end 215B in a relatively short time as soon as possible.

In the step of manufacturing a single photosensitive assembly 10, the photosensitive assembly jointed panel 1000 may be cut to obtain a plurality of independent photosensitive assemblies 10 for manufacturing a single camera module. It is also possible to cut and separate two or more of the photosensitive assemblies 10 integrally connected from the photosensitive assembly jointed panel 1000 to be used to make a separate array camera module, that is, each of the camera modules of the array camera modules each have independent photosensitive assemblies 10, wherein two or more of the photosensitive assemblies 10 can be respectively connected to a control board of the same electronic device, so that an array camera module made by two or more of the photosensitive assemblies 10 can transmit the images captured by the multiple camera modules to the control board for image information processing.

Figure 25A:
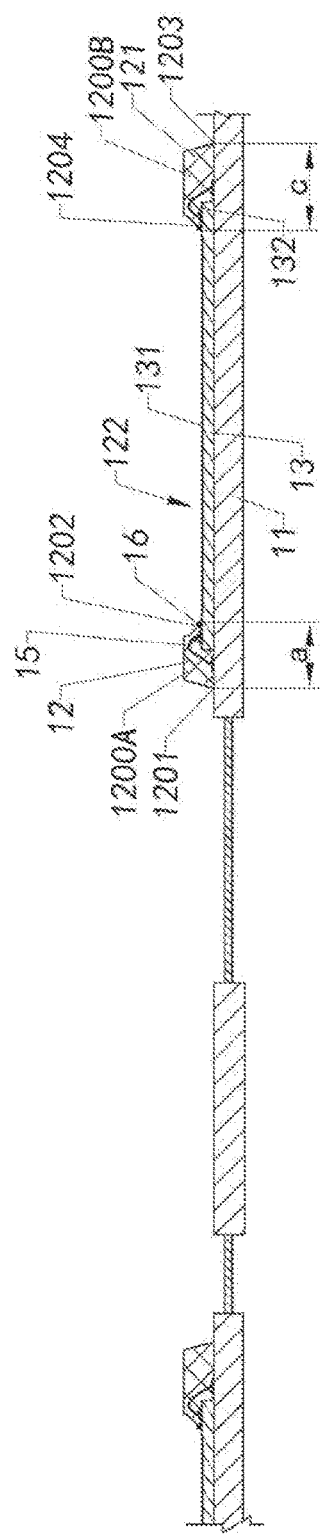
FIG. 25A to 25C are schematic cross-sectional views of a photosensitive assembly jointed panel according to a variant embodiment of the above mentioned first and second preferred embodiments of the present application, and enlarged structural views of the photosensitive assembly obtained by cutting the photosensitive assembly jointed panel.

As shown in FIG. 25A, the photosensitive assembly 1000 according to another variant embodiment based on the first embodiment of the present application, which includes the photosensitive assembly 1000 obtained by the inventive molding process, including: one or more rows of the circuit board 11, one or more rows of the photosensitive chips 13, one or more rows of the protective frame 16, and one or more of the one-piece molding base 1200. Each row of the circuit boards 11 includes one or more of the circuit boards 11 arranged side by side, and each of the circuit boards 11 includes a combined rigid region 111 and flexible region 112. Each of the protective frames 16 is formed in the photosensitive chip 13 and is located in the non-photosensitive region 132 of the photosensitive chip 13, that is, it is located outside the photosensitive region 131, and each of the one-piece molding bases 1200 is integrated molded on a row of the circuit boards 11, a row of the photosensitive chips 13, and a row of the protective frames 16 and forms the light windows 122 that provide a light path for each of the photosensitive chips 13.

That is to say, before the one-piece molding base 1200 is molded, the protective frame 16 is formed on each of the photosensitive chips 13 in advance, which may be formed of another material different from the molding material 14, for example, it may be glue applied to the non-photosensitive region 132 of the photosensitive chip 13, or it may be a rigid frame and attached to the non-photosensitive region 132 of the photosensitive chip 13 by glue. Therefore, in the process of molding and forming the one-piece molding base 1200, the light window molding portion 214 is pressed on the protective frame 16 having a predetermined hardness, when the fluid-like molding material 14 enters the base jointed panel molding guide groove 215, the fluid-like molding material 14 can be prevented from flowing into the photosensitive region 131 of the photosensitive chip 13, thereby forming a molding flash. For example, in a specific example, the protective frame 16 is formed of glue, which has a predetermined elasticity and hardness, and can be further implemented to be still sticky after curing, so as to be used for adhering dust particles in the photosensitive assembly 10 of the obtained camera module. More specifically, in some embodiments, the Shore hardness of the protective frame 16 ranges from A50 to A80, and the elastic modulus ranges from 0.1 Gpa to 1 Gpa.

Similarly, a distance between the outer edge 1201 and the inner edge 1202 of a portion 1200A of the one-piece molding base corresponding to the first end side of the one-piece molding base 1200 adjacent to the flexible region 112 Is a; a distance between an outer edge 1203 and an inner edge 1204 of a portion 1200B of the one-piece molding base corresponding to the opposite second end of the one-piece molding base 1200 away from the flexible region 112 is c, wherein $0.2 \text{ mm} \le a \le 1 \text{ mm}$, $0.2 \text{ mm} \le c \le 1.5a$. Wherein, the first end side of the one-piece molding base 1200 corresponds to a combined side of the rigid region 111 and the flexible region 112 of the circuit board 11, that is, near the proximal side of the flexible region 112; the second end side of the one-piece molding base 1200 corresponds to the distal end side of the circuit board 11 away from the flexible region 112.

Figure 25B:
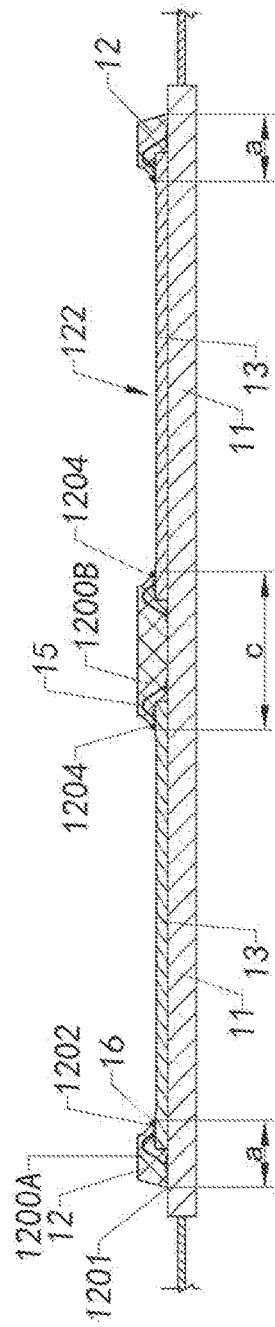
Figure 25C:
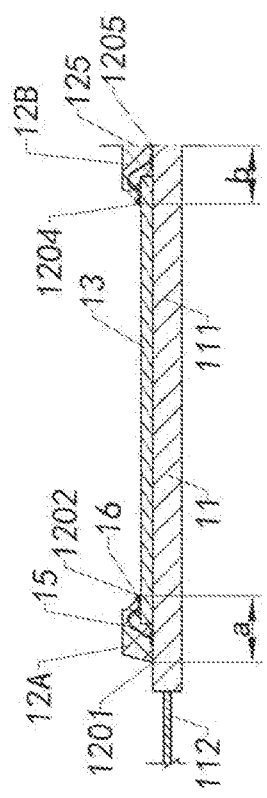

After the photosensitive assembly jointed panel 1000 is cut, a single photosensitive assembly 10 can be obtained, as shown in FIG. 25C, wherein in the cutting step, it can be cut on the one-piece molding base 1200 except for the two wing sides of the first end side and the second end side to obtain the molding base 12, and the portion 1200B of the molding base corresponding to the second end side is not cut, so that the photosensitive assembly 10 having a portion 1200C of the one-piece molding base on a pair of opposite wing sides is obtained.

Accordingly, the photosensitive assembly 10 includes the circuit board 11, the photosensitive chip 13, the protective frame 16, and the molding base 12. The circuit board 11 includes a combined rigid region 111 and flexible region 112. The molding base 12 is integrally molded on the circuit board 11, the photosensitive chip 13 and the protective frame 16 and forms the light window 122 that provides a light path for the photosensitive chip 13. The circuit board 11 and the photosensitive chip 13 are connected through a series of connecting wires 15. The protection frame 16 may be located at inner side of the connection wire 15, or may embed at least a part of the connection wire 15. A distance between the outer edge 1201 and the inner edge 1202 of a portion 12A of the molding base corresponding to the first end side of the molding base 12 adjacent to the flexible region 112 is a; a distance between the outer edge 1203 and the inner edge 1204 of a portion 12B of the molding base corresponding to the opposite second end side of the molding base 12 away from the flexible region 112 is c, where $0.2 \text{ mm} \le a \le 1 \text{ mm}$, $0.2 \text{ mm} \le c \le 1.5a$.

As shown in FIG. 25C, correspondingly, in order to further reduce the dimension of the photosensitive assembly 10, at least a part of the photosensitive assembly 10 of the opposite second end side of the molding base 12 away from the flexible region 112 is suitable for being removed to form a cutting surface 125, so that a distance between the outer edge 1205 and the inner edge 1204 of the remaining part of the molding base 12 after being cut is b, where $0.2 \text{ mm} \le b \le 1.5a - 0.2 \text{ mm}$.

As shown in FIG. 25B, the photosensitive assembly jointed panel 1000 obtained by a molding process according to the variant embodiment of the above-mentioned second example of the present application, which includes: one or more rows of the circuit boards 11, one or more rows of the photosensitive chips 13, one or more rows of protective frames 16, and one or more of the one-piece molding base 1200. Each of the protective frames 16 is formed on the corresponding photosensitive chip 13. Each row of the circuit boards 11 includes one or more of the circuit boards 11 arranged side by side, and each of the circuit boards 11 includes a combined rigid region 111 and flexible region 112. Each of the one-piece molding bases 1200 is integrally molded in two adjacent rows of the circuit boards 11, two adjacent rows of the photosensitive chips 13, and two adjacent rows of the protective frames 16 and form a light window 122 that provides a light path for each photosensitive chip 13, and the two adjacent rows of the circuit boards 11 are arranged such that its flexible regions 112 are far away from each other and its rigid regions 11 are adjacent to each other, so that each of the one-piece molding bases 1200 has two end sides adjacent to the flexible region 112; wherein, a distance between an outer edge 1201 and an inner edge 1202 of a portion 1200A of the one-piece molding base corresponding to each end side of the one-piece molding base 1200 adjacent to the flexible region 112 is a; the one-piece molding base 1200 extends between the two adjacent rows of the photosensitive chips 13 and a distance between the two inner edges 1204 thereof is c, wherein $0.2 \text{ mm} \le a \le 1 \text{ mm}$, $0.2 \text{ mm} \le c \le 1.5a$. Wherein, each of the end sides of the one-piece molding base 1200 corresponds to a combined side of the rigid region 111 and the flexible region 112 of the circuit board 11, that is, a proximal end side adjacent to the flexible region 112; the one-piece molding base 1200 corresponds to the distal side of the circuit board 11 away from the flexible region 112 and extends between two adjacent rows of the photosensitive chips 13.

After the photosensitive assembly jointed panel 1000 is cut, a single photosensitive assembly 10 can be obtained, and in the cutting step, the other side of the one-piece molding base 1200 except for portion 1200A of the end side can be cut, so that the molding base 12 is obtained, wherein a portion 1200B corresponding to the molding base between two adjacent rows of the photosensitive chips 13 are also cut, so that the photosensitive assembly 10 having the portion 1200C of the one-piece molding base on a pair of opposite wing sides is obtained. A distance between an outer edge 1201 and an inner edge 1202 of a portion 12A of the molding base corresponding to the first end side of the molding base 12 adjacent to the flexible region 112 is a; the portion 12B of the molding base corresponding to the opposite second end side of the molding base 12 away from the flexible region 112 has a cutting surface 125 and a distance between an outer edge 1205 and an inner edge 1204 thereof is b, wherein $0.2 \text{ mm} \le a \le 1 \text{ mm}$, $0.2 \text{ mm} \le b \le 1.5a - 0.2 \text{ mm}$, as shown in FIG. 25C.

Figure 26A:
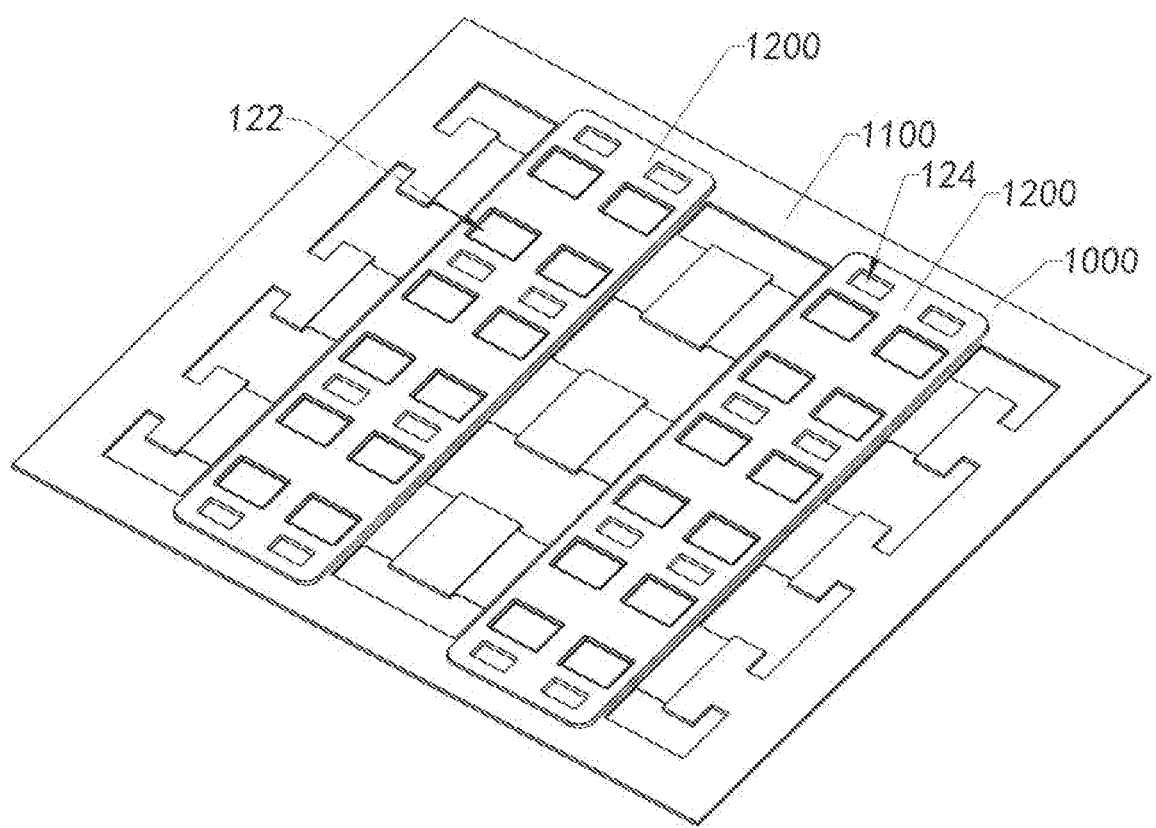
FIG. 26A is a schematic structural view illustrating a photosensitive assembly jointed panel according to another variant embodiment of the above mentioned second preferred embodiment of the present application.
Figure 26B:
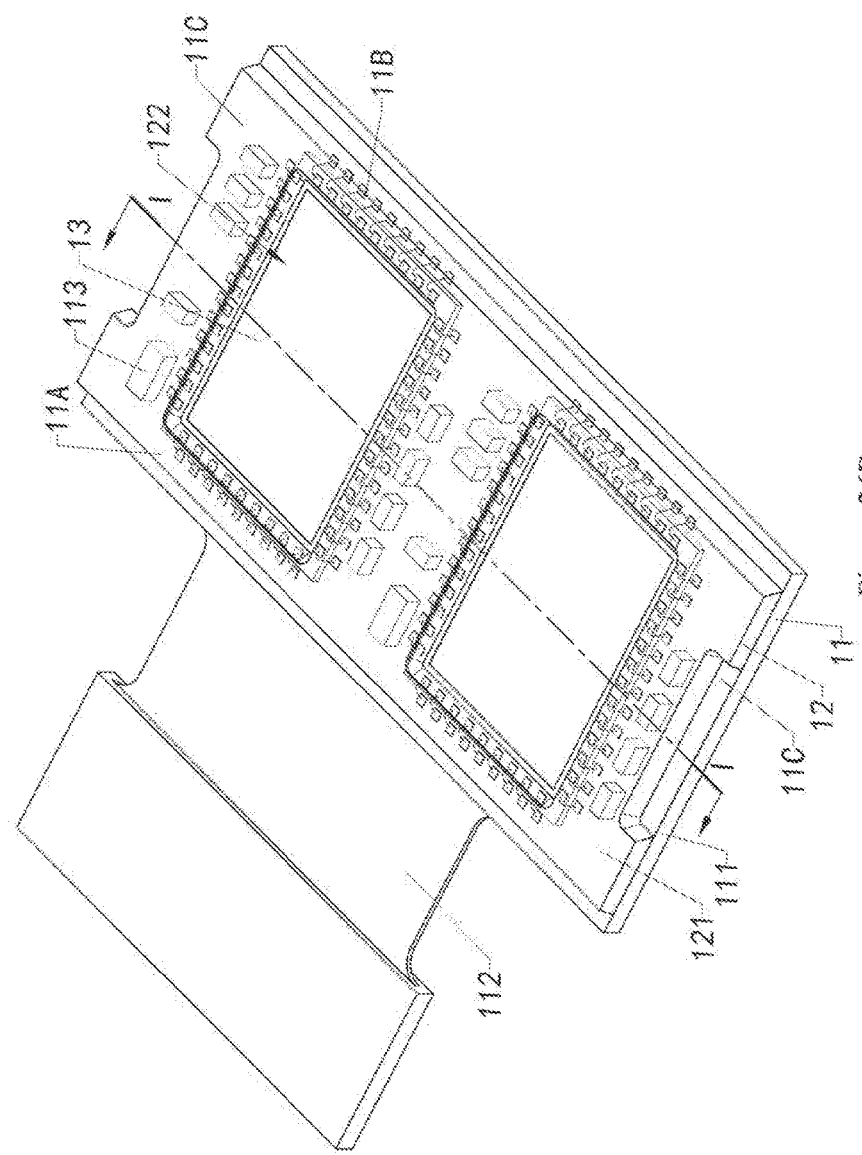
FIG. 26B is a schematic enlarged structure view of a photosensitive assembly according to another variant embodiment of the above mentioned second preferred embodiment of the present application.
Figure 27:
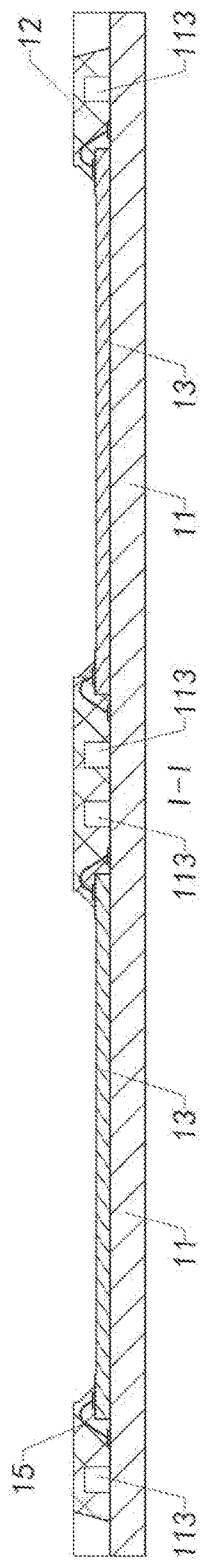
FIG. 27 is a cross-sectional view illustrating a photosensitive assembly according to another variant embodiment of the above mentioned second preferred embodiment of the present application, taken along the line I-I in FIG. 26B.
Figure 28A:
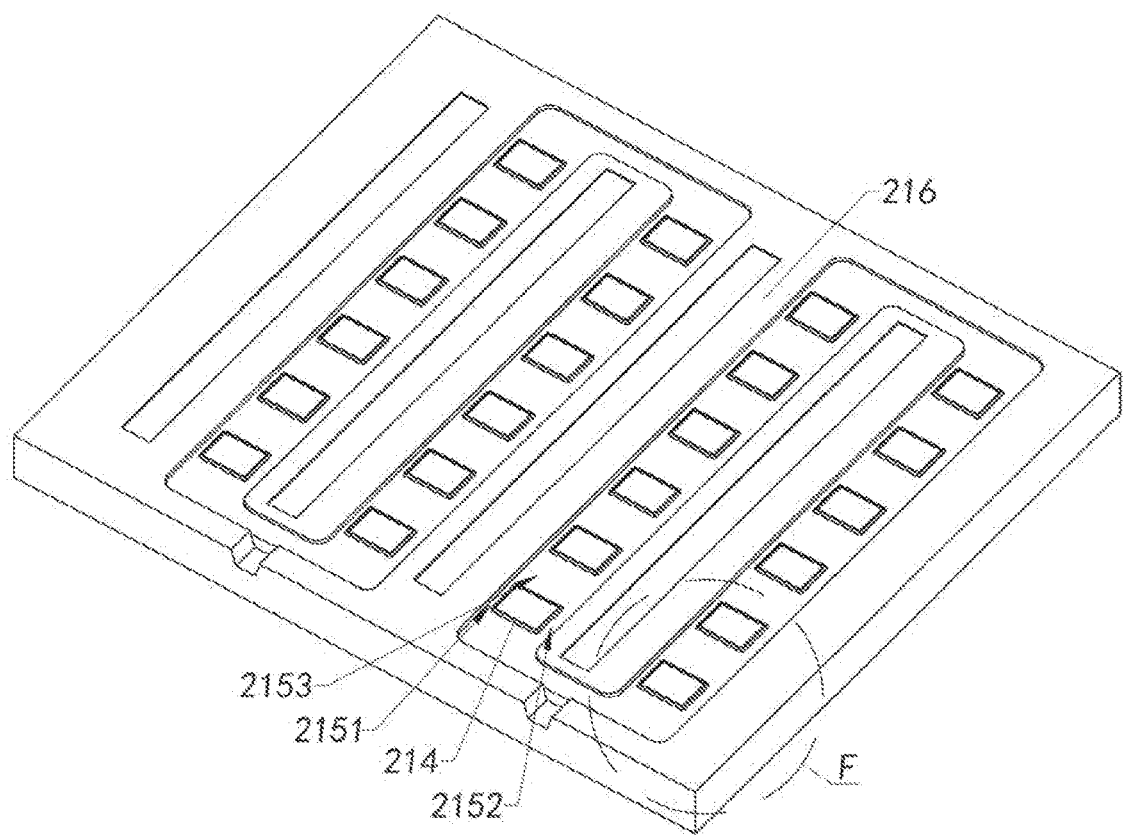
FIG. 28A is a schematic structural view of a molding die of a manufacturing equipment of a photosensitive assembly jointed panel of a camera module according to the third preferred embodiment of the present application.
Figure 28B:
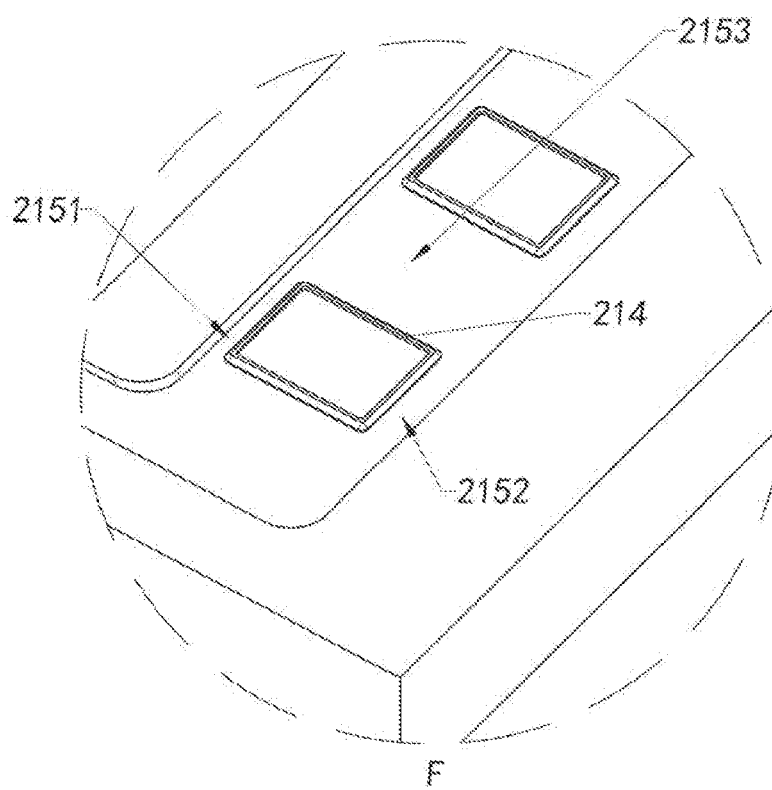
FIG. 28B is an enlarged structural schematic view of a partial region F of a first die of the molding die of the manufacturing equipment of the photosensitive assembly jointed panel of the camera module according to the above mentioned third preferred embodiment of the present application.
Figure 29:
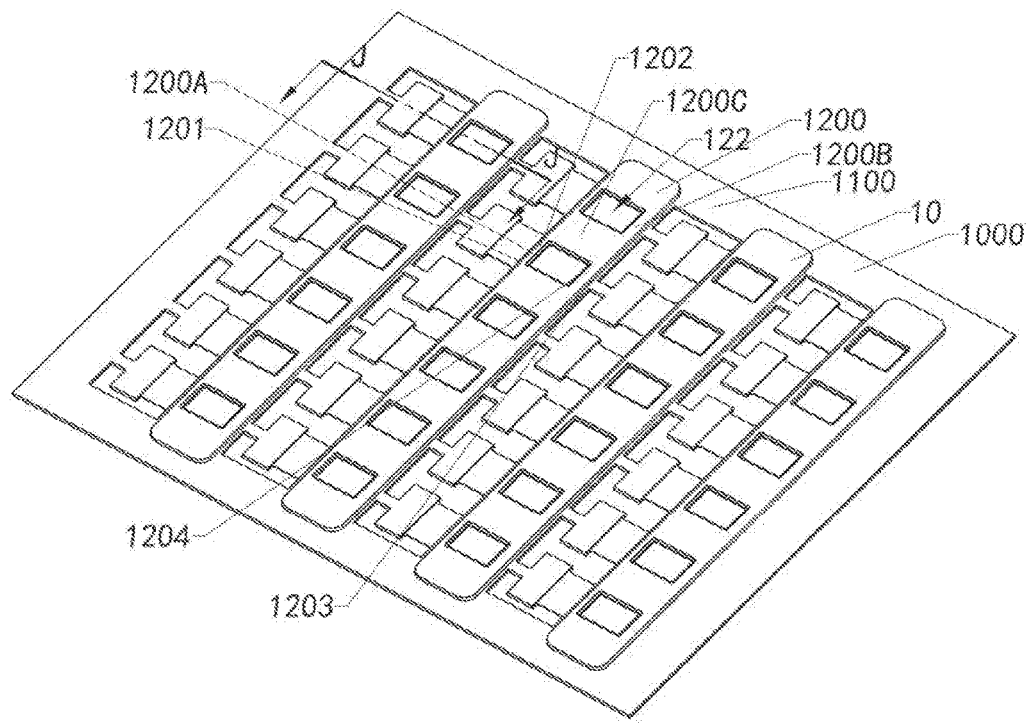
FIG. 29 is a schematic structural view of the photosensitive assembly jointed panel of the camera module according to the above mentioned third preferred embodiment of the present application.
Figure 30:
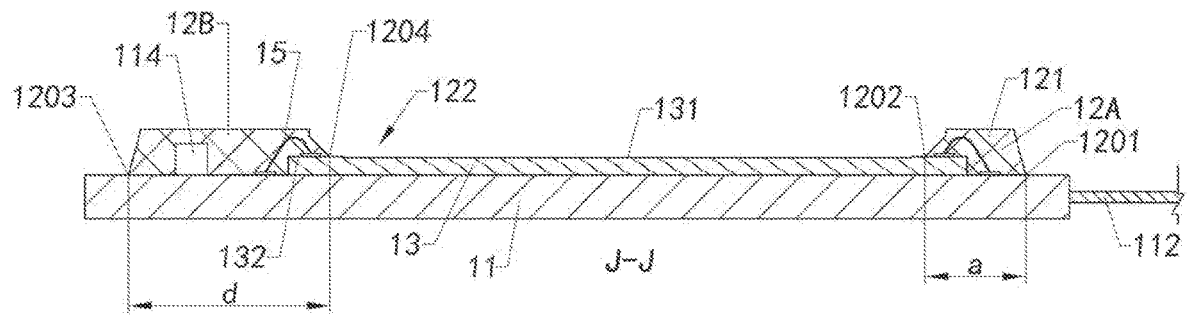
FIG. 30 is a cross-sectional view of the photosensitive assembly jointed panel of the camera module according to the above mentioned third preferred embodiment of the present application, taken along line J-J in FIG. 29.

As shown in FIG. 26A to FIG. 27, the molding process of the jointed paneling operation can also be used to make a photosensitive assembly 10 having two or more of the light windows 122, wherein such a photosensitive assembly 10 can be used to fabricate an array camera module that shares a substrate. That is to say, taking the photosensitive assembly 10 for making a dual-camera module as an example, during the molding process of each circuit board 11 of the circuit board jointed panel 1100, one circuit board substrate 111 is correspondingly provided with two light window molding portions 214, so that after the molding process and cutting are completed, each of the circuit boards 11 forms a molding base 12 having two of the light windows 122 sharing one circuit board 11, and correspondingly mounts the two photosensitive chips 13 and two lenses 30. In addition, the circuit board 11 can be connected to a control board of an electronic device. In this way, the array camera module manufactured in this embodiment can transmit images captured by multiple camera modules to the control board for image information processing.

As shown in FIGS. 28A to 32 is a method for manufacturing a photosensitive assembly according to a third preferred embodiment of the present application. In this preferred embodiment of the present application, each of the base jointed panel molding guide grooves 215 has a first diversion groove 2151 and a second diversion groove 2152 substantially parallel to each other, and a plurality of filling grooves 2153 extends between the first diversion groove 2151 and the second diversion groove 2152, wherein the filling groove 2153 is formed between two adjacent light window molding portions 214, as shown in the figure, the base jointed panel molding guide groove 215 has seven filling grooves 2153, and six light window molding portions 214 are located between two adjacent filling grooves 2153. The molding material 14 flows along with the first diversion groove 2151 and the second diversion groove 2152 from the feeding end 215A toward the terminal end 215B. The second diversion groove 2152 is larger in dimension, and when the first die 211 and the second die 212 are clamped, one or more flow retarding parts 114 are provided on the circuit board 11 in the second diversion groove 2152, and the flow retarding parts 114 slow down a flow rate of the molding material 14 in the second diversion groove 2152, so that the fluid-like molding material 14 can be filled in each of the filling grooves 2153 along the two diversion grooves 2151 and 2152 within a curing time T, thereby the one-piece molding base 1200 is formed after the molding material 14 is cured.

Figure 32:
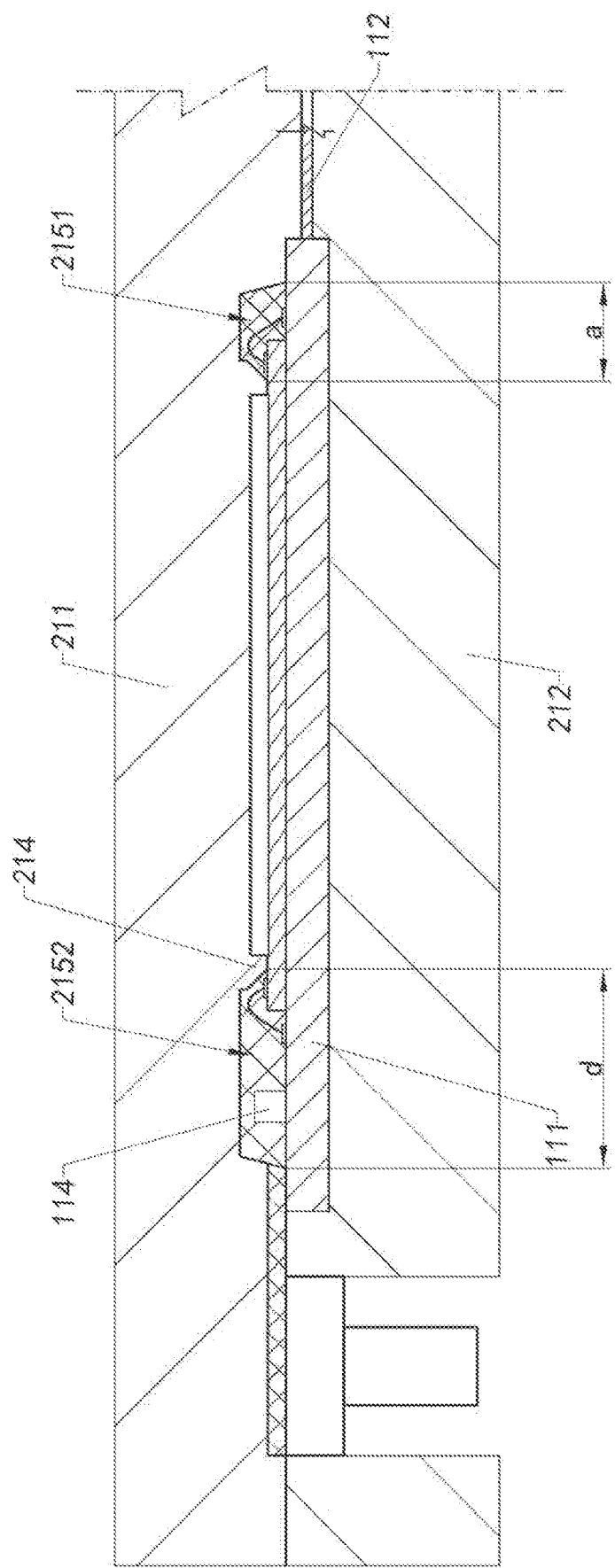
FIG. 32 is a cross-sectional view illustrating when a molten molding material is filled in a base jointed panel molding guide groove in the molding die of the photosensitive assembly jointed panel according to the above mentioned third preferred embodiment of the present application, wherein the cross-sectional view is a cross-sectional view corresponding to the direction of the J-J line illustrated in FIG. 29.
Figure 33A:
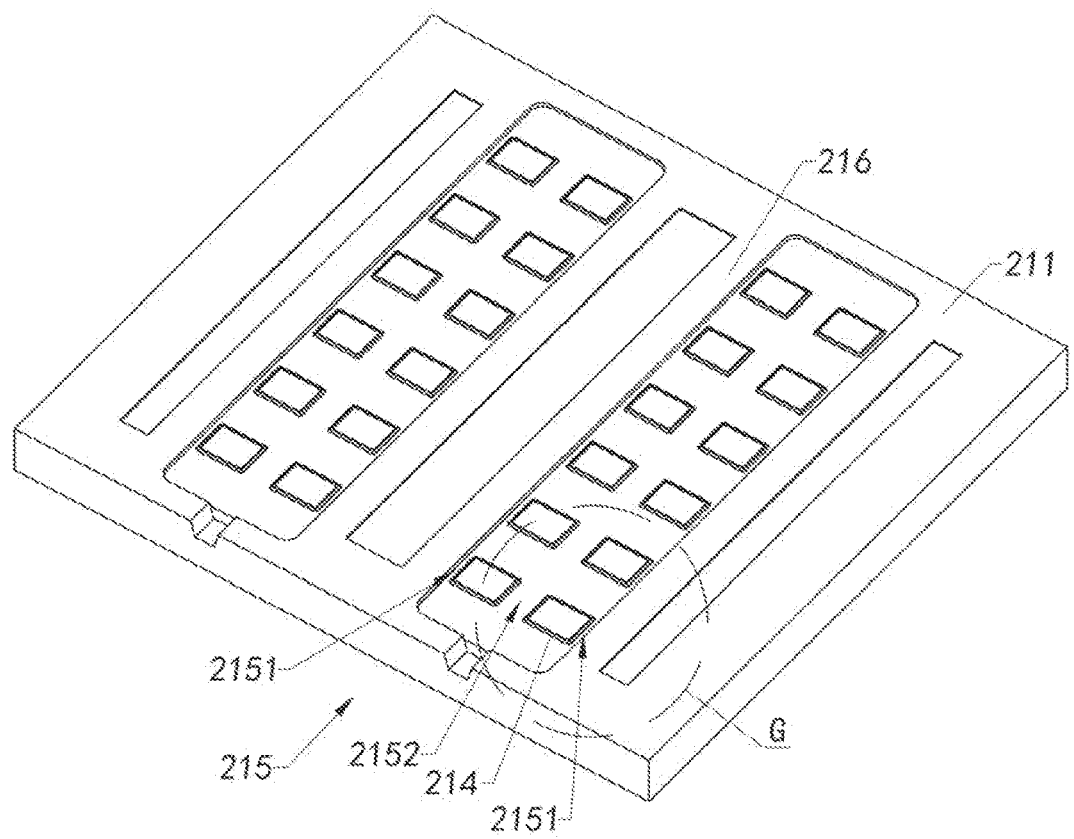
FIG. 33A is a schematic structural view of a molding die of a manufacturing equipment for a photosensitive assembly jointed panel of a camera module according to the fourth preferred embodiment of the present application.
Figure 33B:
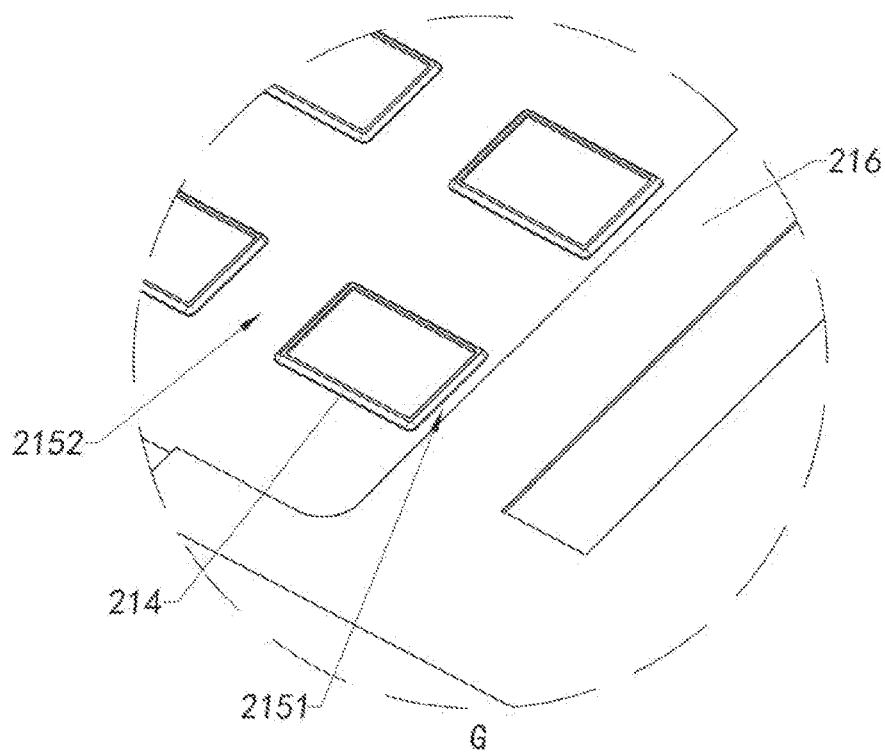
FIG. 33B is an enlarged structure schematic view of a partial region G of a first die of the molding die of the manufacturing equipment for the photosensitive assembly jointed panel of the camera module according to the above mentioned fourth preferred embodiment of the present application.

As shown in FIG. 32, it is a schematic view of the manufacturing process of the photosensitive assembly jointed panel 1000 of the camera module 100 according to this preferred embodiment of the present application. The molding die 210 is in a clamping state, the circuit board 11 to be molded and the solid molding material 14 are ready to be put into place, the solid molding material 14 is heated, so that when the molding material 14 is melted into a fluid state or a semi-solid and semi-fluid state, it is fed to the base jointed panel molding guide groove 215, flows forward along with the first diversion groove 2151 and the second diversion groove 2152, and fills into the filling grooves 2153 between two adjacent light window molding portions 214, wherein the retarding part 114 located in the second diversion groove 2152 blocks the flow of the fluid in the second diversion groove 2152, so that The flow velocity of the molding material 14 in the second diversion groove 2152 is reduced. In this way, when the base molding plate molding guide groove 215 can be completely filled with the fluid-like molding material 14, the fluid-like molding material 14 is cured and molded into the one-piece molding base 1200 integrally formed in each row of the circuit boards 11 and each row of the photosensitive chips 13 through a curing process.

It is worth mentioning that in the molding process, a width of the bottom end of the first diversion groove 2151 is a, and a width of the bottom end of the second diversion groove 2152 is d. The width a corresponds to a width of the bottom end of the first diversion groove 2151 adjacent to the position where the rigid region 111 and the flexible region 112 of the circuit board 11 are combined, and the width d corresponds to a width of the bottom end of the second diversion groove 2152 on the other side far from the flexible region 112. When the widths a and d meet the following conditions, $0.2\ mm \leq a \leq 1\ mm$ and $d > 1.5a$, accordingly, in the molding process, since the flow retarding part 114 is provided in the second diversion groove 2152, so the purpose of filling the base jointed panel molding guide groove 215 in the molding process can also be achieved.

Correspondingly, the molding process of the present application yields the photosensitive assembly jointed panel 1000, which includes: one or more rows of the circuit board 11, one or more rows of the photosensitive chip 13, and one or more of the one-piece molding base 1200. Each row of the circuit boards 11 includes one or more of the circuit boards 11 arranged side by side, and each of the circuit boards 11 includes a combined rigid region 111 and flexible region 112. Each of the one-piece molding bases 1200 is integrally molded on a row of the circuit boards 11 and a row of the photosensitive chips 13 and forms the light windows 122 that provide a light path for each of the photosensitive chips 13. Wherein, a distance between the outer edge 1201 and the inner edge 1202 of the portion 1200A of the one-piece molding base corresponding to the first end side of the one-piece molding base 1200 adjacent to the flexible region 112 is a; a distance between the outer edge 1203 and the inner edge 1204 of the portion 1200B of the one-piece molding base corresponding to the opposite second end side of the one-piece molding base 1200 away from the flexible region 112 is d, where $0.2\ mm \leq a \leq 1\ mm$, and $d > 1.5a$. The second end side of the one-piece molding base 1200 corresponds to the circuit board 11 on the distal side of the circuit board 11 away from the flexible region 112 and further includes one or more flow retarding part 114 provided on the rigid region 111 thereof, and the one-piece molding base 1200 embeds the flow retarding part 114 integrally.

After the photosensitive assembly jointed panel 1000 is cut, a single photosensitive assembly 10 can be obtained, wherein the photosensitive assembly 10 includes the circuit board 11, the photosensitive chip 13, and the molding base 12. Wherein, the circuit board 11 includes a combined rigid region 111 and flexible region 112. The molding base 12 is integrally molded on the circuit board 11 and the photosensitive chip 13 and forms the light window 122 that provides a light path for the photosensitive chip 13. The circuit board 11 and the photosensitive chip 13 are connected through a series of connecting wires 15. The distance between the outer edge 1201 and the inner edge 1202 of the portion 1200A of the one-piece molding base corresponding to the first end side of the one-piece molding base 1200 adjacent to the flexible region 112 is a; the distance between the outer edge 1203 and the inner edge 1204 of the portion 1200B of the one-piece molding base corresponding to the opposite second end side of the one-piece molding base 1200 away from the flexible region 112 is d, where $0.2\ mm \leq a \leq 1\ mm$, and $d > 1.5a$, and the portion 12B of the molding base of the opposite second end side of the molding base 12 away from the flexible region 112 is embedded with the flow retarding part 114.

Figure 31:
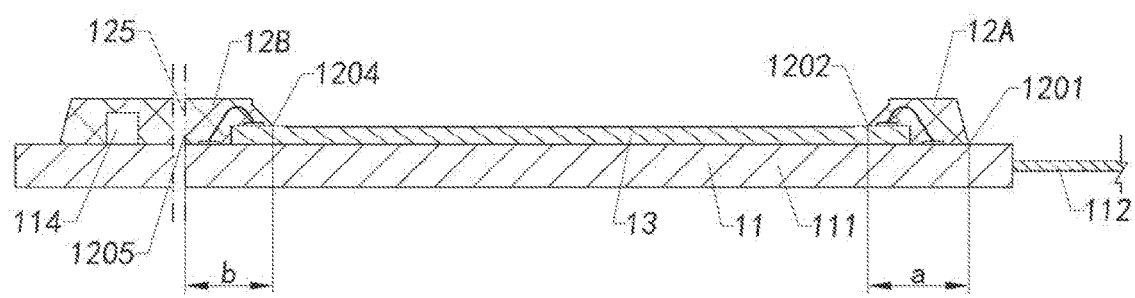
FIG. 31 is an enlarged structural cross-sectional view of the photosensitive assembly of the camera module according to the above mentioned third preferred embodiment of the present application after an embedded flow retarding part is removed.

As shown in FIG. 31, correspondingly, in order to further reduce the dimension of the photosensitive assembly 10, at least a part of the photosensitive member 10 of the opposite second end side of the molding base 12 away from the flexible region 112 is suitable for being removed, such as cutting with a knife or being abraded, to form a cutting surface 125, and the distance between the outer edge 1205 and the inner edge 1204 of the remaining part of the molding base 12 after being cut is b, wherein $0.2\ mm \leq b \leq d-0.2\ mm$. Preferably, a portion of the molding base 12 in which the flow retarding part 114 is embedded is removed, and a part of the corresponding circuit board 11 is also removed, preferably, 0.2 mm≤b≤1.5a-0.2 mm.

Correspondingly, this embodiment of the present application provides the following method for manufacturing a photosensitive assembly of a camera module, which includes the following steps:

fixing a circuit board jointed panel 1100 to a second die 212 of a molding die 210, wherein the circuit board jointed panel 1100 includes one or more rows of circuit boards, and each row of circuit boards includes one or more circuit boards 11 arranged side by side, each of the circuit boards 11 includes a combined rigid region 111 and flexible region 112, and each of the circuit boards 11 is operatively connected with a photosensitive chip 13;

clamping the second die 212 and a first die 211 and filling the molten molding material 14 in a base jointed panel molding guide groove 215 in the molding die 210, wherein the position corresponding to a light window molding portion 214 is prevented from being filled with the molding material 14;

curing the molding material 14 in the base jointed panel molding guide groove 215 to form a one-piece molding base 1200 at a position corresponding to the base jointed panel molding guide groove 215, wherein the one-piece molding base 1200 is integrally molded on corresponding each row of the circuit boards 11 and each row of the photosensitive chips 13 to form a photosensitive assembly jointed panel 1100 and form a light window 122 for providing a light path for each of the photosensitive chips 13 at a position corresponding to the light window molding portion 214, wherein the base jointed panel molding guide groove 215 has a first diversion groove 2151 corresponding to a first end side of the one-piece molding base 1200 adjacent to the flexible region 112 and a second diversion groove 2152 corresponding to the one-piece molding base 1200 away from the flexible region 112, and a filling grooves 2153 extending between the first diversion groove 2151 and the second diversion groove 2152 and for filling the molding material 14 between two adjacent photosensitive chips 13 in each row of the photosensitive chips 13 and located between two adjacent light window molding portions 214, wherein a width of the bottom end of the first diversion groove is a, and a width of the bottom end of the second diversion groove is d, wherein 0.2 mm≤a≤1 mm, d>1.5a, and a flow retarding part is provide on the rigid region 111 corresponding to a second end side of the one-piece molding base 1200 away from the flexible region 112, and the flow retarding part 114 is embedded by the one-piece molding base 1200;

cutting the photosensitive assembly jointed panel 1000 to obtain a plurality of the photosensitive assemblies 10, wherein each of the photosensitive assemblies 10 includes the circuit board 11, the photosensitive chip 13 and the molding base 12, wherein, the molding base 12 is integrally molded on the circuit board 11 and the photosensitive chip 13 and forms the light window 122 that provides a light path for the photosensitive chip 13. And preferably, in the cutting step, a portion of the molding base 12 in which the flow retarding part 114 is embedded is removed.

The photosensitive assembly 10 of the camera module 100 according to the fourth embodiment of the present application and a manufacturing process thereof are shown in FIGS. 33A to 37. In this embodiment, a photosensitive assembly jointed panel plate 1000 is also made by a jointed panel operation, and then the photosensitive assembly 10 is cut. In this embodiment, the difference from the third embodiment is that the two adjacent rows of circuit boards can arrange the rigid regions 111 adjacently, and keep the corresponding flexible regions 112 far away. More preferably, the rigid regions 111 of the two adjacent rows of circuit boards are integrally molded so that the middle of the two adjacent rows of circuit boards forms an integral rigid region.

Accordingly, more specifically, the molding die 210 forms a molding cavity 213 when clamping, and provides a plurality of light window molding portions 214 and one or more base jointed panel molding guide grooves 215, each of the bases jointed panel molding guide grooves 215 includes a first diversion groove 2151 arranged at two ends in a substantially parallel direction in the longitudinal direction, and a second diversion groove 2152 located between two first guide grooves 2151 and a plurality of filling grooves 2153 arranged laterally extending between the first diversion groove 2151 and the second diversion groove 2152, wherein two rows of the filling grooves 2153 extend between the two first diversion grooves 2151 and the second diversion groove 2152.

In this embodiment, in the molding process, the second diversion groove 2152 having a larger dimension is provided with a flow retarding part 114 to reduce the flow velocity of the fluid in the second diversion groove 2152, so that the molding material 14 flows from the feeding end 215A to the terminal end 215B along with two of the first diversion guides 2151 and the second diversion guide 2152 in the middle, and the molding material 14 can fill each of the filling grooves 2153, so that the one-piece molding base 1200 is formed after the molding material 14 is cured.

In this embodiment of the present application, the one-piece molding base 1200 is integrally molded on two adjacent rows of the circuit boards 11 and two adjacent rows of the photosensitive chips 13 to form a photosensitive assembly jointed panel 1000 and form a light window 122 for providing a light path for each of the photosensitive chips 13 at a position corresponding to the light window molding portion 214. The flow retarding part 114 is provided on the rigid region 111 of the circuit board 11 between the two rows of the photosensitive chips 13, so that the flow of the molding material 14 in the second diversion groove 2152 is properly blocked.

Figure 37:
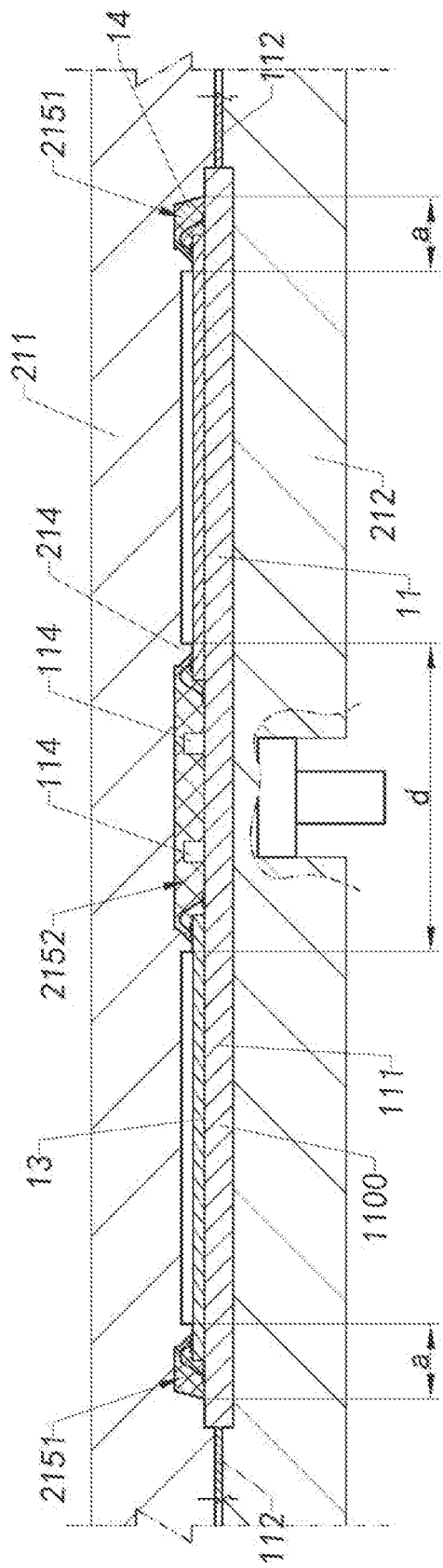
FIG. 37 is a cross-sectional view illustrating when a molten molding material is filled in a base jointed panel molding guide groove in the molding die of the photosensitive assembly jointed panel according to the above mentioned fourth preferred embodiment of the present application, wherein the cross-sectional view is a cross-sectional view corresponding to the direction of the K-K line illustrated in FIG. 34.

As shown in FIG. 37, the molding die 210 is in a clamping state, the circuit board 11 to be molded and the solid molding material 14 are ready to be in place, and the solid molding material 14 is heated, so that when the molding material 14 is melted into a fluid state or a semi-solid and semi-fluid state, it is fed to the base jointed panel molding guide groove 215, and along the first diversion groove 2151 and the second diversion groove 2152 flows forward and fills the filling groove 2153 between two adjacent light window molding portions 214, wherein the flow retarding part 114 is provided to reduce the flow velocity of the molding material 14 in the second diversion groove 2152.

Figure 34:
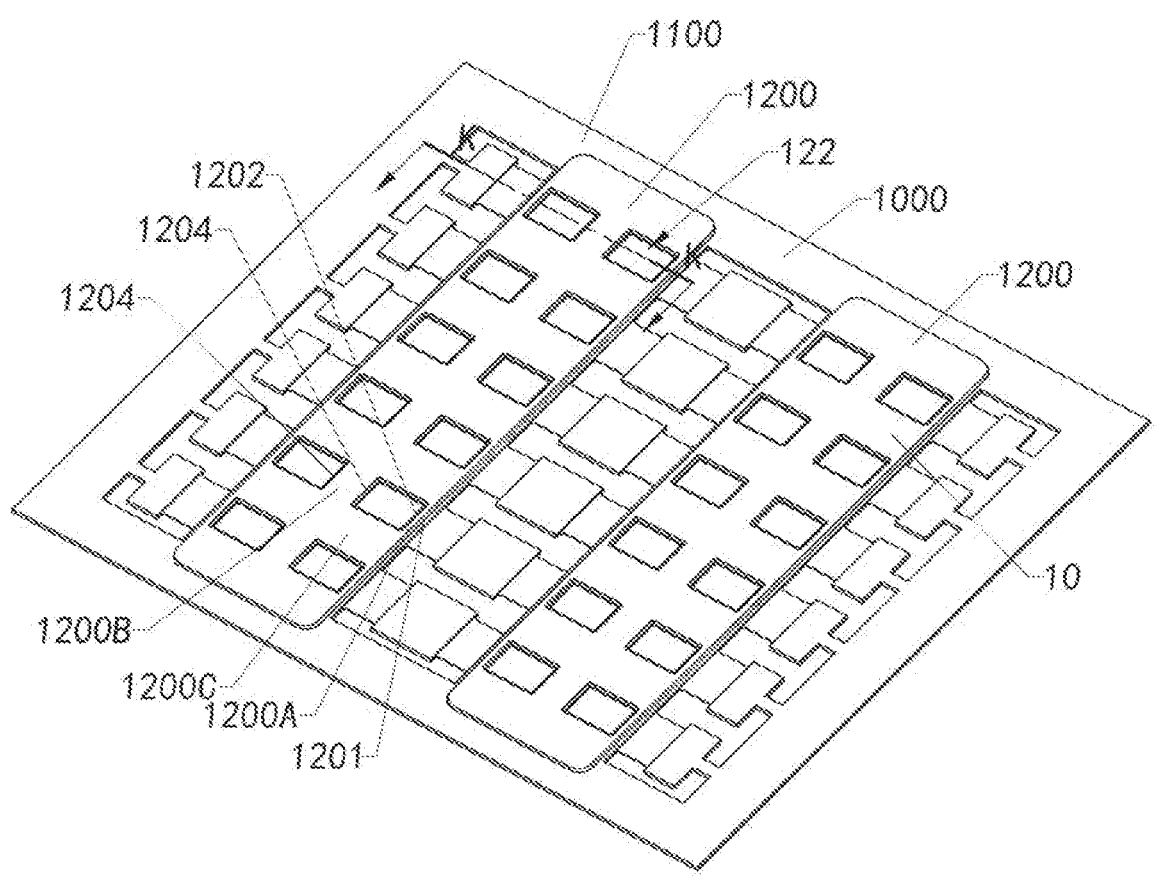
FIG. 34 is a structural schematic view of the photosensitive assembly jointed panel of the camera module according to the above mentioned fourth preferred embodiment of the present application.
Figure 35:
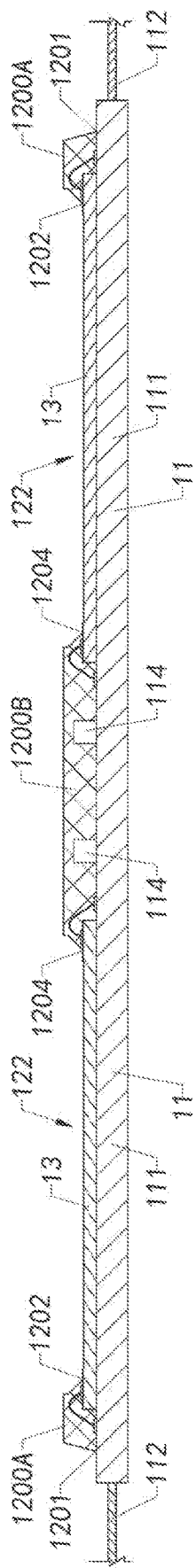
FIG. 35 is a cross-sectional view of the photosensitive assembly jointed panel of the camera module according to the above mentioned fourth preferred embodiment of the present application, taken along line K-K in FIG. 34.
Figure 36:
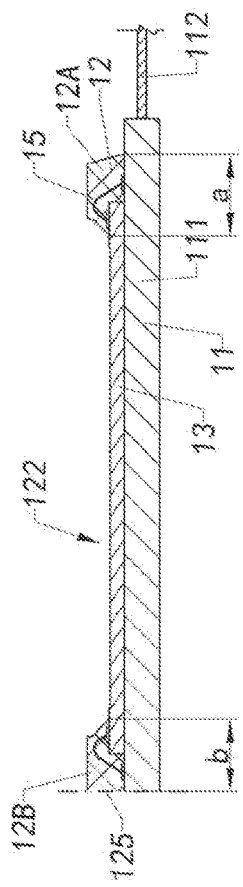
FIG. 36 is an enlarged structural cross-sectional view of the photosensitive assembly of the camera module according to the above mentioned fourth preferred embodiment of the present application after an embedded flow retarding part is removed.

As shown in FIGS. 34 to 36, the prepared photosensitive element jointed panel 1000 can be further cut, so as to obtain a single photosensitive assembly 10. Each of the photosensitive assemblies 10 includes at least one circuit board 11, at least one photosensitive chip 13 and the molding base 12 integrally molded on the circuit board 11 and the photosensitive chip 13. The rigid regions 111 integrally molded between the two adjacent rows of the circuit boards 11 are separated, and preferably, a portion of the molding base 12 in which the retarder 114 is embedded is removed.

In the molding process, the width of the bottom end of each of the first diversion grooves 2151 is a, and the width of the bottom end of each of the second diversion grooves 2152 is c. The width a corresponds to the width of the bottom end of the first diversion grooves 2151 adjacent to the position where the rigid region 111 and the flexible region 112 of the circuit board 11 are combined, and the width d corresponds to the width of the bottom end of the second diversion groove 2152 away from the other side of the flexible region 112. The widths a and d meet the following conditions, that is, 0.2 mm≤a≤1 mm and d>1.5a. The flow retarding part 114 is provided on the rigid region 111 of the circuit board 11 in the second diversion groove 2152, the fluid-like molding material 14 can flow forward along the two outer first diversion grooves 2151 and the second diversion groove 2152 in the middle, and before the molding material 14 is cured, the entire base jointed panel molding guide groove 215 is filled with the molding material 14.

Correspondingly, the photosensitive assembly jointed panel 1000 obtained according to the molding process of the present application includes: one or more rows of the circuit board 11, one or more rows of the photosensitive chip 13, and one or more one-piece molding base 1200. Each row of the circuit boards 11 includes one or more of the circuit boards 11 arranged side by side, and each of the circuit boards 11 includes a combined rigid region 111 and flexible region 112. Each of the one-piece molding bases 1200 is integrally molded on two adjacent rows of the circuit boards 11 and two adjacent rows of the photosensitive chips 13 and forms a light window 122 that provides a light path for each of the photosensitive chips 13, and the two adjacent rows of the circuit boards 11 are arranged such that their flexible regions 112 are away from each other and their rigid regions 111 are adjacent to each other, so that each of the one-piece molding bases 1200 has two end sides adjacent to the flexible region 112; wherein the distance between an outer edge 1201 and an inner edge 1202 of a portion 1200A of the one-piece molding base corresponding to each end side of the one-piece molding base 1200 adjacent to the flexible region 112 is a; the one-piece molding base 1200 extends between the two adjacent rows of the photosensitive chips 13 and the distance between the two inner edges 1204 thereof is d, where 0.2 mm≤a≤1 mm, d>1.5a, and the flow retarding part 114 is provided on the rigid region 111 of the circuit board 11 between the two adjacent rows of the photosensitive chips 13, and the flow retarding part 114 is embedded integrally by the one-piece molding base 1200.

Accordingly, as shown in FIG. 36, the photosensitive assembly 10 obtained after cutting includes the circuit board 11, the photosensitive chip 13 and the molding base 12. After cutting the photosensitive assembly jointed panel 1000, each of the photosensitive assemblies 10 has a first end side without cutting and a second end side obtained by cutting similarly to the above embodiment. The distance between the outer edge 1201 and the inner edge 1202 of the portion 12A of the molding base corresponding to the first end side of the molding base 12 adjacent to the flexible region 112 is a; the portion 12B of the molding base corresponding to the opposite second end side of the molding base 12 away from the flexible region 112 forms a cutting surface 125 and the distance between the outer edge 1205 and the inner edge 1204 thereof is b, wherein, 0.2 mm≤a≤1 mm, 0.2 mm≤b≤d-0.2 mm, preferably, 0.2 mm≤b≤1.5a-0.2 mm.

That is to say, in this embodiment of the present application, since the flow retarding part 114 is provided in the second diversion groove 2152, the fluid flow velocity in the second diversion groove 2152 is reduced, the molding material 14 can flow forward from the feeding ends 215A of the three guide grooves 2151 and 2152 and fill the guide grooves 2151 and 2152 of the entire base jointed panel molding guide groove 215 and the filling groove 2153. The molding material 14 can flow from the feed end 215A to the terminal end 215B along the three diversion grooves 2151 and 2152 before curing. Before the viscosity of the molding material 14 reaches a high value and is cured, the molding material 14 can fill the base jointed panel molding guide groove 215, thereby preventing the connecting wire 15 between the circuit board 11 and the photosensitive chip 13 is damaged by the molding material 14 having a high viscosity and flowing forward. And the fluid in the three diversion grooves 2151 and 2152 flows forward substantially at the same step, so as to prevent the molding material 14 in one certain diversion groove from flowing to another diversion groove and obstructing the molding material 14 from flowing forward in another diversion groove. Moreover, no turbulence or sinuous flow is generated, which causes the connecting wires 15 connecting the circuit board 11 and the photosensitive chip 13 to swing irregularly, resulting in deformation and damage.

Those skilled in the art should understand that the embodiment of the present application shown in the above description and the accompanying drawings are merely examples and do not limit the present application. The object of the present application has been completely and effectively achieved. The function and structural principle of the present application have been shown and explained in the examples, and the embodiments of the present application may have any deformation or modification without departing from the principle.

The invention claimed is:

1. A photosensitive assembly of a camera module, the photosensitive assembly comprising:
    a circuit board including a combined rigid region and flexible region;
    a photosensitive chip; and
    a molding base,
    wherein the molding base is integrally molded on the circuit board and the photosensitive chip and forms a light window for providing a light path for the chip, and
    wherein a distance between an outer edge and an inner edge of a portion of the molding base corresponding to a first end side of the molding base adjacent to the flexible region is a, distance between an outer edge and an inner edge of a portion of the molding base corresponding to an opposite second end side of the molding base away from the flexible region is c, and 0.2 mm≤a≤1 mm, 0.2 mm≤c≤1.5a;
    wherein the portion of the molding base corresponding to the opposite second end side away from the flexible region is adapted to be cut, so that a distance between an outer edge and an inner edge of a remaining part of the molding base after being cut is b, and 0.2 mm≤b≤1.5a-0.2 mm.

2. The photosensitive assembly according to claim 1, wherein 0.7a≤c<1.3a.

3. The photosensitive assembly according to claim 1, wherein the circuit board further includes a plurality of electronic components,
    wherein the plurality of electronic components are provided at at least one wing side that are at sides of the photosensitive assembly on the rigid region except for end sides that are adjacent to the flexible region and away from the flexible region, and wherein the molding base integrally embeds the plurality of electronic components.

4. The photosensitive assembly according to claim 1, wherein at the first end side of the molding base adjacent to the flexible region, a pressing distance W for a pressing block of a molding die in a molding process to facilitate pressing on the rigid region is between the outer edge of the molding base and an outer edge of the rigid region, and the pressing distance W has a value ranging from 0.1~1 mm.

5. The photosensitive assembly according to claim 1, further comprising a filter assembly and a filter assembly lens holder, wherein the filter assembly is assembled to the filter assembly lens holder, and the filter assembly lens holder is assembled on a top side of the molding base.

6. The photosensitive assembly according to claim 1, further comprising a protective frame provided on the photosensitive chip, wherein the molding base is integrally molded on the circuit board, the photosensitive chip and the protective frame.

7. A photosensitive assembly jointed panel of a camera module, the photosensitive assembly jointed panel comprising:

one or more rows of circuit boards, each row of circuit boards including one or more circuit boards arranged side by side, each of the circuit boards including a combined rigid region and flexible region;

one or more rows of photosensitive chips; and one or more one-piece molding bases, each of which is integrally molded on a row of the circuit boards and a row of the photosensitive chips and forms a light window for providing a light path for each of the photosensitive chips, wherein a distance between an outer edge and an inner edge of a portion of the one-piece molding base corresponding to a first end side of the one-piece molding base adjacent to the flexible regions is a, a distance between an outer edge and an inner edge of a portion of the one-piece molding base corresponding to an opposite second end side of the one-piece molding base away from the flexible regions is c, and 0.2 mm ≤a≤1 mm, 0.2 mm≤c≤1.5a;

wherein the portion of the molding base corresponding to the opposite second end side away from the flexible region is adapted to be cut, so that a distance between an outer edge and an inner edge of a remaining part of the molding base after being cut is b, and 0.2 mm≤b≤1.5a-0.2 mm.

8. The photosensitive assembly jointed panel according to claim 7, wherein the photosensitive assembly jointed panel includes a plurality of rows of the circuit boards, a plurality of rows of the photosensitive chips, and a plurality of the one-piece molding bases, and wherein in two adjacent rows of the circuit boards, the opposite second end side of the one-piece molding base on one of the two adjacent rows of the circuit boards away from the flexible regions faces towards the first end side of the one-piece molding base adjacent to the flexible regions of another of the two adjacent rows of the circuit boards.

9. The photosensitive assembly jointed panel according to claim 7, wherein 0.7a≤c≤1.3a.

10. The photosensitive assembly jointed panel according to claim 7, wherein the rigid region of each of the circuit boards has a pressing distance W for a pressing block of a first molding die in a molding process to facilitate pressing on the first end side adjacent to the flexible region, and the pressing distance W has a value ranging from 0.1~1 mm.

11. The photosensitive assembly jointed panel according to claim 7, wherein the rigid regions of a row of the circuit boards are integrally molded to form an integral rigid region jointed panel.

12. The photosensitive assembly jointed panel according to claim 7, wherein each of the one or more one-piece molding bases is integrally molded on two rows of adjacent circuit boards and two rows of adjacent photosensitive chips, and the two adjacent rows of circuit boards are arranged such that the flexible regions thereof are spaced apart from each other and the rigid regions thereof are adjacent to each other, thereby each of the one or more one-piece molding bases has two end sides adjacent to the flexible region regions.

13. The photosensitive assembly jointed panel according to claim 12, wherein the rigid region of each of the circuit boards has a pressing distance W for a pressing block of a first molding die in a molding process to facilitate pressing on the first end side adjacent to the flexible region, and the pressing distance W has a value ranging from 0.1~1 mm.

14. The photosensitive assembly jointed panel according to claim 12, wherein the rigid regions of the two adjacent rows of circuit boards are integrally molded to form an integral rigid region jointed panel.

15. A camera module, comprising:

a lens;

a circuit board including a combined rigid region and flexible region;

a photosensitive chip; and a molding base, wherein the molding base is integrally molded on the circuit board and the photosensitive chip and forms a light window for providing a light path for the photosensitive chip, wherein the lens is located on a photosensitive path of the photosensitive chip, and wherein a distance between an outer edge and an inner edge of a portion of the molding base corresponding to a first end side of the molding base adjacent to the flexible region is a, a distance between an outer edge and an inner edge of a portion of the molding base corresponding to an opposite second end side of the molding base away from the flexible region is c, and 0.2 mm≤a≤1 mm, 0.2 mm≤c≤1.5a;

wherein the portion of the molding base corresponding to the opposite second end side away from the flexible region is adapted to be cut, so that a distance between an outer edge and an inner edge of a remaining part of the molding base after being cut is b, and 0.2 mm≤b≤1.5a-0.2 mm.

16. The camera module according to claim 15, wherein 0.7a≤c≤1.3a.

17. The camera module according to claim 15, wherein the circuit board further includes a plurality of electronic components, wherein the plurality of electronic components are provided at at least one wing side that are at sides of the photosensitive assembly on the rigid region except for end sides that are adjacent to the flexible region and away from the flexible region, and wherein the molding base integrally embeds the plurality of electronic components.

18. The camera module according to claim 15, wherein the molding base integrally molded on the circuit board and the photosensitive chip is cut from a one-piece molding base made in a jointed panel molding process, and the opposite second end side of the molding base away from the flexible region corresponds to a cutting side.

19. The camera module according to claim 15, further comprising a filter assembly and a filter assembly lens holder,
wherein the filter assembly is assembled to the filter assembly lens holder, and the filter assembly lens holder is assembled on a top side of the molding base.

* * * * *